US012802649B2

(12) United States Patent
Feng et al.

(10) Patent No.: US 12,802,649 B2
(45) Date of Patent: Nov. 17, 2026

(54) DISPLAY PANEL WITH SHIFT REGISTERS AND DISPLAY DEVICE

(71) Applicant: Xiamen Tianma Display Technology Co., Ltd., Xiamen (CN)

(72) Inventors: Xuehuan Feng, Xiamen (CN); Yana Gao, Xiamen (CN); Xingyao Zhou, Xiamen (CN); Zhiqiang Xia, Xiamen (CN); Kang Yang, Xiamen (CN)

(73) Assignee: Xiamen Tianma Display Technology Co., Ltd., Xiamen (CN)

(*) Notice: Subject to any disclaimer, the term of this patent is extended or adjusted under 35 U.S.C. 154(b) by 0 days.

(21) Appl. No.: 19/335,162

(22) Filed: Sep. 22, 2025

(65) Prior Publication Data

US 2026/0018136 A1 Jan. 15, 2026

(30) Foreign Application Priority Data

Jun. 30, 2025 (CN) ......................... 202510896492.5

(51) Int. Cl.

| | |
|---|---|
| ***G09G 3/3266*** | (2016.01) |
| ***G11C 19/28*** | (2006.01) |
| *G09G 3/3233* | (2016.01) |
| *G09G 3/36* | (2006.01) |

(52) U.S. Cl.

CPC ........... *G09G 3/3266* (2013.01); *G11C 19/28* (2013.01); *G09G 3/3233* (2013.01); *G09G 3/3677* (2013.01); *G09G 2300/0842* (2013.01); *G09G 2300/0861* (2013.01); *G09G 2310/0286* (2013.01); *G09G 2310/08* (2013.01)

(58) Field of Classification Search

CPC .... G11C 19/28; G09G 3/3266; G09G 3/3233; G09G 3/3677; G09G 2300/0842; G09G 2300/0861; G09G 2310/0286; G09G 2310/08

See application file for complete search history.

(56) References Cited

U.S. PATENT DOCUMENTS 10,102,820 B2 * 10/2018 Li .......................... G11C 19/28
2015/0043703 A1 * 2/2015 Tan ........................ G11C 19/28 377/68

(Continued)

FOREIGN PATENT DOCUMENTS

CN 111210776 A * 5/2020 ........... G09G 3/3266

*Primary Examiner* — Adam J Snyder
(74) *Attorney, Agent, or Firm* — KDW FIRM PLLC

(57) ABSTRACT

A display panel includes a driver circuit; in a shift register in the driver circuit, a first control module is electrically connected to a signal input terminal, a first clock terminal and a first node; an isolation control module is electrically connected to an isolation control terminal, the first node and a second node; in the same first-type shift register, during at least part of the duration when the input signal of the signal input terminal is at an effective level, the isolation control signal of the isolation control terminal controls the isolation control module to turn on a signal transmission path between the first node and the second node; at least after the input signal jumps from an effective level to an ineffective level, the isolation control signal controls the isolation control module to disconnect the signal transmission path between the first node and the second node.

18 Claims, 31 Drawing Sheets

(56) References Cited

U.S. PATENT DOCUMENTS

| | | | | |
|---|---|---|---|---|
| 2016/0379545 | A1* | 12/2016 | Zhou | G11C 19/28 345/213 |
| 2019/0057637 | A1* | 2/2019 | Fan | G11C 19/28 |
| 2021/0256913 | A1* | 8/2021 | Hao | G09G 3/3266 |

* cited by examiner

DISPLAY PANEL WITH SHIFT REGISTERS AND DISPLAY DEVICE

CROSS-REFERENCE TO RELATED APPLICATION

This application claims priority to Chinese Patent Application No. 202510896492.5, filed on Jun. 30, 2025, the disclosure of which is incorporated herein by reference in its entirety.

TECHNICAL FIELD

The present disclosure relates to the field of display technology and, in particular, to a display panel and a display device.

BACKGROUND

With the advancement of display technology, electronic products featuring display functions have been widely adopted across various domains. The electronic products with display capabilities, such as televisions, mobile phones, computers and personal digital assistants, have become indispensable components in people's daily lives and work. The display panel serves as the core structure enabling the display function within electronic products.

A display panel is typically provided with a pixel array and a driver circuit for driving the pixel array. The driver circuit can perform progressive scanning on the pixel array to enable the pixel array to display images. However, constrained by process variations or equipment tolerances during the preparation of the driver circuit, leakage currents may arise internally within the driver circuit, which may consequently lead to issues such as display anomalies.

SUMMARY

The present disclosure provides a display panel and a display device to improve the accuracy of gate signals output by shift registers in the display panel, thereby improving the display performance of the display panel.

In a first aspect, the present disclosure provides a display panel. The display panel includes a driver circuit. The driver circuit includes multiple stages of shift registers.

The shift register includes a first control module, a second control terminal, an isolation control module, an output module, a signal input terminal, a first clock terminal, a second clock terminal, a first level terminal, a second level terminal, an isolation control terminal and a signal output terminal. The first control module is electrically connected to the signal input terminal, the first clock terminal and a first node. The isolation control module is electrically connected to the isolation control terminal, the first node and a second node. The second control module is electrically connected to the first clock terminal, the first level terminal and a third node. The output module is electrically connected to the second node, the third node, the second clock terminal, the second level terminal and the signal output terminal.

The signal input terminal of an $x^{th}$-stage shift register is electrically connected to the signal output terminal of a $y^{th}$-stage shift register, where x and y are both positive integers, and $x \neq y$.

At least part of the shift registers among the multiple stages of shift registers are first-type shift registers.

In the same first-type shift register, during at least part of the duration when the input signal of the signal input terminal is at an effective level, the isolation control signal of the isolation control terminal controls the isolation control module to turn on the signal transmission path between the first node and the second node; at least after the input signal jumps from an effective level to an ineffective level, the isolation control signal controls the isolation control module to disconnect the signal transmission path between the first node and the second node.

In a second aspect, the present disclosure provides a display device. The display device includes the display panel described in the first aspect.

In the technical solutions of the present disclosure, by setting the isolation control module between the first control module and the output module in the shift register, the isolation control signal of the isolation control terminal can control the isolation control module to be in an on state during at least part of the duration when the input signal of the signal input terminal of the first control module is at an effective level, and the effective level of the input signal received by the first node is transmitted to the second node through the isolation control module to ensure that the output module can output a corresponding gate drive signal to the signal output terminal under the control of the signal at the second node, thereby enabling the shift register to function normally and allowing the display panel to display normally. Furthermore, the isolation control signal of the isolation control terminal controls the isolation control module to be turned off at least after the input signal jumps from an effective level to an ineffective level, the path between the second node and the first node is in an off state, and even if a leakage current is generated between the first node and the signal input terminal, the leakage current does not affect the signal of the second node. Therefore, the accuracy of the signal of the second node can be ensured, and the signal of the second node can further accurately control the gate drive signal output by the output module to the signal output terminal, thereby improving the accuracy of the gate drive signal output by the shift register. In addition, when the gate drive signal output by the shift register is used to progressively scan the pixel circuits in the display panel, the pixel circuits can receive accurate gate drive signals, thereby improving the display light emission accuracy of the pixels and further improving the display performance of the display panel.

DETAILED DESCRIPTION

Figure 1:
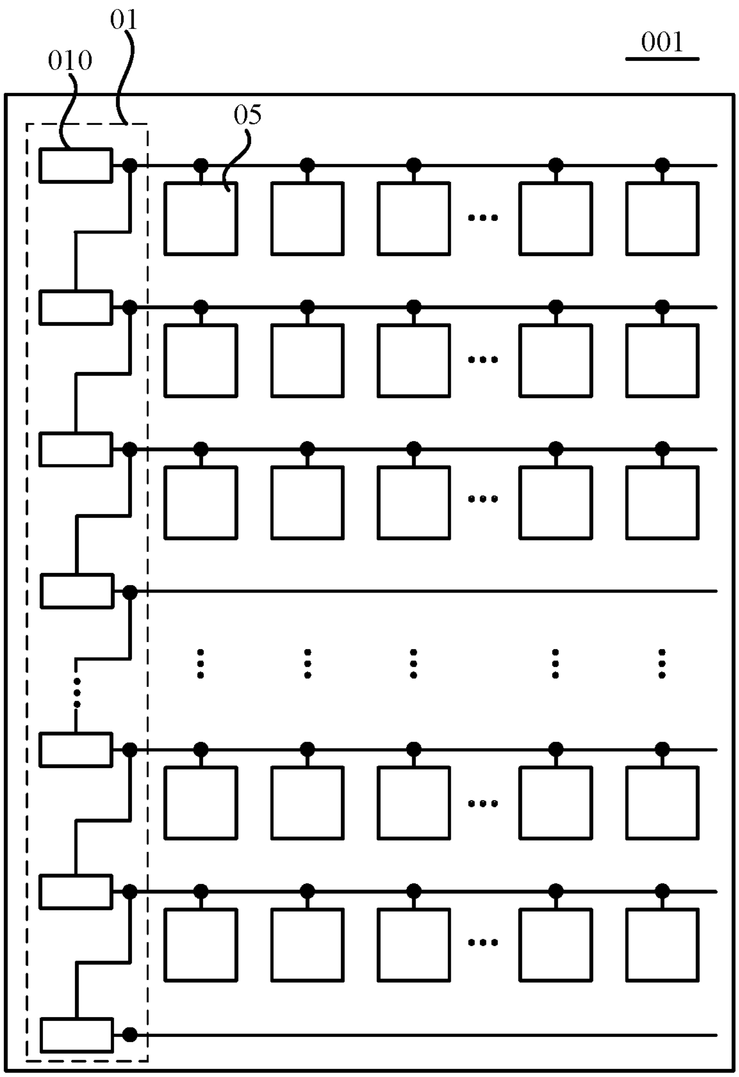
FIG. 1 is a structure diagram of a display panel in the related art.

The present disclosure is further described in detail below in conjunction with drawings and embodiments. It is to be understood that the embodiments described herein are intended to illustrate the present disclosure and not to limit the present disclosure. In addition, it is to be noted that for ease of description, only part, not all, of the structures related to the present disclosure are illustrated in the drawings.

Figure 2:
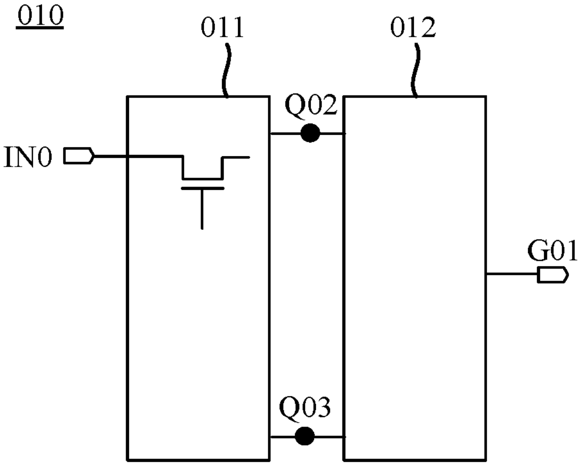
FIG. 2 is a structure diagram of a shift register in the related art.

FIG. 1 is a structure diagram of a display panel in the related art, and FIG. 2 is a structure diagram of a shift register in the related art. With reference to FIGS. 1 and 2, the display panel 001 is provided with a driver circuit 01 and pixel circuits 05 arranged in an array. The driver circuit 01 includes multiple cascaded shift registers 010. The drive signal output terminal of the shift register 010 in each stage is electrically connected to the pixel circuits 05 located in the same row and supplies a gate drive signal to the pixel circuits 05 located in the same row to drive the pixel circuits 05 located in the same row to display and emit light.

The existing shift register 010 includes a drive control module 011 and an output module 012. The drive control module 011 may include a transistor and then transmits, by controlling the transistor to be turned on or off, the start signal of a start signal terminal STV to a second node Q02 or a third node Q03 so that the output module 012 can output a corresponding gate drive signal to an output terminal G01 according to a signal of the second node Q02 and/or a signal of the third node Q03. However, when the transistor in the drive control module 011 is in an off state, the transistor may generate a certain leakage current in an off state due to preparation process variations or equipment tolerances, and the effective level at the second node Q02 or the third node Q03 may leak toward a signal input terminal INO through the transistor in the drive control module 011, thereby causing changes in the electrical signal at the second node Q02 or the third node Q03. As a result, the accuracy of the signal of the second node Q02 or the third node Q03 is affected, and the accuracy of the gate drive signal output by the output module 012 to the signal output terminal G01 is then affected, thereby affecting the display performance of the display panel 001.

To solve the above technical problems, embodiments of the present disclosure provide a display panel. The display panel includes a driver circuit. The driver circuit includes multiple stages of shift registers. A shift register includes a first control module, a second control terminal, an isolation control module, an output module, a signal input terminal, a first clock terminal, a second clock terminal, a first level terminal, a second level terminal, an isolation control terminal and a signal output terminal. The first control module is electrically connected to the signal input terminal, the first clock terminal and a first node. The isolation control module is electrically connected to the isolation control terminal, the first node and a second node. The second control module is electrically connected to the first clock terminal, the first level terminal and a third node. The output module is electrically connected to the second node, the third node, the second clock terminal, the second level terminal and he signal output terminal. The signal input terminal of an $x^{th}$-stage shift register is electrically connected to the signal output terminal of a $y^{th}$-stage shift register, where x and y are both positive integers, and $x \neq y$. At least part of the shift registers among the multiple stages of shift registers are first-type shift registers. In the same first-type shift register, during at least part of the duration when the input signal of the signal input terminal is at an effective level, the isolation control signal of the isolation control terminal controls the isolation control module to turn on the signal transmission path between the first node and the second node; at least after the input signal jumps from an effective level to an ineffective level, the isolation control signal controls the isolation control module to disconnect the signal transmission path between the first node and the second node.

In the above technical solutions, by setting the isolation control module between the first control module and the output module in the shift register, the isolation control signal of the isolation control terminal can control the isolation control module to be in an on state during at least part of the duration when the input signal of the signal input terminal of the first control module is at an effective level, and the effective level of the input signal received by the first node is transmitted to the second node through the isolation control module to ensure that the output module can output a corresponding gate drive signal to the signal output terminal under the control of the signal at the second node, thereby enabling the shift register to function normally and allowing the display panel to display normally. Furthermore, the isolation control signal of the isolation control terminal controls the isolation control module to be turned off at least after the input signal jumps from an effective level to an ineffective level, the path between the second node and the first node is in an off state, and even if a leakage current is generated between the first node and the signal input terminal, the leakage current does not affect the signal of the second node. Therefore, the accuracy of the signal of the second node can be ensured, and the signal of the second node can further accurately control the gate drive signal output by the output module to the signal output terminal, thereby improving the accuracy of the gate drive signal output by the shift register. In addition, when the gate drive signal output by the shift register is used to progressively scan the pixel circuits in the display panel, the pixel circuits can receive accurate gate drive signals, thereby improving the display light emission accuracy of the pixels and further improving the display performance of the display panel.

The preceding is the core idea of the present disclosure. Based on the embodiments of the present disclosure, all other embodiments obtained by those of ordinary skill in the art are within the scope of the present disclosure on the premise that no creative work is done. Technical solutions of the embodiments of the present disclosure are described clearly and completely below in conjunction with the drawings in the embodiments of the present disclosure.

Figure 3:
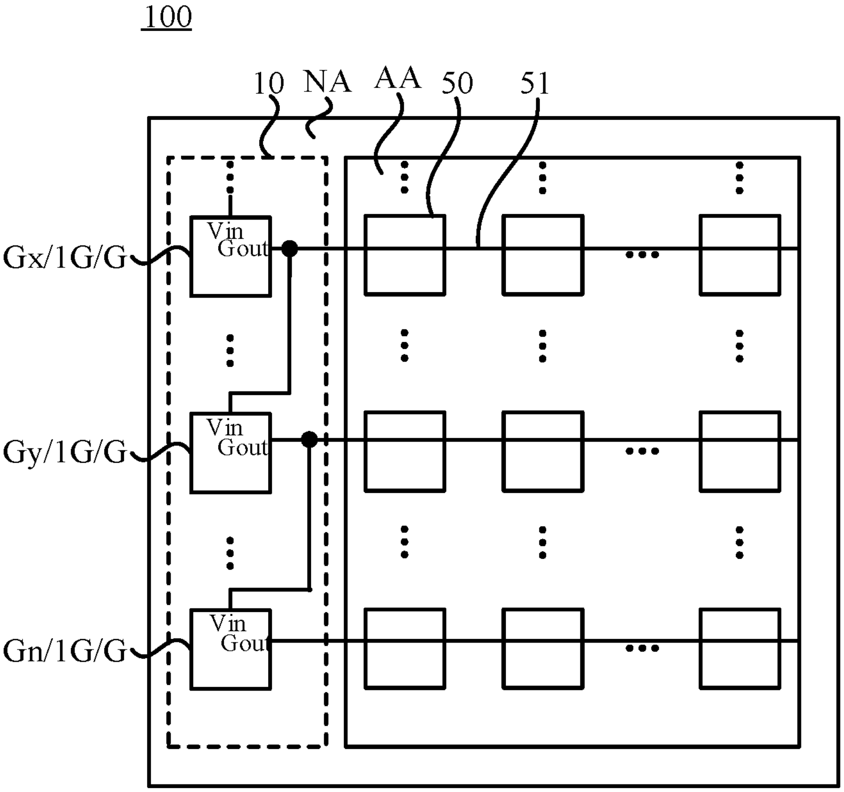
FIG. 3 is a structure diagram of a display panel according to an embodiment of the present disclosure.
Figure 4:
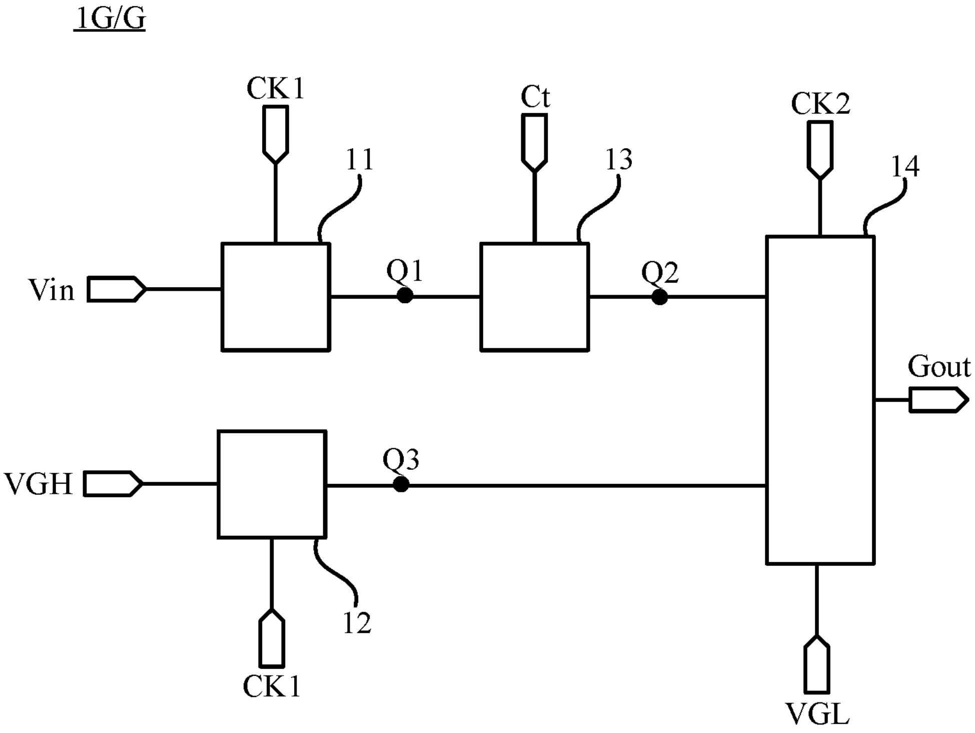
FIG. 4 is a schematic diagram of a circuit structure of a shift register according to an embodiment of the present disclosure.

FIG. 3 is a structure diagram of a display panel according to an embodiment of the present disclosure, and FIG. 4 is a schematic diagram of a circuit structure of a shift register according to an embodiment of the present disclosure. With reference to FIGS. 3 and 4, the display panel 100 includes a driver circuit 10. The driver circuit 10 includes multiple stages of shift registers G. A shift register G includes a first control module 11, a second control terminal 12, an isolation control module 13, an output module 14, a signal input terminal Vin, a first clock terminal CK1, a second clock terminal CK2, a first level terminal VGH, a second level terminal VGL, an isolation control terminal Ct and a signal output terminal Gout. The first control module 11 is electrically connected to the signal input terminal Vin, the first clock terminal CK1 and a first node Q1. The isolation control module 13 is electrically connected to the isolation control terminal Ct, the first node Q1 and a second node Q2. The second control module 12 is electrically connected to the first clock terminal CK1, the first level terminal VGH and a third node Q3. The output module 14 is electrically connected to the second node Q2, the third node Q3, the second clock terminal CK2, the second level terminal VGL and the signal output terminal Gout.

The first level terminal VGH may receive a first level signal vgh, and the second level terminal VGL may receive a second level signal vgl. The first level signal vgh and the second level signal vgl may both be at fixed levels, and the polarities of the first level signal vgh and the second level signal vgl may be opposite, that is, when the first level signal vgh is at a low level, the second level signal vgl is at a high level; or when the first level signal vgh is at a high level, the second level signal vgl is at a low level. The signal input terminal Vin may receive an input signal vin, the first clock terminal CK1 may receive a first clock signal ck1, the second clock terminal CK2 may receive a second clock signal ck2, and the isolation control terminal Ct may receive an isolation control signal ct. The input signal vin, the first clock signal ck1, the second clock signal ck2 and the isolation control signal ct may each include a high level and a low level, and the first clock signal ck1 and the second clock signal ck2 may change for a certain clock cycle. The effective levels of the input signal vin, the first clock signal ck1, the second clock signal ck2 and the isolation control signal ct may be high or low, and the effective levels of the input signal vin, the first clock signal ck1, the second clock signal ck2 and the isolation control signal ct may be the same or different, which may be specifically designed according to actual requirements. The technical solutions of the embodiments of the present disclosure are illustrated using an example in which the effective levels of the input signal vin, the first clock signal ck1, the second clock signal ck2 and the isolation control signal ct are high levels in the embodiments of the present disclosure.

For example, in the same first-type shift register 1G, the first control module 11 is electrically connected to the signal input terminal Vin, the first clock terminal CK1 and the first node Q1 so that the first control module 11 can control the signal output by the first node Q1 according to the signals of the first clock terminal CK1 and the signal input terminal Vin. For example, when the first clock signal ck1 is at an effective level, the first control module 11 may control the input signal vin of the signal input terminal Vin to be transmitted to the first node Q1 so that the signal of the first node Q1 can be consistent with the input signal vin.

The second control module 12 is electrically connected to the first level terminal VGH, the first clock terminal CK1 and the first node Q3 so that the second control module 12 can control the signal output by the third node Q3 according to the signals of the first clock terminal CK1 and the first level terminal VGH. For example, when the first clock signal ck1 is at an effective level, the second control module 12 may control the first level signal vgh of the first level terminal VGH to be transmitted to the third node Q3 so that the signal of the third node Q3 can be consistent with the first level signal vgh.

The isolation control module 13 is electrically connected to the first node Q1, the second node Q2 and the isolation control terminal Ct so that the isolation control module 13 can control the signal of the second node Q2 according to the signal of the isolation control terminal Ct and the signal of the first node Q1 or control the signal of the first node Q1 according to the signal of the isolation control terminal Ct and the signal of the second node Q2. For example, when the signal of the isolation control terminal Ct is at an effective level, the isolation control module 13 may transmit the signal of the first node Q1 to the second node Q2 or transmit the signal of the second node Q2 to the first node Q1 so that the signal of the first node Q1 is consistent with the signal of the second node Q2.

The output module 14 is electrically connected to the second clock terminal CK2, the second node Q2, the third node Q3, the second clock terminal VGL and the signal output terminal Gout so that the output module 14 can control the gate drive signal output by the signal output terminal Gout according to the second clock signal ck2 of the second clock terminal CK2, the signal at the third node Q3 and the second level signal vgl of the second level terminal VGL. For example, when the signal at the second node Q2 is at an effective level and the signal at the third node Q3 is at an ineffective level, the output module 14 may transmit the second clock signal ck2 of the second clock terminal CK2 to the signal output terminal Gout as a gate drive signal so that the gate drive signal can be consistent with the second clock signal ck2. Conversely, when the signal at the second node Q2 is at an ineffective level and the signal at the third node Q3 is at an effective level, the output module 14 may transmit the second level signal vgl of the second level terminal VGL to the signal output terminal Gout as a gate drive signal so that the gate drive signal can be consistent with the second level signal vgl.

With continued reference to FIGS. 3 and 4, the signal input terminal Vin of an $x^{th}$-stage shift register Gx is electrically connected to the signal output terminal Gout of a $y^{th}$-stage shift register Gy, where x and y are both positive integers, and x≠y.

It is to be understood that the driver circuit 10 may include N stages of shift registers G, where N may be a positive integer greater than or equal to 2, that is, two or more shift registers G may be provided in the driver circuit 10, and N may also be other values. The value of N may be set according to actual requirements and is not specifically limited in the embodiments of the present disclosure.

The signal output terminal Gout of the $y^{th}$-stage shift register Gy is electrically connected to the signal input terminal Vin of the first control module 11 of the $x^{th}$-stage shift register Gx so that the gate drive signal output by the signal output terminal Gout of the $y^{th}$-stage shift register Gy can be used as the input signal vin of the signal input terminal Vin of the $x^{th}$-stage shift register Gx. When the signal output terminal Gout of the shift register Gy cascaded with the current shift register Gx outputs an effective level of the gate drive signal, the signal of the signal input terminal Vin of the current shift register Gx is at an effective level, and when the first clock signal ck1 received by the current shift register Gx controls the first control terminal 11 to be in an on state, the input signal vin of the signal input terminal Vin is transmitted to the first node Q1 to charge the first node Q1 so that the signal of the first node Q1 in the current shift register Gx can be consistent with the gate drive signal output by the signal output terminal Gout of the $y^{th}$-stage shift register Gy. In this manner, the gate drive signal output by the signal output terminal Gout of the $y^{th}$-stage shift register Gy may control the signal of the first node Q1 in the $x^{th}$-stage shift register Gx so that the $x^{th}$-stage shift register Gx can output a corresponding gate drive signal according to the gate drive signal output by the signal output terminal Gout of the $y^{th}$-stage shift register Gy, thereby achieving sequential shifting of effective pulses of the gate drive signals output by various stages of the shift registers G.

Figure 5:
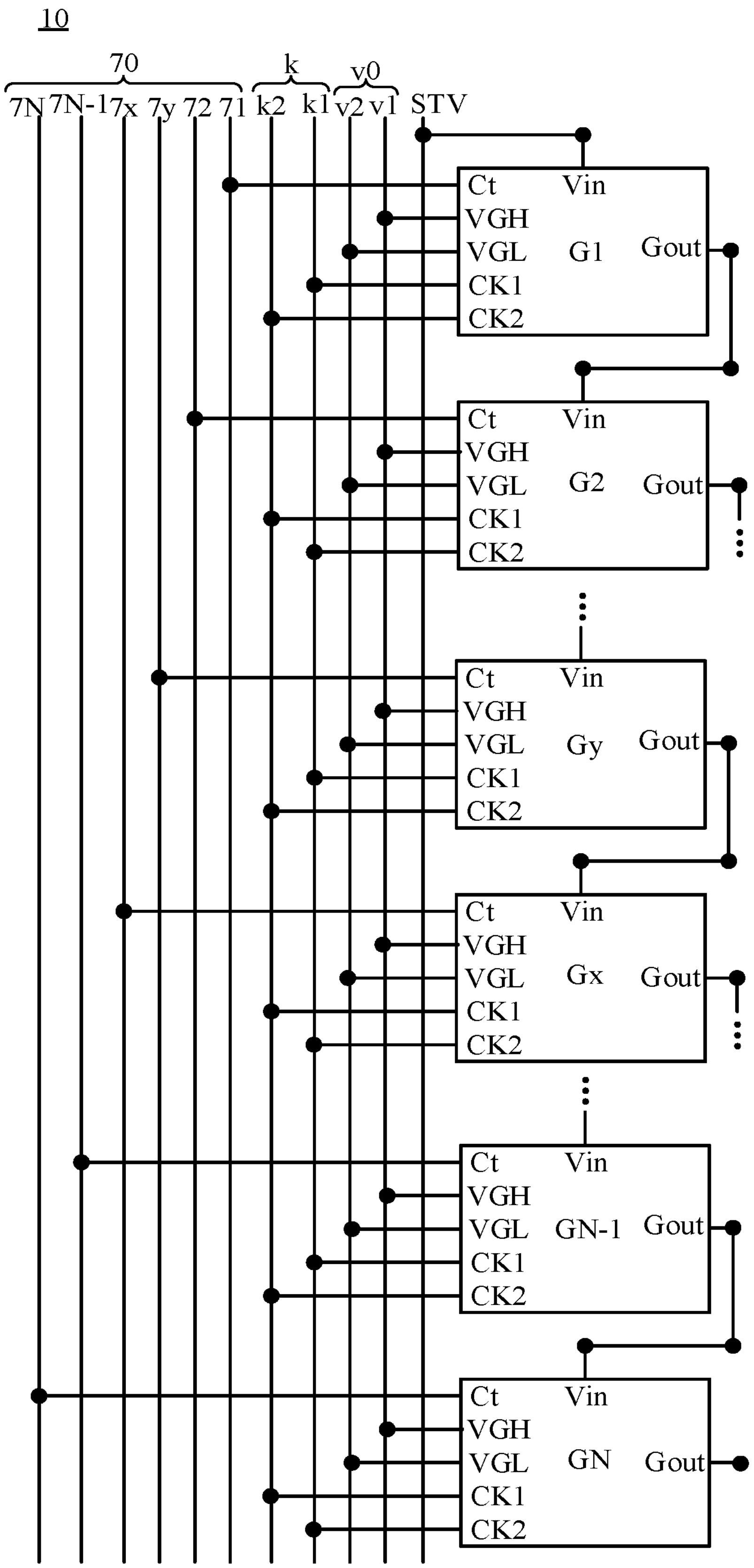
FIG. 5 is a structure diagram of a driver circuit according to an embodiment of the present disclosure.
Figure 6:
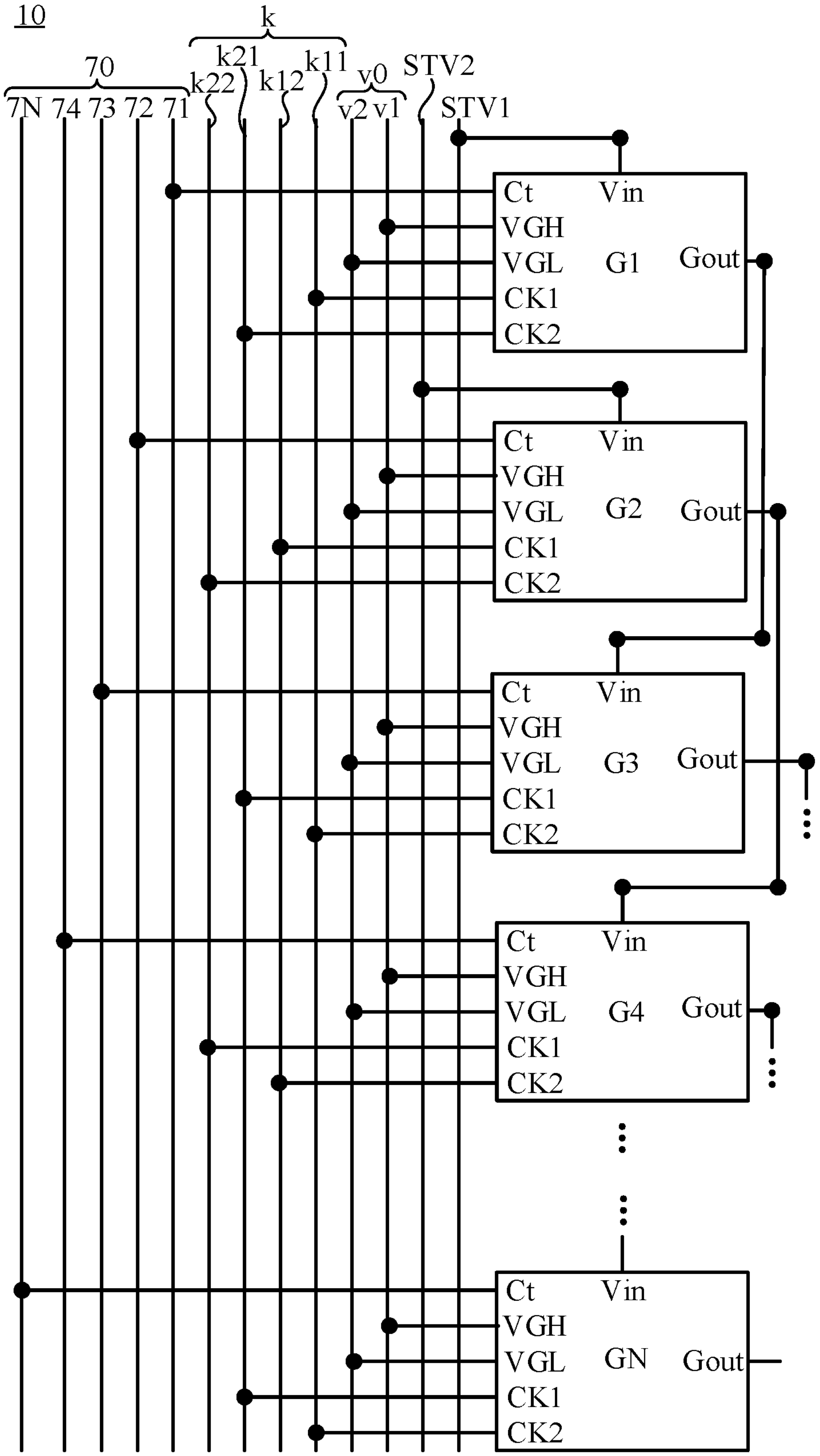
FIG. 6 is a structure diagram of another driver circuit according to an embodiment of the present disclosure.

It is to be understood that x≠y, that is, x may be greater than y or x may be less than y. In an example embodiment, as shown in FIG. 5, when the $x^{th}$-stage shift register Gx and the $y^{th}$-stage shift register Gy are two adjacent stages of shift registers, if x is equal to i, y may be equal to i−1; or, as shown in FIG. 6, the $x^{th}$-stage shift register Gx and the $y^{th}$-stage shift register Gy may also be two non-adjacent stages of shift registers, and in this case, x-y may be a positive integer greater than or equal to 2. On the premise that the core inventive points in the embodiments of the present disclosure are achieved, the values of x and y are not specifically limited in the embodiments of the present disclosure.

With continued reference to FIGS. 3 and 4, at least part of the shift registers G among the multiple stages of shift registers G are first-type shift registers 1G. In the same first-type shift register 1G, during at least part of the duration when the input signal of the signal input terminal Vin is at an effective level, the isolation control signal of the isolation control terminal Ct controls the isolation control module 13 to turn on the signal transmission path between the first node Q1 and the second node Q2; at least after the input signal jumps from an effective level to an ineffective level, the isolation control signal controls the isolation control module 13 to disconnect the signal transmission path between the first node Q1 and the second node Q2.

For example, when the isolation control signal ct of the isolation control terminal Ct is at an effective level, the isolation control signal ct may control the isolation control module 13 to be in an on state, and the signal of the first node Q1 may be transmitted to the second node Q2 so that the signal of the first node Q1 is consistent with the signal of the second node Q2. When the isolation control signal ct of the isolation control terminal Ct is at an ineffective level, the isolation control signal ct may control the isolation control module 13 to be in an off state so that the signal at the first node Q1 cannot be transmitted to the second node Q2 and the signal at the second node Q2 cannot be transmitted to the first node Q1. In this manner, the signals of the first node Q1 and the second node Q2 can remain unchanged without other signals being written.

It is to be understood that when the input signal vin of the signal input terminal Vin, the first clock signal ck1 and the isolation control signal ct are all at effective levels and the first control module 11 and the isolation control module 13 are both in on states, the effective level of the input signal vin may be transmitted to the first node Q1 through the first control module 11 and then transmitted from the first node Q1 to the second node Q2 through the isolation control module 13. When the input signal vin of the signal input terminal Vin is at an ineffective level, if the isolation control signal ct still controls the isolation control module 13 to be in an on state, the signal at the second node Q2 is transmitted to the signal input terminal Vin through the isolation control module 13 and the first node Q1 in the presence of a leakage current between the first node Q1 and the signal input terminal Vin, thereby causing inaccuracy of the electrical signal at the second node Q2.

In the preceding embodiment, by setting the isolation control signal ct of the isolation control terminal Ct to control the isolation control module 13 to be turned on during at least part of the duration when the input signal vin of the signal input terminal Vin is at an effective level, the effective level of the input signal vin may be transmitted to the first node Q1 through the first control module 11 and then may be continuously transmitted to the second node Q2 through the isolation control module 13 to control the output module 14 to output a corresponding signal to the signal output terminal Gout so that the pixel circuit electrically connected to the signal output terminal Gout can display and emit light, thereby allowing the display panel to display normally. Correspondingly, by setting the isolation control signal ct of the isolation control terminal Ct to control the isolation control module 13 to be turned off at least after the input signal jumps from an effective level to an ineffective level to disconnect the connection path between the first node Q1 and the second node Q2, even if a leakage current is generated between the first node Q1 and the signal input terminal Vin, the leakage current does not affect the signal of the second node Q2, and the signal of the second node Q2 is not transmitted to the first node Q1. In this manner, the accuracy of the signal of the second node Q2 is ensured, and the signal of the second node Q2 may further accurately control the gate drive signal output by the output module 14 to the signal output terminal Gout. Therefore, the accuracy of the gate drive signal output by the shift register G can be improved, and the pixel circuits electrically connected to the shift registers G can receive accurate gate drive signals, thereby improving the display accuracy of the display panel 100 and improving the display performance of the display panel 100.

It is to be understood that at least part of the duration when the input signal vin of the signal input terminal Vin is at an effective level may be part of the duration when the input signal vin of the signal input terminal Vin is at an effective level or all of the duration when the input signal vin of the signal input terminal Vin is at an effective level; on the basis that the isolation control module 13 can transmit the effective level of the signal input terminal vin to the second node Q2, at least part of the duration when the input signal vin of the signal input terminal Vin is at an effective level may be set according to actual requirements and is not specifically limited here.

In the technical solutions of the present disclosure, by setting the isolation control module between the first control module and the output module in the shift register, the isolation control signal of the isolation control terminal can control the isolation control module to be in an on state during at least part of the duration when the input signal of the signal input terminal of the first control module is at an effective level, and the effective level of the input signal received by the first node is transmitted to the second node through the isolation control module to ensure that the output module can output a corresponding gate drive signal to the signal output terminal under the control of the signal at the second node, thereby enabling the shift register to function normally and allowing the display panel to display normally. Furthermore, the isolation control signal of the isolation control terminal controls the isolation control module to be turned off at least after the input signal jumps from an effective level to an ineffective level, the path between the second node and the first node is in an off state, and even if a leakage current is generated between the first node and the signal input terminal, the leakage current does not affect the signal of the second node. Therefore, the accuracy of the signal of the second node can be ensured, and the signal of the second node can further accurately control the gate drive signal output by the output module to the signal output terminal, thereby improving the accuracy of the gate drive signal output by the shift register. In addition, when the gate drive signal output by the shift register is used to progressively scan the pixel circuits in the display panel, the pixel circuits can receive accurate gate drive signals, thereby improving the display light emission accuracy of the pixels and further improving the display performance of the display panel.

It is to be understood that the setting that at least part of the shift registers are first-type shift registers 1G may be that some or all of the shift registers are first-type shift registers 1G, which may be designed according to actual requirements and is not specifically limited in the embodiments of the present disclosure.

In an optional embodiment, with reference to FIG. 3, the display panel 100 may include a display region AA, and multiple pixel circuits 50 arranged in an array and multiple gate signal lines 51 may be provided in the display region AA. At least part of the pixel circuits 50 located in the same row are electrically connected to the same gate signal line 51; at this point, the signal output terminals Gout of various stages of the first-type shift registers 1G may be electrically connected to different gate signal lines 51, that is, the shift registers electrically connected to the gate signal lines 51 are all the first-type shift registers 1G. The first-type shift register 1G in each stage may output a gate drive signal to a respective one of the gate signal lines 51 to enable all the gate signal lines 51 to receive accurate gate drive signals so that all rows of the pixel circuits 50 can be accurately progressively scanned when the gate drive signals are transmitted to the pixel circuits 50 through the gate signal lines 51. Consequently, each row of the pixel circuits 50 may be correctly written with corresponding display signals (for example, data signals) to enable each row of the pixel circuits 50 to accurately display and emit light so that the display panel 100 can accurately present display images, thereby improving the display performance of the display panel 100.

Figure 7:
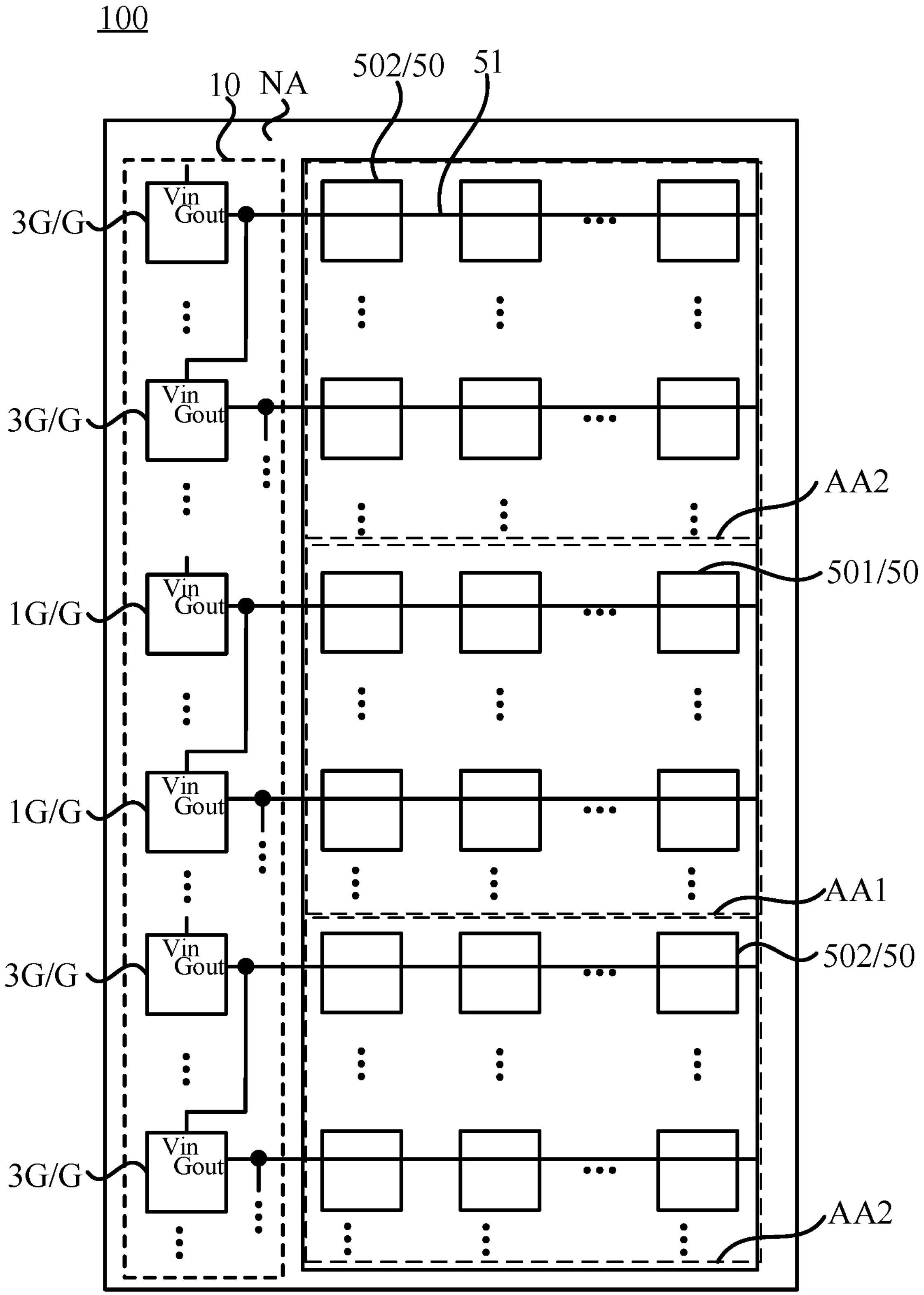
FIG. 7 is a structure diagram of another display panel according to an embodiment of the present disclosure.

In another optional embodiment, FIG. 7 is a structure diagram of another display panel according to an embodiment of the present disclosure. As shown in FIG. 7, the first type shift registers 1G may be electrically connected to only part of the gate signal lines 51. For example, the display panel 100 may include pixel circuits 501 for displaying dynamic images and pixel circuits 502 for displaying static images. For example, the display panel 100 may include a first display region AA1 and a second display region AA2. The pixel circuits 501 in the first display region AA1 are pixel circuits for displaying dynamic images, and the pixel circuits 502 in the second display region AA2 are pixel circuits for displaying static images.

For the pixel circuits 501 in the first display region AA1, their data signals constantly change, and these varying signals are required to be accurately written to the pixels. At this point, the first-type shift registers 1G may be set to be electrically connected to the pixel circuits 501 in the first display region AA1. In this manner, the pixel circuits in the first display region AA1 can accurately receive the gate drive signals, and the data signals can be accurately written to the pixel circuits in the first display region AA1 to control the pixel circuits in the first display region AA1 to accurately display and emit light, thereby improving the display performance of the display panel.

Correspondingly, since the second display region AA2 is designed for static image display, the data signals received by the pixel circuits in the second display region AA2 remain unchanged for a certain period of time, that is, during each frame display period within this period of time, the pixel circuits 502 in the second display region AA2 receive identical data signals, thereby eliminating constraints of write time of the data signals to the pixel circuits 502 of the second display region AA2. At this point, the driver circuit 10 may further include third-type shift registers 3G, and the third-type shift registers 3G may be electrically connected to the pixel circuits 502 located in the second display region AA2. The structure of the third-type shift register 3G may be different from the structure of the first-type shift register 1G. For example, during the working process of the display panel 100, the isolation control terminal Ct of the third-type shift register 3G may continuously receive the effective level of the isolation control signal ct. When signals at both the first node Q1 and the second node Q2 remain within normal ranges, the isolation control module 13 may turn on the signal transmission path between the first node Q1 and the second node Q2 under the control of the effective level of the isolation control signal ct and the signal at the first node Q1 or the second node Q2 so that the signal of the first node Q1 is consistent with the signal of the second node Q2. When either of the signal of the first node Q1 or the signal of the second node Q2 deviates from the normal range, under the control of the effective level of the isolation control signal ct and the out-of-range signal at the first node Q1 or the second node Q2, the isolation control module 13 is in an off state and turns off the signal transmission path between the first node Q1 and the second node Q2 to prevent the signal of the first node Q1 from affecting the stability of the signal at the second node Q2 or prevent the signal of the second node Q2 from affecting the stability of the signal at the first node Q1, thereby improving the operation safety and stability of the third-type shift register 3G.

Figure 8:
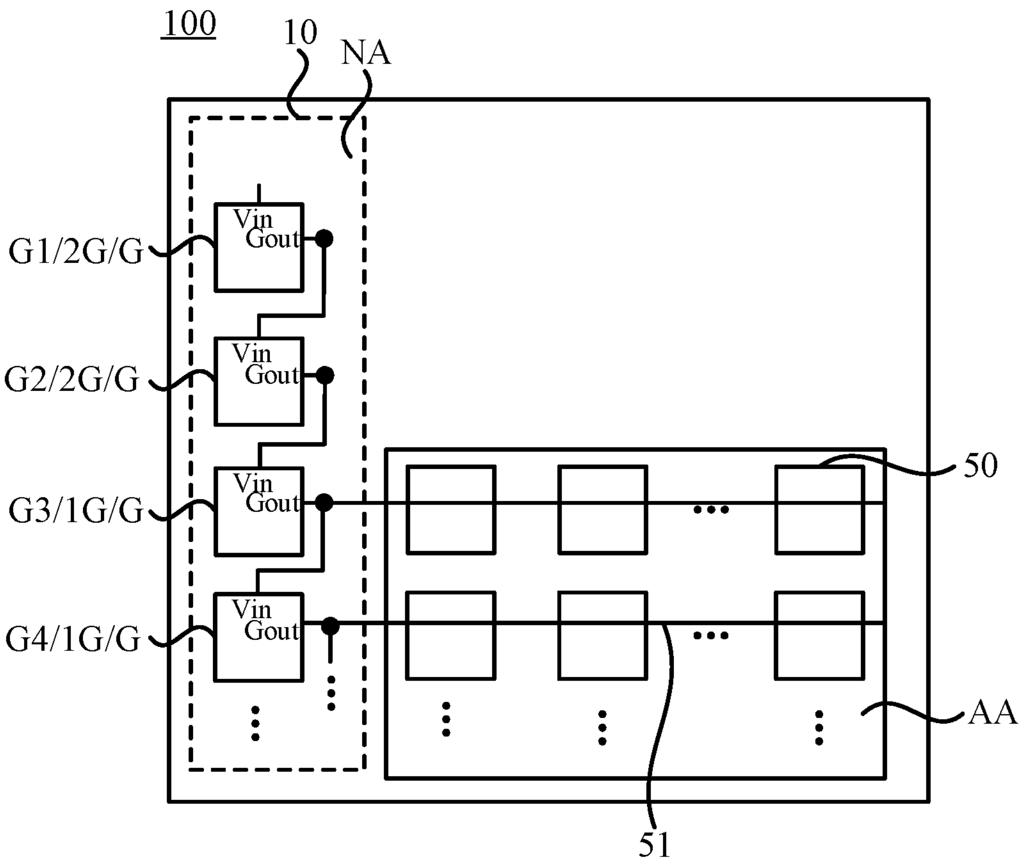
FIG. 8 is a structure diagram of another display panel according to an embodiment of the present disclosure.
Figure 9:
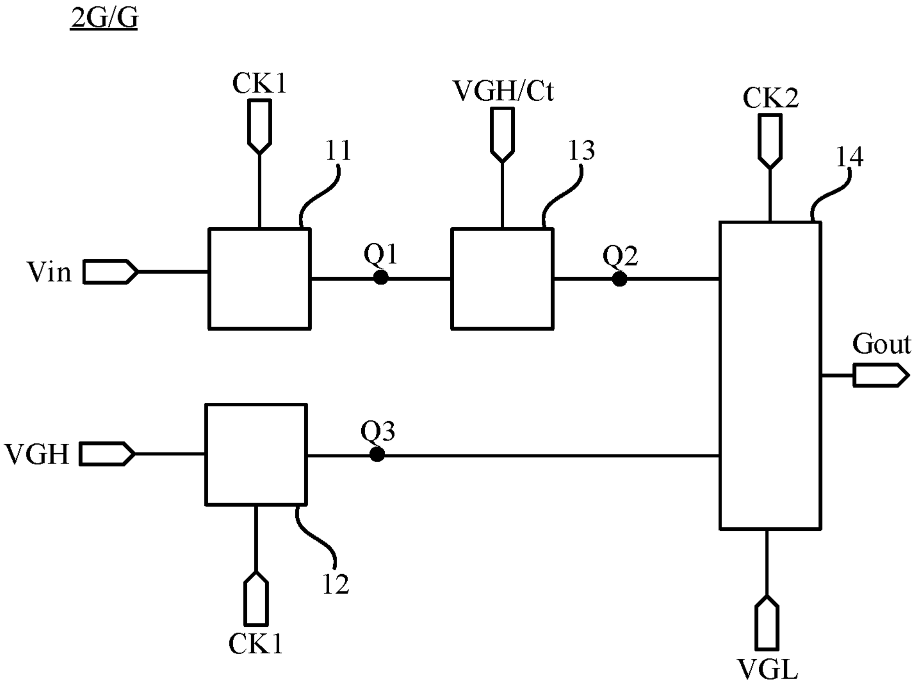
FIG. 9 is a schematic diagram of a circuit structure of a second-type shift register according to an embodiment of the present disclosure.

In another optional embodiment, FIG. 8 is a structure diagram of another display panel according to an embodiment of the present disclosure, and FIG. 9 is a schematic diagram of a circuit structure of a second-type shift register according to an embodiment of the present disclosure. With reference to FIGS. 8 and 9, the stages of shift registers G further include second-type shift registers 2G. The isolation control terminal Ct in the second-type shift register 2G is electrically connected to the first level terminal VGH.

For example, during the working process of the display panel 100, the isolation control terminal Ct of the second-type shift register 2G may continuously receive the first level signal vgh supplied by the first level terminal VGH. When signals at both the first node Q1 and the second node Q2 remain within normal ranges, the isolation control module 13 may turn on the signal transmission path between the first node Q1 and the second node Q2 under the control of the first level signal vgh and the signal at the first node Q1 or the second node Q2 so that the signal of the first node Q1 is consistent with the signal of the second node Q2. When either of the signal of the first node Q1 or the signal of the second node Q2 deviates from the normal range, under the control of the first level signal vgh and the out-of-range signal at the first node Q1 or the second node Q2, the isolation control module 13 is in an off state and turns off the signal transmission path between the first node Q1 and the second node Q2 to prevent the signal of the first node Q1 from affecting the stability of the signal at the second node Q2 or prevent the signal of the second node Q2 from affecting the stability of the signal at the first node Q1, thereby improving the operation safety and stability of the second-type shift register 2G. Furthermore, by electrically connecting the isolation control terminal Ct to the first voltage terminal VGH, the isolation control terminal Ct is electrically connected to the signal line supplying the first voltage signal vgh, and the need to dedicatedly set the signal line for the isolation control terminal Ct is eliminated, thereby simplifying the structure of the driver circuit 10 and reducing the overall size of the driver circuit 10. When the display panel 100 further includes a non-display region NA at least partially surrounding the display region AA, if the driver circuit 10 is provided in the non-display region NA, the driver circuit 10 with a smaller size occupies less space in the non-display region NA, thereby reducing the size of the non-display region NA and facilitating the narrow-bezel design of the display panel 100.

It is to be noted that when the driver circuit 10 includes both the first-type shift registers 1G and the second-type shift registers 2G, since the isolation control terminal Ct in each second-type shift register 2G is directly electrically connected to the first level terminal VGH, the signals of the isolation control terminals Ct in the second-type shift registers 2G are fixed signals, whereas the signals of the isolation control terminals Ct in the first-type shift registers 1G are changing signals, so there may be a difference between the gate drive signals output by the second-type shift register 2G and the first-type shift register 1G. Therefore, when the display panel 100 further includes multiple pixel circuits 50 arranged in an array and multiple gate signal lines 51 and at least part of the pixel circuits 50 located in the same row are electrically connected to the same gate signal line 51, the first-type shift register 1G is electrically connected to a corresponding row of pixel circuits 50 through a corresponding one of the multiple gate signal lines 51, whereas various stages of second-type shift registers 2G may not be electrically connected to any gate signal line 51, thereby improving the consistency of gate drive signals transmitted by the gate signal lines 51 and improving the display uniformity of the display panel 100. In this case, the second-type shift registers 2G may be provided in the driver circuit 10 as virtual shift register units.

It is to be understood that the number of second-type shift registers 2G may be one or two or may be other values, which is not specifically limited in the embodiments of the present disclosure. In an optional embodiment, the first m stages of shift registers G are second-type shift registers 2G, where m≥n.

X may be y+n. For example, when n=2, the signal output terminal Gout of the $i^{th}$-stage shift register Gi is electrically connected to the signal input terminal Vin of the $(i+2)^{th}$-stage register Gi+2. For example, the signal output terminal Gout of the first-stage shift register G1 is electrically connected to the signal input terminal Vin of the third-stage shift register G3. When n=3, the signal output terminal Gout of the $i^{th}$-stage shift register Gi is electrically connected to the signal input terminal Vin of the $(i+3)^{th}$-stage register Gi+3. For example, the signal output terminal Gout of the first-stage shift register G1 is electrically connected to the signal input terminal Vin of the fourth-stage shift register G4. By setting the number m of the second-type shift registers 2G to be greater than or equal to n, after the signal input terminals Vin of the first m stages of the second-type shift registers 2G receive the input signals vin, the input signals vin may be cascaded stage by stage and then transmitted to the signal input terminals Vin of the first-type shift registers 1G. In this manner, all the first-type shift registers 1G can receive the cascaded input signals vin, and the signal input terminals Vin of all the shift registers G connected to the gate signal lines 51 can receive the gate drive signals output by other shift registers connected to these shift registers G, thereby improving the consistency of the input signals received by various stages of the first-type shift registers 1G.

It is to be understood that the types of the shift registers G in the driver circuit 10 may be designed according to actual requirements and are not specifically limited in the embodiments of the present disclosure. In an example embodiment, as shown in FIG. 3, the driver circuit 10 includes only first-type shift registers 1G. In this case, the signal input terminals Vin of the first n stages of first-type shift registers 1G are electrically connected to start signal lines STV to receive start control signals stv from the start signal lines STV. These first-type shift registers 1G output gate drive signals to corresponding rows of pixel circuits 50 under joint action of the start control signals stv and other received signals, and the gate drive signals may serve as input signals vin of other shift registers G cascaded therewith to control other shift registers G to accurately output gate drive signals. In another example embodiment, as shown in FIG. 7, the driver circuit 10 may include both first-type shift registers 1G and third-type shift registers 3G. In this case, if the first n stages of shift registers are third-type shift registers 3G, the signal input terminals Vin of the first n stages of third-type shift registers 3G are electrically connected to start signal lines to receive start control signals from the start signal lines. These third-type shift registers 3G output gate drive signals to corresponding rows of pixel circuits 50 under the joint action of the start control signals and other received signals, and the gate drive signals may serve as input signals vin for other shift registers G cascaded therewith to control other shift registers G to accurately output gate drive signals. In another example embodiment, as shown in FIG. 8, the driver circuit 10 may include both first-type shift registers 1G and second-type shift registers 2G. In this case, the first m stages of shift registers are second-type shift registers 2G. The signal input terminals Vin of the first m stages of second-type shift registers 2G are electrically connected to start signal lines to receive start control signals from the start signal lines. These second-type shift registers 2G output gate drive signals to corresponding first-type shift registers 1G under joint action of the start control signals and other received signals, the first-type shift registers 1G then output gate drive signals to corresponding rows of pixel circuits 50 under joint action of input signals vin and other received signals, and the gate drive signals may serve as input signals of other shift registers cascaded therewith to control other shift registers to accurately output gate drive signals. Alternatively, in other example embodiments, the driver circuit 10 may also include first-type shift registers 1G, second-type shift registers 2G and third-type shift registers 3G.

For ease of description, unless special limitations are made, the technical solutions in the embodiments of the present disclosure are illustrated using an example in which the driver circuit includes only first-type shift registers 1G in the embodiments of the present disclosure.

It is to be noted that in the embodiments of the present disclosure, the shift register G in each stage in the driver circuit 10 is used for progressively scanning the pixel circuits 50, and the pixel circuits 50 may each include a preset module for receiving the gate drive signals output by the shift registers G in the driver circuit 10. The preset module may be turned on or off under the control of the gate drive signal output by the corresponding shift register G. When the gate drive signal is at an effective level, the preset module may be controlled to be turned on, and then signal transmission may be enabled between the nodes connected with the preset module. When the gate drive signal is at an ineffective level, the preset module may be controlled to be turned off, and then the signal transmission is disabled between the nodes connected with the preset module. Therefore, the gate drive signals output by the shift registers G may control the driving process of the pixel circuits 50.

It is to be understood that the preset module may include active and/or passive devices. The active devices, for example, may be transistors, and the passive devices, for example, may be capacitors, resistors, inductors or the like. When the preset module includes a p-channel metal-oxide-semiconductor (PMOS) transistor, the low level of the gate drive signal is the effective level of the gate drive signal, and the high level of the gate drive signal is the ineffective level of the gate drive signal. Conversely, when the preset module includes an n-channel metal-oxide semiconductor (NMOS) transistor, the high level of the gate drive signal is the effective level of the gate drive signal, and the low level of the gate drive signal is the ineffective level of the gate drive signal. For ease of description, unless special limitations are made, the technical solutions in the embodiments of the present disclosure are illustrated using an example in which all the transistors in the preset module are NMOS transistors in the embodiments of the present disclosure.

It is also to be understood that the preset module of the pixel circuit 50 may be any module in the pixel circuit 50 and may be selected according to actual requirements. The pixel circuit 50 and the preset module thereof mentioned in the embodiments of the present disclosure are illustrated below using typical examples.

Figure 10:
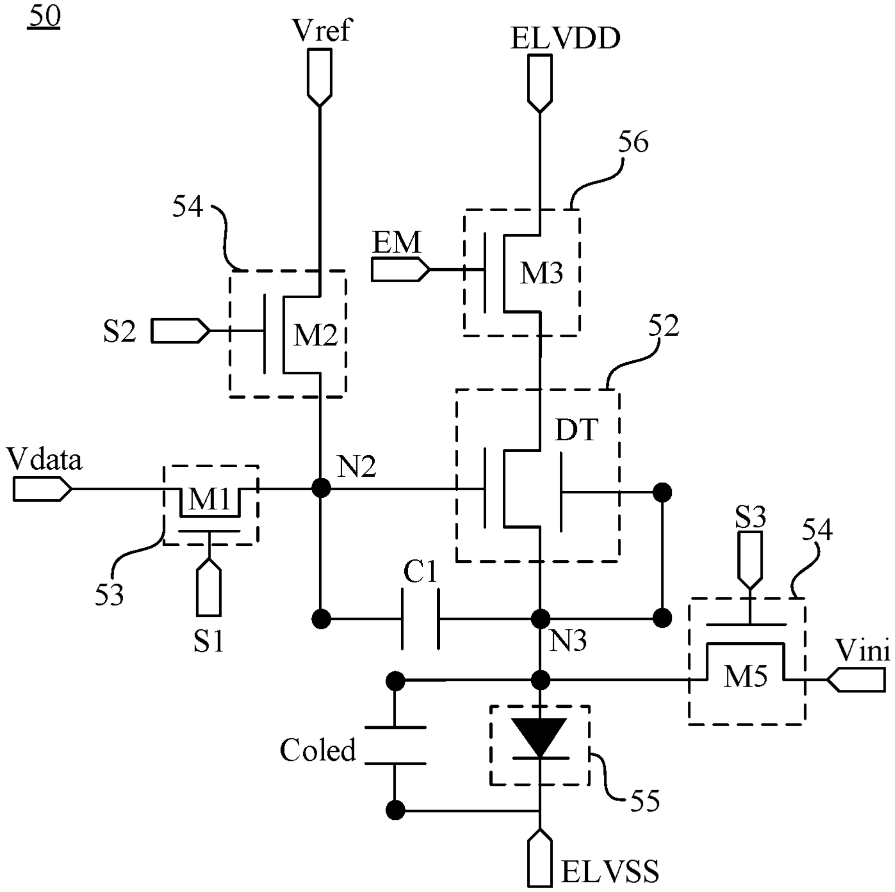
FIG. 10 is a structure diagram of a pixel circuit according to an embodiment of the present disclosure.

Optionally, FIG. 10 is a structure diagram of a pixel circuit according to an embodiment of the present disclosure. As shown in FIG. 10, the pixel circuit 50 at least includes a drive module 52, a write module 53, a reset module 54 and a light-emitting module 55. The drive module 52 includes a drive transistor DT. The write module 53 is electrically connected to the gate of the drive transistor DT at a gate node N2. The reset module 54 is electrically connected to the gate node N2, and the reset module 54 is further electrically connected to the light-emitting module 55 at a light emission reset node N3.

For example, the drive cycle of the pixel circuit 50 may include a reset stage, a write stage and a light emission stage that are sequentially performed. In the reset stage, the reset module 54 may supply a reset signal Vref to the gate node N2 and the light emission reset node N3 to reset the gate of the drive transistor DT and the light emission reset node N3. In the write stage, the write module 53 may supply a data signal Vdata to the drive transistor DT. In the light emission stage, the drive module 52 supplies a drive current to the light-emitting module 55 according to the gate signal of its drive transistor DT to drive the light-emitting module 55 to emit light.

In an optional embodiment, the drive transistor DT may have a double-gate structure, that is, the drive transistor may include a main gate and an auxiliary gate. The main gate may be connected to the gate node N2, and the auxiliary gate may be connected to the light emission reset node N3, thereby reducing the internal resistance of the drive transistor DT and improving the transmission efficiency of the drive current.

On the basis of the preceding embodiments, the reset module 54 may include a first reset transistor M2 and a second reset transistor M5. The first electrode of the first reset transistor M2 may receive the first reset signal Vref, the second electrode of the first reset transistor M2 is electrically connected to the gate of the drive transistor DT at the gate node N2, and the gate of the first reset transistor M2 may receive a second scan signal S2. The first reset transistor M2 may be turned on or off under the control of the second scan signal S2 so that when the second scan signal S2 controls the first reset transistor M2 to be turned on, the first reset signal Vref can be transmitted to the gate of the drive transistor DT to reset the gate of the drive transistor DT in preparation for subsequent writing of the data signal Vdata. The first electrode of the second reset transistor M5 may receive a second reset signal Vini, the second electrode of the second reset transistor M5 is electrically connected to the light-emitting module 55 at the light emission reset node N3, and the gate of the second reset transistor M5 may receive a third scan signal S3. The second reset transistor M5 may be turned on or off under the control of the third scan signal S3 so that when the third scan signal S3 controls the second reset transistor M5 to be turned on, the second reset signal Vini can be transmitted to the light-emitting module 55 to reset the light-emitting module 55.

On the basis of the preceding embodiments, optionally, the write module 53 may include a write transistor M1. The first electrode of the write transistor M1 may receive the data signal Vdata, the second electrode of the write transistor M1 is electrically connected to the gate node N2 of the drive module 52, and the gate of the write transistor M1 may receive a first scan signal S1. The first scan signal S1 may control the write transistor M1 to be turned on or off so that when the write transistor M1 is in an on state, the write transistor M1 can write the data signal Vdata to the drive module 52, thereby achieving the writing of the data signal Vdata.

Optionally, the light-emitting module 55 may include a current-type drive element, that is, the light-emitting module 55 may be driven to display and emit light only when the display drive signal supplied to the light-emitting module 55 is a drive current. However, since the data signal Vdata supplied by the write module 53 is generally a voltage signal, the drive module 52 needs to be provided in the pixel circuit 50 to convert the data signal Vdata into a drive current by the drive transistor DT of the drive module 52. When the drive current is supplied to the light-emitting module 55, the light-emitting module 55 may display and emit light according to the drive current. Generally, the larger the drive current is, the higher the luminous brightness of the light-emitting module 55 is. Therefore, by separately supplying the data signal Vdata to each pixel circuit 50, the luminous brightness of each light-emitting module 55 may be separately controlled, thereby enabling the display panel 100 to display colorful images. The light-emitting module 55 may include a current-type light-emitting element such as an organic light-emitting diode (OLED), a mini-light-emitting diode (mini-LED) or a micro-light-emitting diode (micro-LED).

In another optional embodiment, with continued reference to FIG. 10, the pixel circuit 50 may further include a light emission control module 56. The light emission control module 56 includes a light emission control transistor M3. The first electrode of the light emission control transistor M3 is electrically connected to a first power signal ELVDD, the second electrode of the light emission control transistor M3 is electrically connected to one terminal of the drive module 52, and the gate of the light emission control transistor M3 is electrically connected to a light emission control signal EM. The light emission control transistor M3 may be turned on or off under the control of the light emission control signal EM so that when the light emission control signal EM controls the light emission control transistor M3 to be turned on, the first power signal ELVDD can be transmitted to the drive transistor DT. The light emission control module 56 may control the duration when the drive module 52 supplies the drive current to the light-emitting module 55, thereby controlling the light emission duration of the light-emitting module 55.

In addition, the pixel circuit 50 further includes a storage capacitor C1 and a voltage regulation capacitor Coled. The storage capacitor C1 is electrically connected between the gate node N2 and the light emission reset node N3 and is used for storing the gate potential of the drive transistor DT and the threshold voltage of the drive transistor DT to enable the drive transistor DT to continuously supply the light-emitting module 55 with a drive current independent of the threshold voltage of the drive transistor DT during the light emission stage. The voltage regulation capacitor Coled is connected in parallel to the light-emitting module 55 and can regulate the drive current of the light-emitting module 55 and suppress the fluctuation of display brightness of the light-emitting module 55, thereby improving the luminous stability of the light-emitting module 55.

It is to be noted that the structure of the pixel circuit 50 is described above only by way of example, and in the embodiments of the present disclosure, the structure of the pixel circuit 50 is not limited thereto. For example, the pixel circuit 50 may also be a typical 7T1C pixel circuit, that is, the pixel circuit includes seven transistors and one storage capacitor. On the premise that the core inventive points in the embodiments of the present disclosure are achieved, the structure of the pixel circuit 50 is not specifically limited in the embodiments of the present disclosure. For ease of description, unless special limitations are made, the technical solutions in the embodiments of the present disclosure are illustrated using the pixel circuit structure shown in FIG. 10 as an example in the embodiments of the present disclosure.

In an optional embodiment, with reference to FIGS. 3 and 10, the preset module in the pixel circuit 50 may be one of the reset module 54, the write module 53 or the light emission control module 56, and at this point, the gate drive signal output by the shift register G in the driver circuit 10 may be one of the first scan signal S1, the second scan signal S2, the third scan signal S3 or the light emission control signal EM.

For example, when the preset module in the pixel circuit 50 is the write module 53, the write modules 53 of at least part of the pixel circuits 50 located in the same row are electrically connected to the same gate signal line 51, and the gate drive signal output by the corresponding shift register G is the first scan signal S1 received by the write modules 53. Since the first-type shift register 1G is electrically connected to a corresponding one of the gate signal lines 51, the gate drive signal output by the first-type shift register 1G may be transmitted through the respective gate signal line 51 to the write module 53 of the corresponding pixel circuit 50 to control the write module 53 to be turned on or off. When the gate drive signal controls the write module to be turned on, the data signal Vdata may be written to the gate of the drive transistor DT, and then the drive transistor DT generates a drive current according to the gate signal of the drive transistor DT in the light emission stage to drive the light-emitting module 55 to produce display and emit light.

Figure 11:
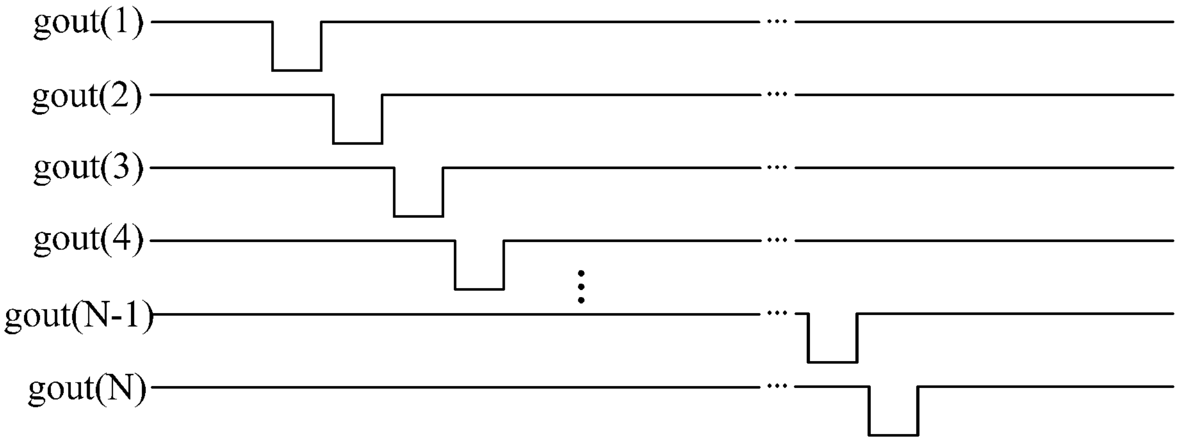
FIG. 11 is a timing diagram of a gate drive signal supplied by a driver circuit according to an embodiment of the present disclosure.

For example, with reference to FIGS. 3, 10 and 11, gout (i) represents the gate drive signal output by the signal output terminal Gout of the $i^{th}$-stage shift register Gi. When the gate drive signal gout(1) output by the signal output terminal Gout(1) of the first-stage shift register G1 is at an effective level, the pixel circuits 50 of the first row electrically connected to the first-stage shift register G1 may perform data writing; when the gate drive signal gout(2) output by the signal output terminal Gout(2) of the second-stage shift register G2 is at an effective level, the pixel circuits 50 of the second row electrically connected to the second-stage shift register G2 may perform data writing; when the gate drive signal gout (3) output by the signal output terminal Gout (3) of the third-stage shift register G3 is at an effective level, the pixel circuits 50 of the third row electrically connected to the third-stage shift register G3 may perform data writing; by analogy, when the gate drive signal gout(N−1) output by the signal output terminal Gout (N−1) of the $(N-1)^{th}$-stage shift register GN-1 is at an effective level, the pixel circuits 50 of the $(N-1)^{th}$ row electrically connected to the $(N-1)^{th}$-stage shift register GN-1 may perform data writing; and when the gate drive signal gout(N) output by the signal output terminal Gout(N) of the Nth-stage shift register GN is at an effective level, the pixel circuits 50 of the Nth row electrically connected to the Nth-stage shift register GN may perform data writing.

It is to be understood that the shift register G and the manner in which the shift register G supplies the gate drive signal to the pixel circuit 50 are illustrated above only by way of example. On the premise that the core inventive points in the embodiments of the present disclosure are achieved, the shift register G and the manner in which the shift register G supplies the gate drive signal to the pixel circuit 50 are not specifically limited in the embodiments of the present disclosure. To more clearly explain the embodiments of the present disclosure, a typical example of the shift register G is illustrated below.

Figure 12:
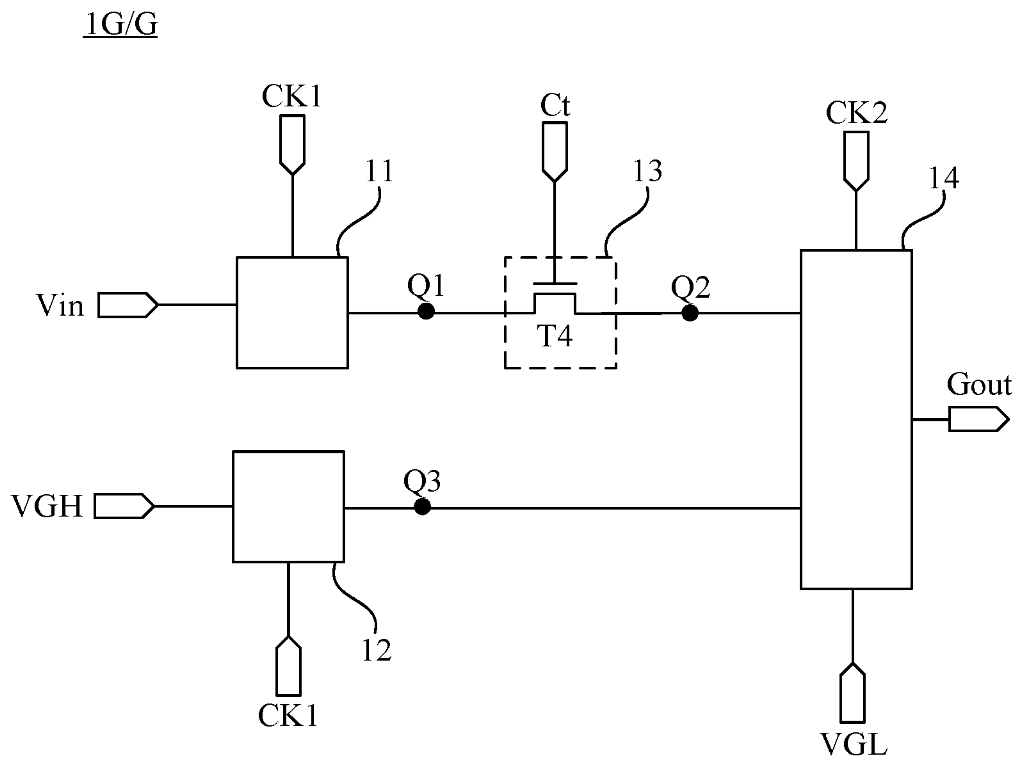
FIG. 12 is a schematic diagram of a circuit structure of another shift register according to an embodiment of the present disclosure.

Optionally, FIG. 12 is a schematic diagram of a circuit structure of another shift register according to an embodiment of the present disclosure. As shown in FIG. 12, the isolation control module 13 includes an isolation transistor T4. In the same shift register G, the gate of the isolation transistor T4 is electrically connected to the isolation control terminal Ct, the first electrode of the isolation transistor T4 is electrically connected to the first node Q1, and the second electrode of the isolation transistor T4 is electrically connected to the second node Q2.

For example, the isolation control signal ct supplied by the isolation control terminal Ct may control the isolation transistor T4 to be turned on or off. When the isolation control signal is at an effective level, the isolation transistor T4 may be controlled to be turned on, and the electrical signal at the first node Q1 may be transmitted by the isolation transistor T4 to the second node Q2 so that the signal of the second node Q2 can be consistent with the signal of the first node Q1. When the isolation control signal is at an ineffective level, the isolation transistor T4 may be controlled to be turned off, and the electrical signal at the second node Q2 may be prevented from being transmitted to the first node Q1 and the signal input terminal Vin to avoid the generation of a leakage current, thereby improving the accuracy of the potential at the second node Q2.

It is to be understood that the isolation transistor T4 may be an NMOS transistor or a PMOS transistor, and the type of the isolation transistor T4 may be designed according to actual requirements and is not specifically limited in the embodiments of the present disclosure. When the isolation transistor T4 is an NMOS transistor, the effective level of the isolation control signal ct is high; conversely, when the isolation transistor T4 is a PMOS transistor, the effective level of the isolation control signal ct is low. For ease of description, unless special limitations are made, the technical solutions in the embodiments of the present disclosure are illustrated using an example in which the transistors in the shift register G are NMOS transistors in the embodiments of the present disclosure. Accordingly, the effective levels of the signals received by the shift register G and the signals at various nodes are high, and their ineffective levels are low.

Figure 13:
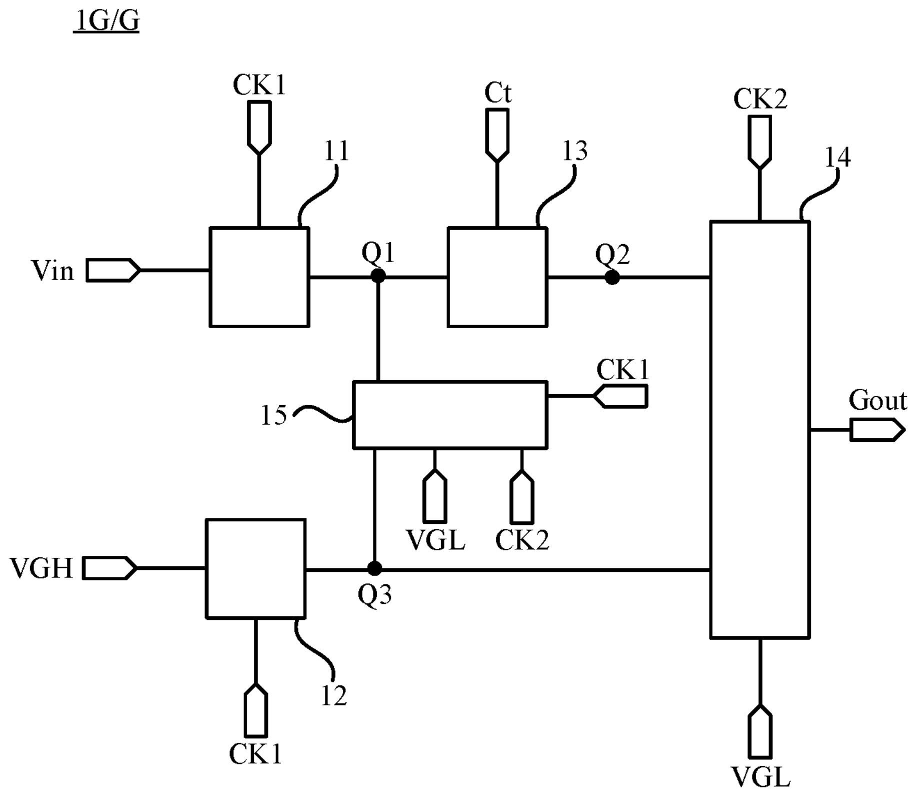
FIG. 13 is a schematic diagram of a circuit structure of another shift register according to an embodiment of the present disclosure.
Figure 14:
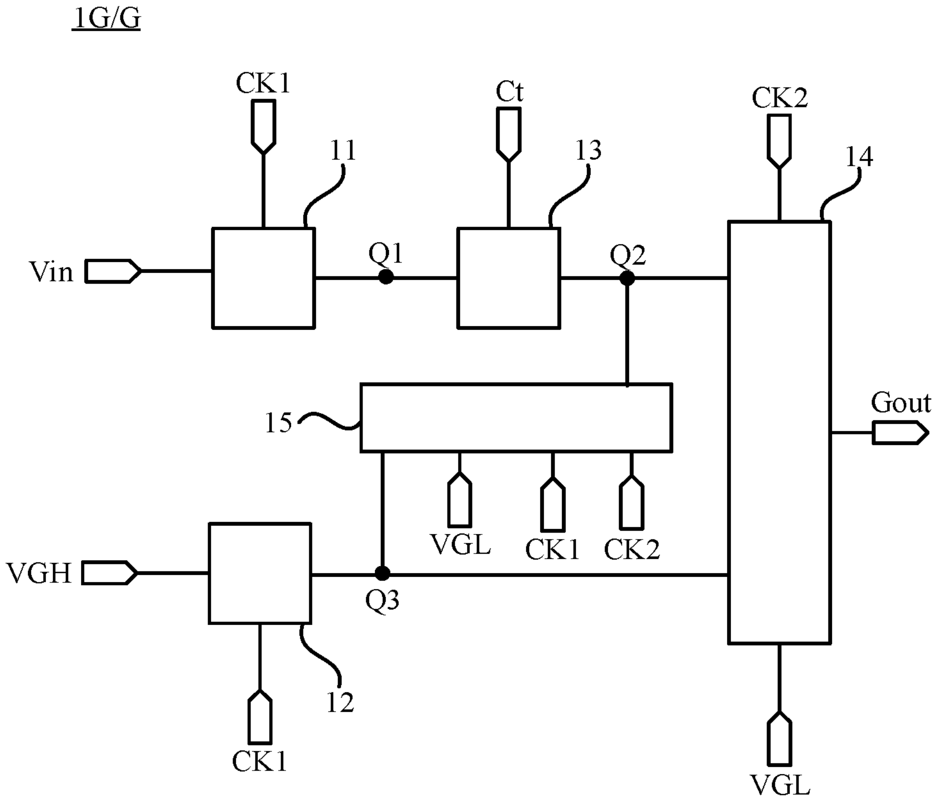
FIG. 14 is a schematic diagram of a circuit structure of a shift register according to an embodiment of the present disclosure.
Figure 15:
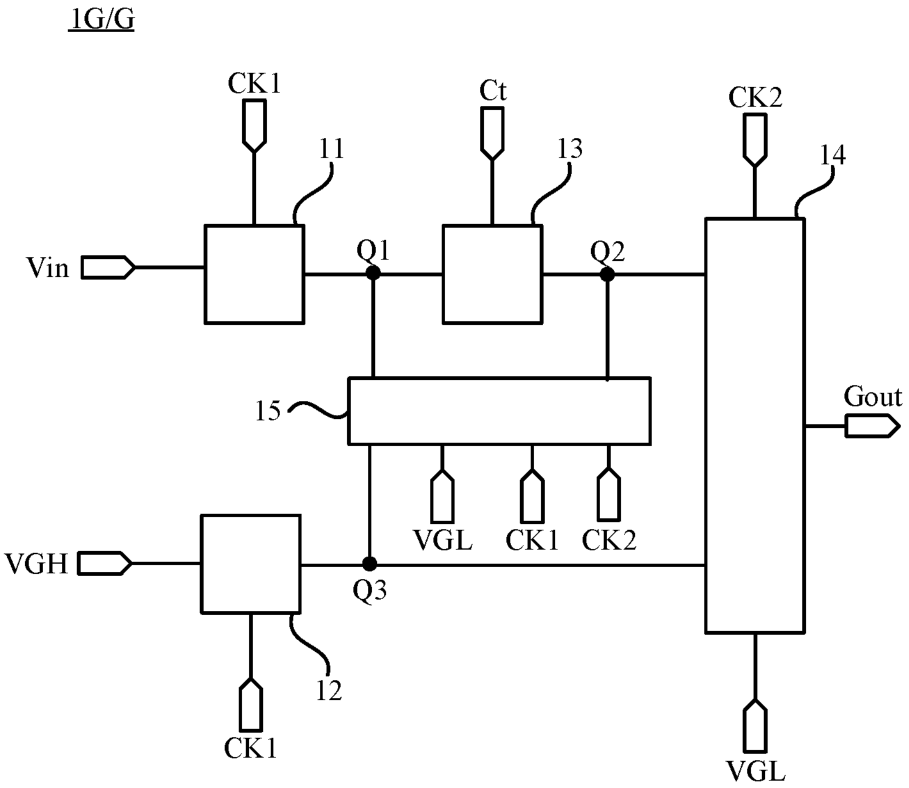
FIG. 15 is a schematic diagram of a circuit structure of a shift register according to an embodiment of the present disclosure.

In an optional embodiment, FIG. 13 is a schematic diagram of a circuit structure of another shift register according to an embodiment of the present disclosure, FIG. 14 is a schematic diagram of a circuit structure of a shift register according to an embodiment of the present disclosure, and FIG. 15 is a schematic diagram of a circuit structure of a shift register according to an embodiment of the present disclosure. With reference to FIGS. 13 to 15, the shift register G further includes a reset module 15. In the same shift register G, the reset module 15 is electrically connected to the third node Q3, the second level terminal VGL, the first clock terminal CK1 and the second clock terminal CK2. The reset module 15 is further electrically connected to the first node Q1 and/or the second node Q2.

For example, by setting the reset module 15 to be electrically connected to the third node Q3, the second level terminal VGL, the first clock terminal CK1 and the second clock terminal CK2, the reset module 15 may control the signal of the third node Q3 according to the signal of the third node Q3, the second level signal vgl, the first clock signal ck1 and the second clock signal ck2 to reset the potential of the third node Q3. For example, the reset module 15 may control the transmission path of the second level signal vgl to the third node Q3 according to the signal of the third node Q3, the first clock signal ck1 and the second clock signal ck2. On the basis of the above, the reset module 15 may further be electrically connected to the first node Q1 and/or the second node Q2 to reset the first node Q1 and/or the second node Q2. Therefore, by setting the reset module 15 to reset the third node Q3 and the first node Q1 and/or the second node Q2, the signals of the nodes may be enabled to accurately control the working process of the shift register G, and meanwhile, the nodes may be prepared for the next input of the effective levels, thereby improving the accuracy of the gate drive signal output by the shift register G and further improving the display performance of the display panel 100.

It is to be understood that the setting that the reset module 15 is electrically connected to the first node Q1 and/or the second node Q2 may be that the reset module 15 may be electrically connected to at least one of the first node Q1 or the second node Q2. For example, as shown in FIG. 13, the reset module 15 is electrically connected to the first node Q1 and the third node Q3 so that the reset module 15 can reset the first node Q1 and the third node Q3. Alternatively, as shown in FIG. 14, the reset module 15 is electrically connected to the second node Q2 and the third node Q3 so that the reset module 15 can reset the second node Q2 and the third node Q3. Alternatively, as shown in FIG. 15, the reset module 15 is electrically connected to the first node Q1, the second node Q2 and the third node Q3 so that the reset module 15 can simultaneously reset the first node Q1, the second node Q2 and the third node Q3. The specific connection mode among the first node Q1, the second node Q2 and the third node Q3 is not specifically limited in the embodiments of the present disclosure.

Figure 16:
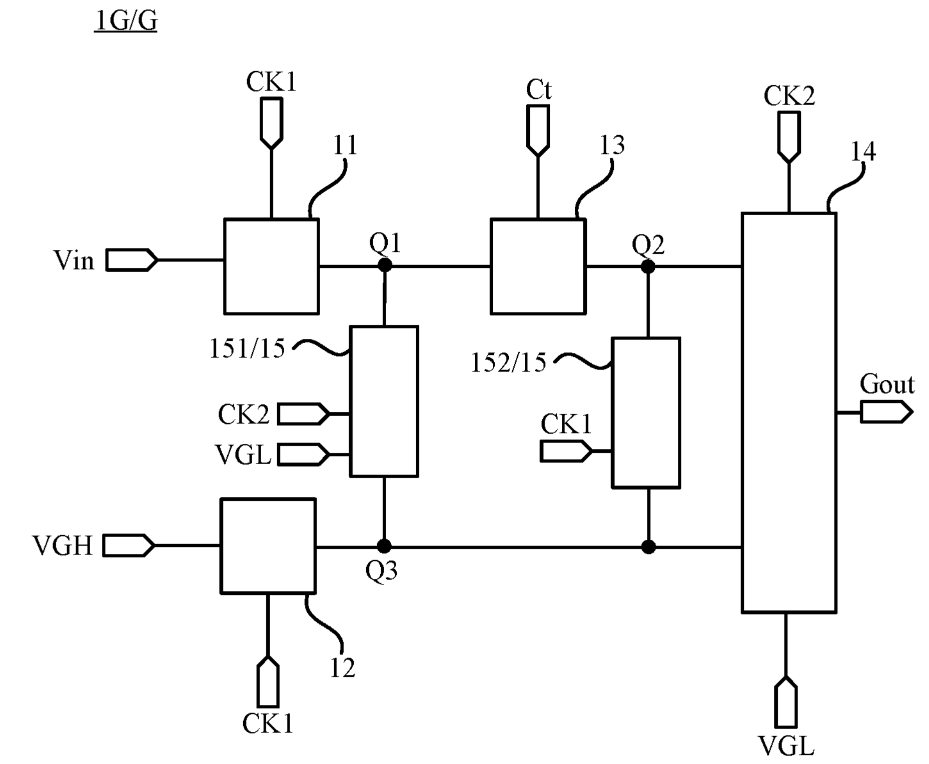
FIG. 16 is a schematic diagram of a circuit structure of another shift register according to an embodiment of the present disclosure.
Figure 17:
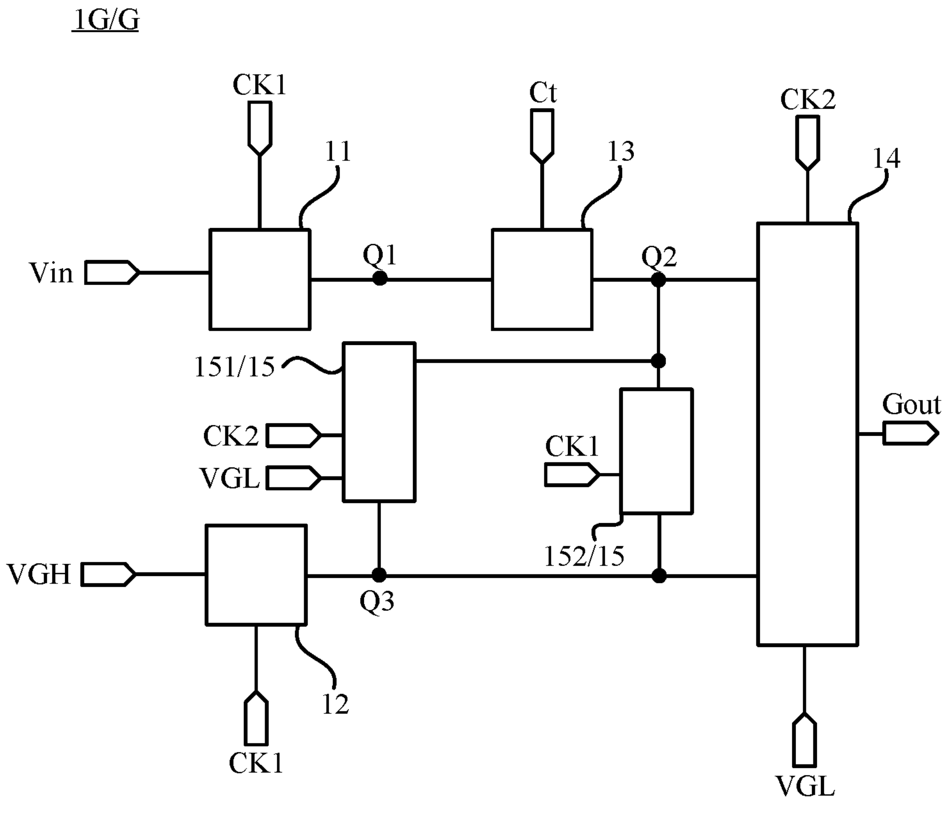
FIG. 17 is a schematic diagram of a circuit structure of another shift register according to an embodiment of the present disclosure.
Figure 18:
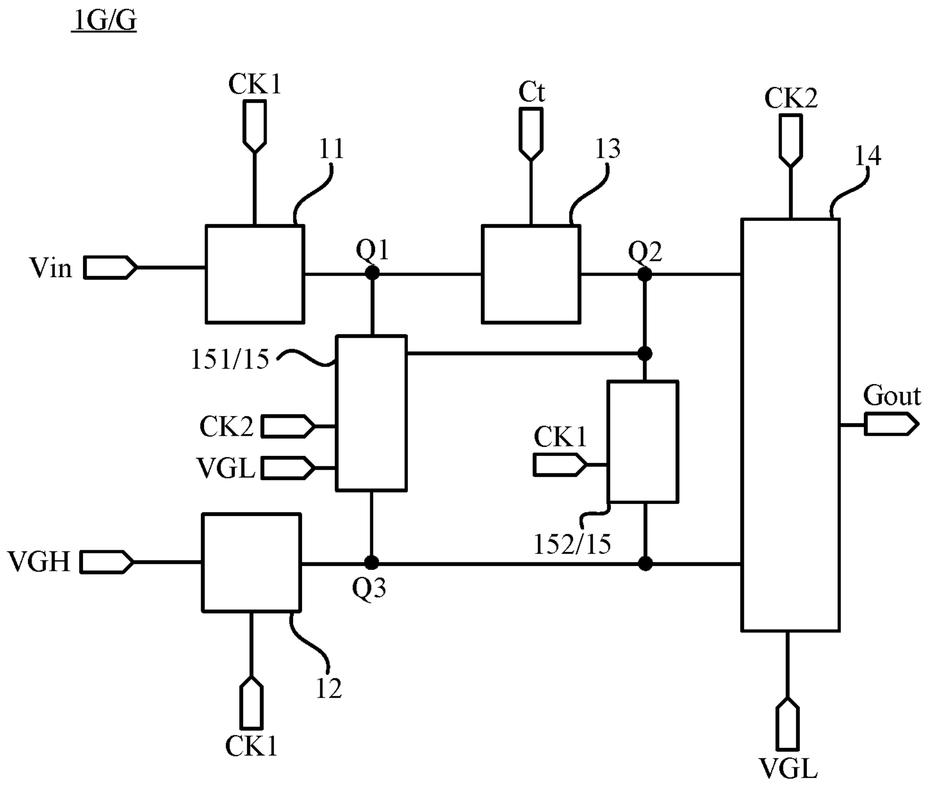
FIG. 18 is a schematic diagram of a circuit structure of another shift register according to an embodiment of the present disclosure.
Figure 19:
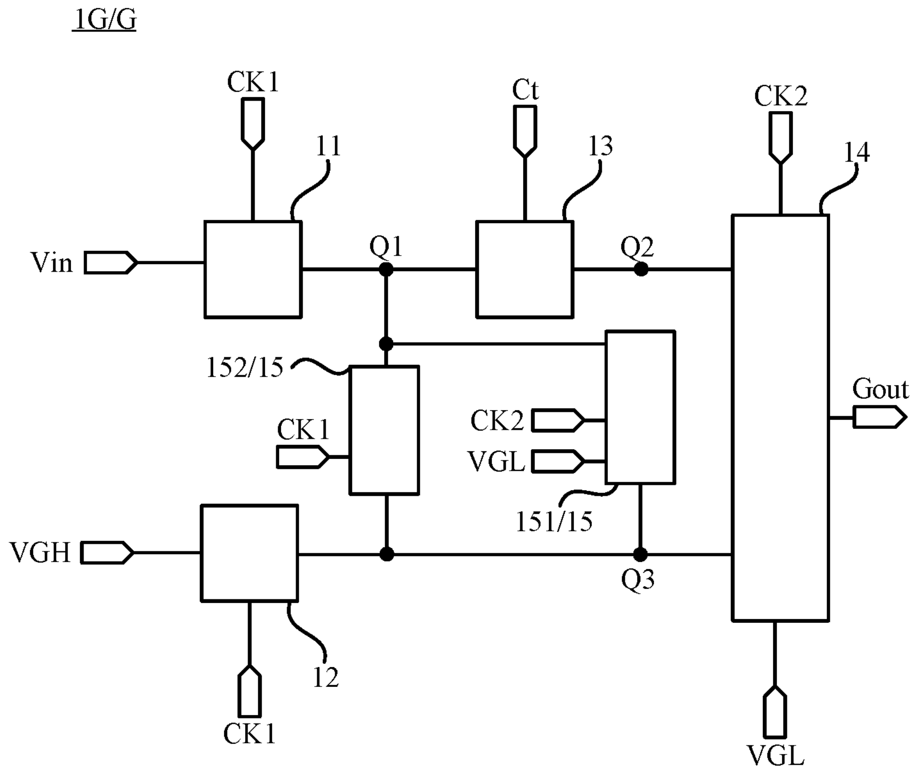
FIG. 19 is a schematic diagram of a circuit structure of a shift register according to an embodiment of the present disclosure.
Figure 20:
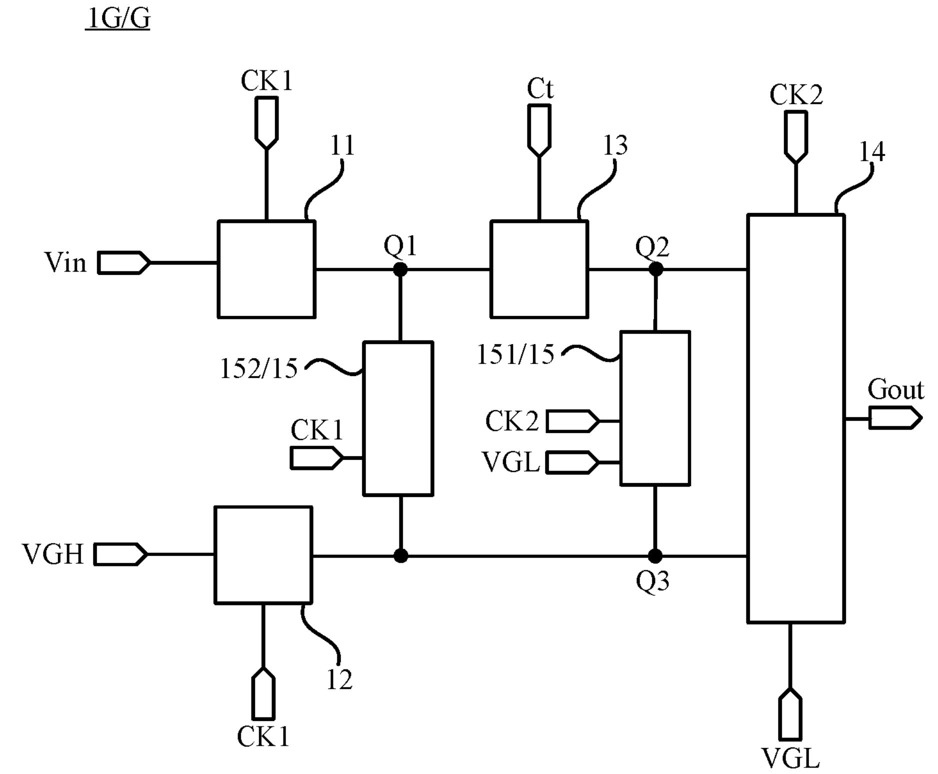
FIG. 20 is a schematic diagram of a circuit structure of another shift register according to an embodiment of the present disclosure.
Figure 21:
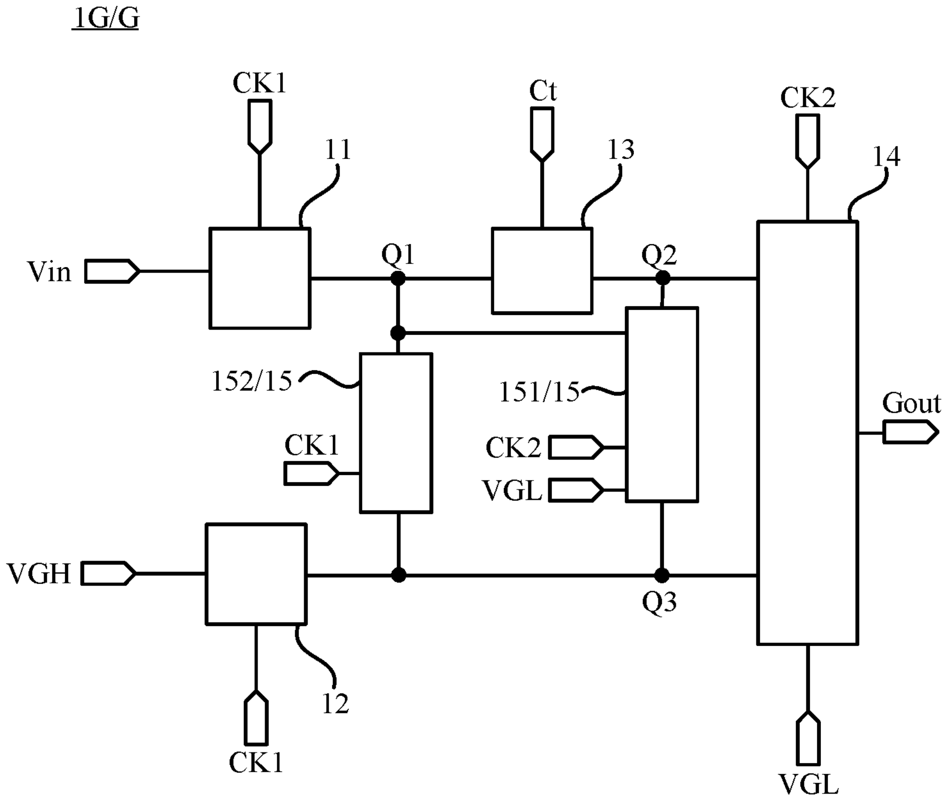
FIG. 21 is a schematic diagram of a circuit structure of another shift register according to an embodiment of the present disclosure.

In an optional embodiment, FIG. 16 is a schematic diagram of a circuit structure of another shift register according to an embodiment of the present disclosure, FIG. 17 is a schematic diagram of a circuit structure of another shift register according to an embodiment of the present disclosure, FIG. 18 is a schematic diagram of a circuit structure of another shift register according to an embodiment of the present disclosure, FIG. 19 is a schematic diagram of a circuit structure of a shift register according to an embodiment of the present disclosure, FIG. 20 is a schematic diagram of a circuit structure of another shift register according to an embodiment of the present disclosure, and FIG. 21 is a schematic diagram of a circuit structure of another shift register according to an embodiment of the present disclosure. With reference to FIGS. 16 to 21, the reset module 15 includes a first reset sub-module 151 and a second reset sub-module 152. In the same shift register G, the first reset sub-module 151 is electrically connected to the third node Q3, the second level terminal VGL and the second clock terminal CK2, and the first reset sub-module 151 is further electrically connected to the first node Q1 and/or the second node Q2; the second reset sub-module 152 is electrically connected to the first clock terminal CK1 and the third node Q3, and the second reset sub-module 152 is further electrically connected to the first node Q1 or the second node Q2.

For example, the first reset sub-module 151 may control the signals of the first node Q1 and/or the second node Q2 according to the signal of the third node Q3, the second clock signal ck2 of the second clock terminal CK2 and the second level signal vgl of the second level terminal VGL to reset the first node Q1 and/or the second node Q2. For example, when the first reset sub-module 151 is electrically connected to the third node Q3, the second clock terminal CK2, the second level terminal VGL and the first node Q1 and both the second clock signal ck2 received by the second clock terminal CK2 and the signal of the third node Q3 are at effective levels, the first reset sub-module 151 may transmit the second level signal vgl to the first node Q1 to reset the first node Q1.

The second reset sub-module 152 may control the signal of the third node Q3 according to the signals of the first node Q1 and/or the second node Q2 and the first clock signal ck1 of the first clock terminal CK1 to reset the third node Q3. For example, when the second reset sub-module 152 is electrically connected to the third node Q3, the first clock terminal CK1 and the second node Q2, the signal of the second node Q2 is at an effective level and the first clock signal ck1 of the first clock terminal CK1 is at an ineffective level, the second reset sub-module 152 may transmit the ineffective level of the first clock signal ck1 to the third node Q3 to reset the third node Q3.

It is to be noted that the first reset sub-module 151 may be electrically connected to the first node Q1 and/or the second node Q2 to reset the first node Q1 and/or the second node Q2; the second reset sub-module 152 may be electrically connected to the first node Q1 or the second node Q2 to control the reset of the third node Q3 through the first node Q1 or the second node Q2; the electrical connection relationship among the first reset sub-module 151, the first node Q1 and the second node Q2 and the electrical connection relationship between the second reset sub-module 152 and the first node Q1 or the second node Q2 may be set according to actual requirements and are not specifically limited here. For ease of description, the embodiments of the present disclosure are illustrated using an example in which the first reset sub-module 151 is electrically connected to the first node Q1, the second node Q2 and the third node Q3 and the second reset sub-module 152 is electrically connected to the second node Q2 and the third node Q3.

Figure 22:
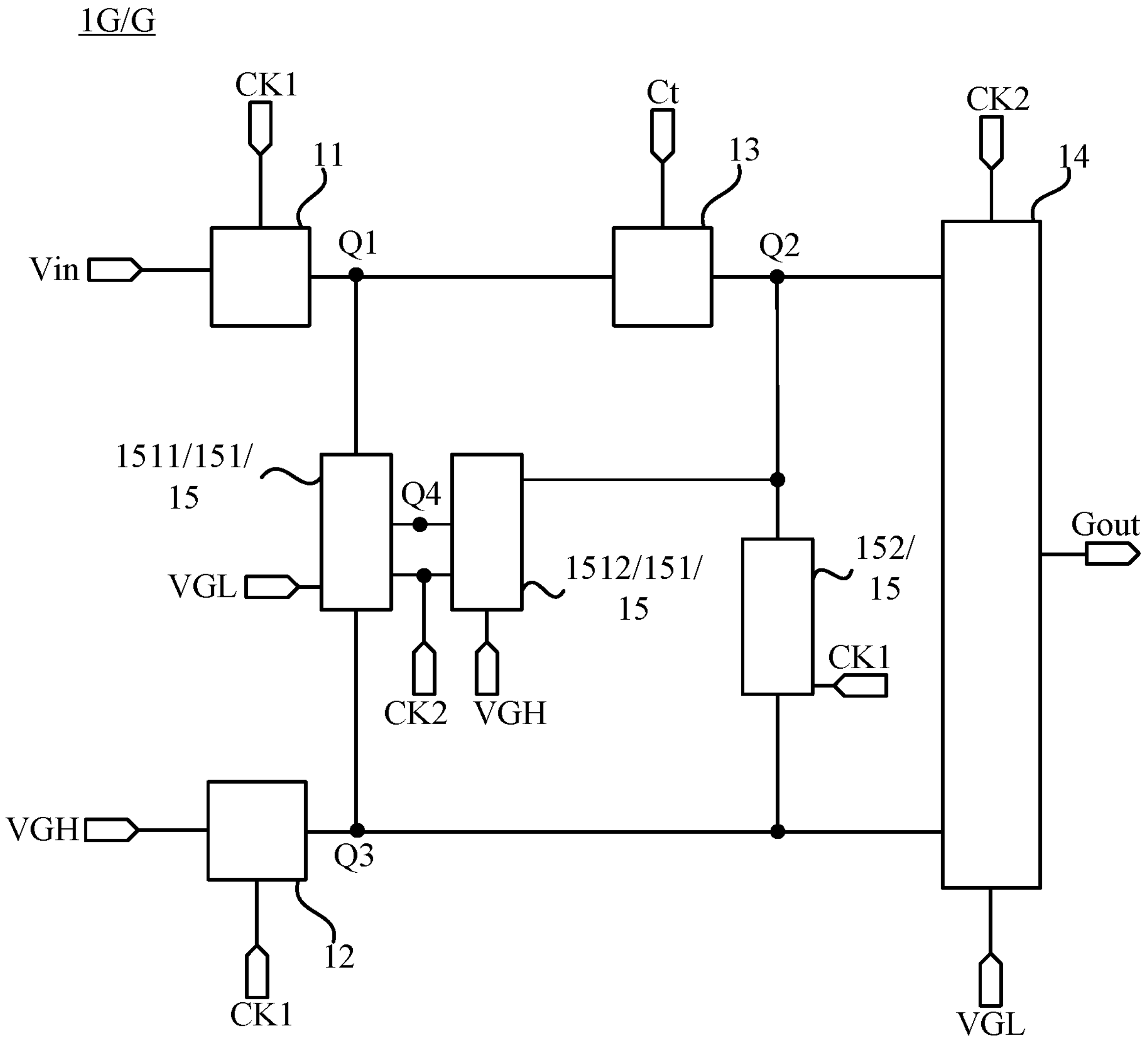
FIG. 22 is a schematic diagram of a circuit structure of a shift register according to an embodiment of the present disclosure.
Figure 23:
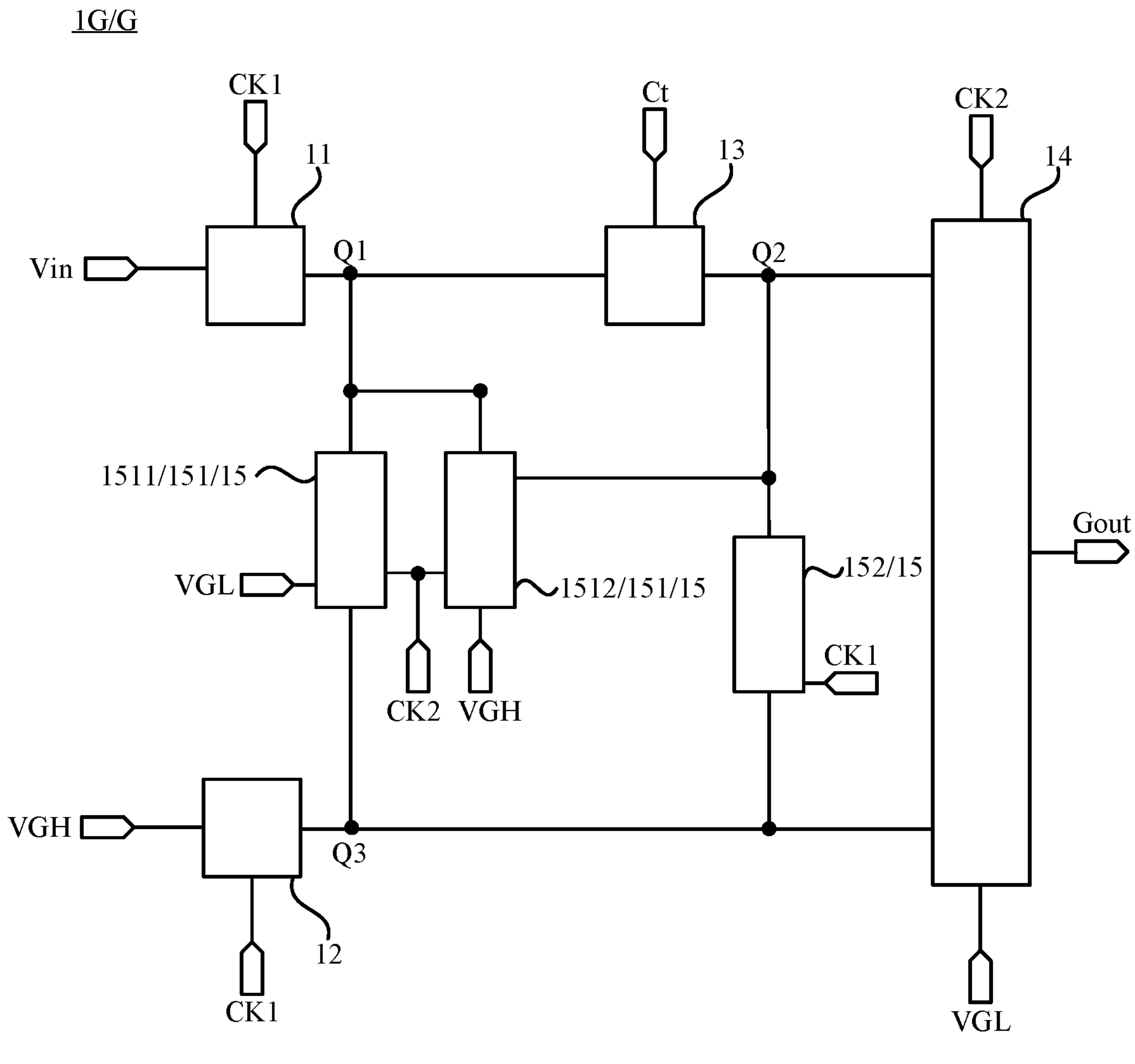
FIG. 23 is a schematic diagram of a circuit structure of another shift register according to an embodiment of the present disclosure.

In an optional embodiment, FIG. 22 is a schematic diagram of a circuit structure of a shift register according to an embodiment of the present disclosure, and FIG. 23 is a schematic diagram of a circuit structure of another shift register according to an embodiment of the present disclosure. With reference to FIGS. 22 and 23, the first reset sub-module 151 includes a first reset unit 1511 and a second reset unit 1512. in the same shift register G, the first reset unit 1511 is electrically connected to the second clock terminal CK2, the second level terminal VGL, the third node Q3 and the first node Q1; the second reset unit 1512 is electrically connected to the second clock terminal CK2, the first level terminal VGH and the second node Q2; the second reset unit 1512 is further electrically connected to the first reset unit 1511 at a fourth node Q4 or the second reset unit 1512 is further electrically connected to the first node Q1.

For example, the first reset unit 1511 may control the signal of the first node Q1 according to the signal of the third node Q3, the second clock signal ck2 of the second clock terminal CK2 and the second level signal vgl of the second level terminal VGL to reset the first node Q1. For example, when both the second clock signal ck2 received by the second clock terminal CK2 and the signal of the third node Q3 are at effective levels, the first reset unit 1511 may transmit the second level signal vgl to the first node Q1 to reset the first node Q1. The second reset unit 1512 may control the signal of the second node Q2 according to the second clock signal ck2 of the second clock terminal CK2, the first level signal vgh of the first level terminal VGH and the signal of the fourth node Q4 to reset the second node Q2. For example, when the second clock signal ck2 received by the second clock terminal CK2 is at an effective level and the signal of the fourth node Q4 is at an ineffective level, the second reset unit 1512 may transmit the ineffective level of the fourth node Q4 to the second node Q2 to reset the second node Q2. Therefore, by setting the first reset unit 1511 and the second reset unit 1512 to reset the first node Q1 and the second node Q2, respectively, the reset accuracy and reliability are improved.

It is to be noted that, on the premise that the first reset unit 1511 may reset the first node Q1 and the second reset unit 1512 may reset the second node Q2, the specific structures of the first reset unit 1511 and the second reset unit 1512 are not limited in the embodiments of the present disclosure. The specific structures of these units in the embodiments of the present disclosure are illustrated below using typical examples.

Figure 24:
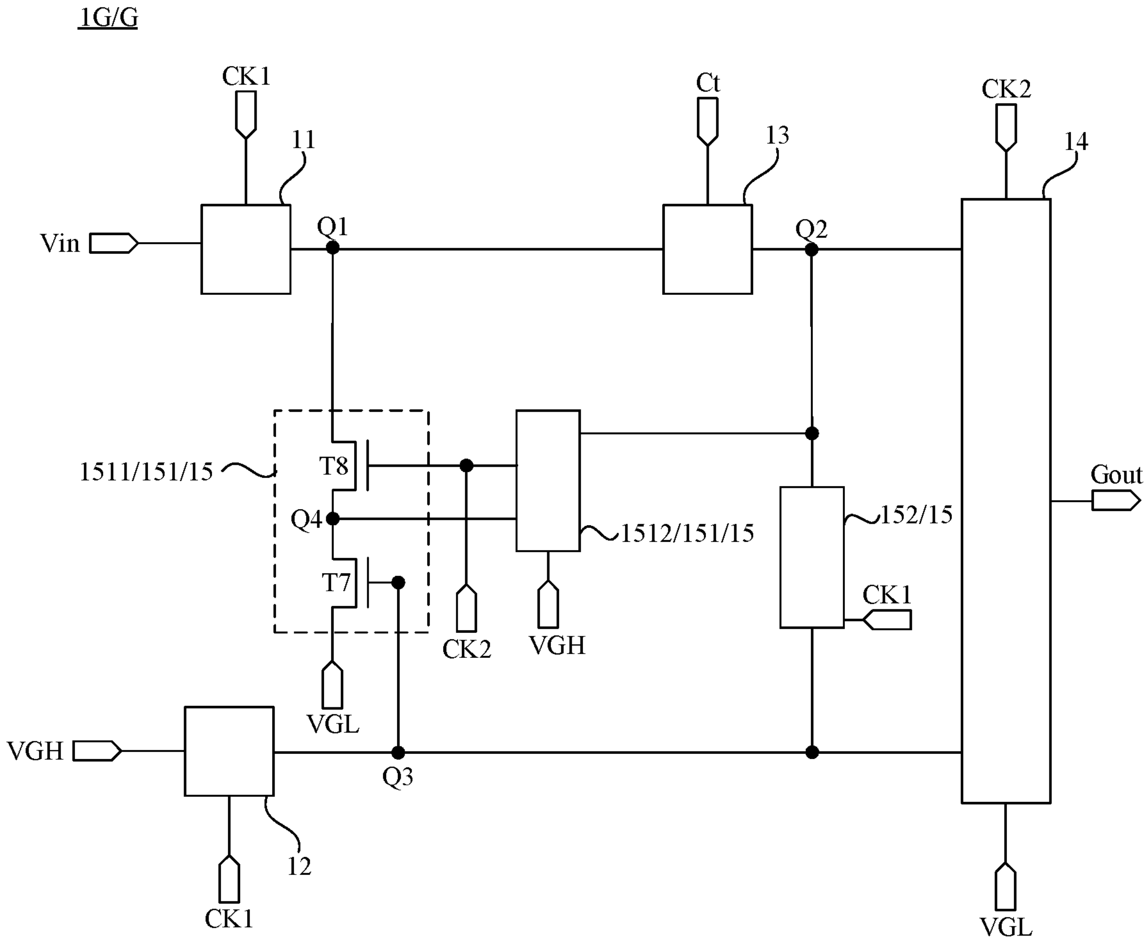
FIG. 24 is a schematic diagram of a circuit structure of another shift register according to an embodiment of the present disclosure.

Optionally, FIG. 24 is a schematic diagram of a circuit structure of another shift register according to an embodiment of the present disclosure. As shown in FIG. 24, the first reset unit 1511 includes a first reset transistor T7 and a second reset transistor T8. In the same shift register G, the gate of the first reset transistor T7 is electrically connected to the third node Q3, the first electrode of the first reset transistor T7 is electrically connected to the second level terminal VGL, and the second electrode of the first reset transistor T7 is electrically connected to the first electrode of the second reset transistor T8 at the fourth node Q4; the gate of the second reset transistor T8 is electrically connected to the second clock terminal CK2, and the second electrode of the second reset transistor T8 is electrically connected to the first node Q1.

For example, the first reset transistor T7 may be turned on or off according to the signal of the third node Q3. When the third node Q3 controls the first reset transistor T7 to be turned on, the second level terminal VGL and the fourth node Q4 may be controlled to form a conduction path so that the second level signal vgl of the second level terminal VGL is transmitted to the fourth node Q4. For example, when the signal of the third node Q3 is at an effective level, the first reset transistor T7 is turned on, and the second level signal vgl is transmitted to the fourth node Q4.

The second reset transistor T8 may be turned on or off according to the second clock signal ck2 supplied by the second clock terminal CK2. When the second clock signal ck2 controls the second reset transistor T8 to be turned on, the fourth node Q4 and the first node Q1 may be controlled to form a conduction path so that the signal of the fourth node Q4 is transmitted to the first node Q1. For example, when the second clock signal ck2 received by the second clock terminal CK2 is at an effective level, the second reset transistor T8 is turned on, and the signal of the fourth node Q4 is transmitted to the first node Q1 to reset the first node Q1.

Figure 25:
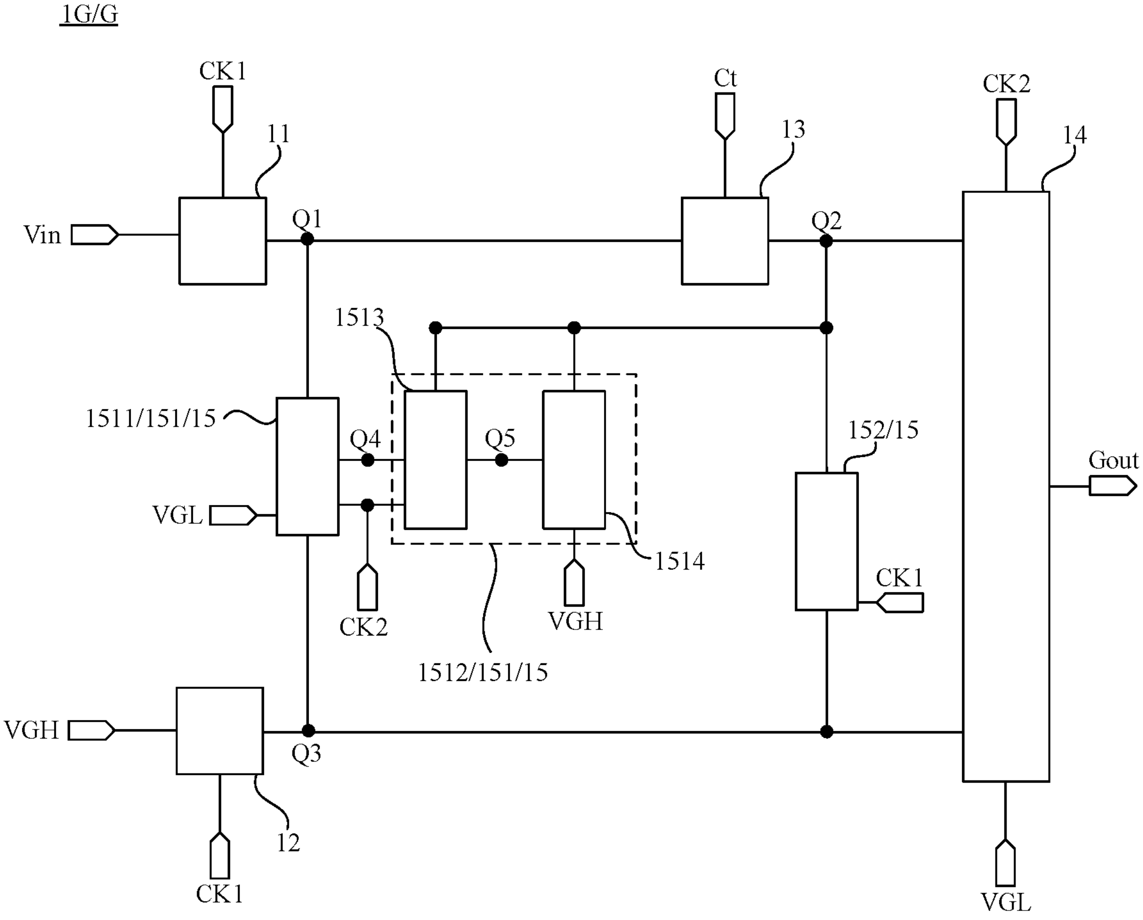
FIG. 25 is a schematic diagram of a circuit structure of another shift register according to an embodiment of the present disclosure.
Figure 26:
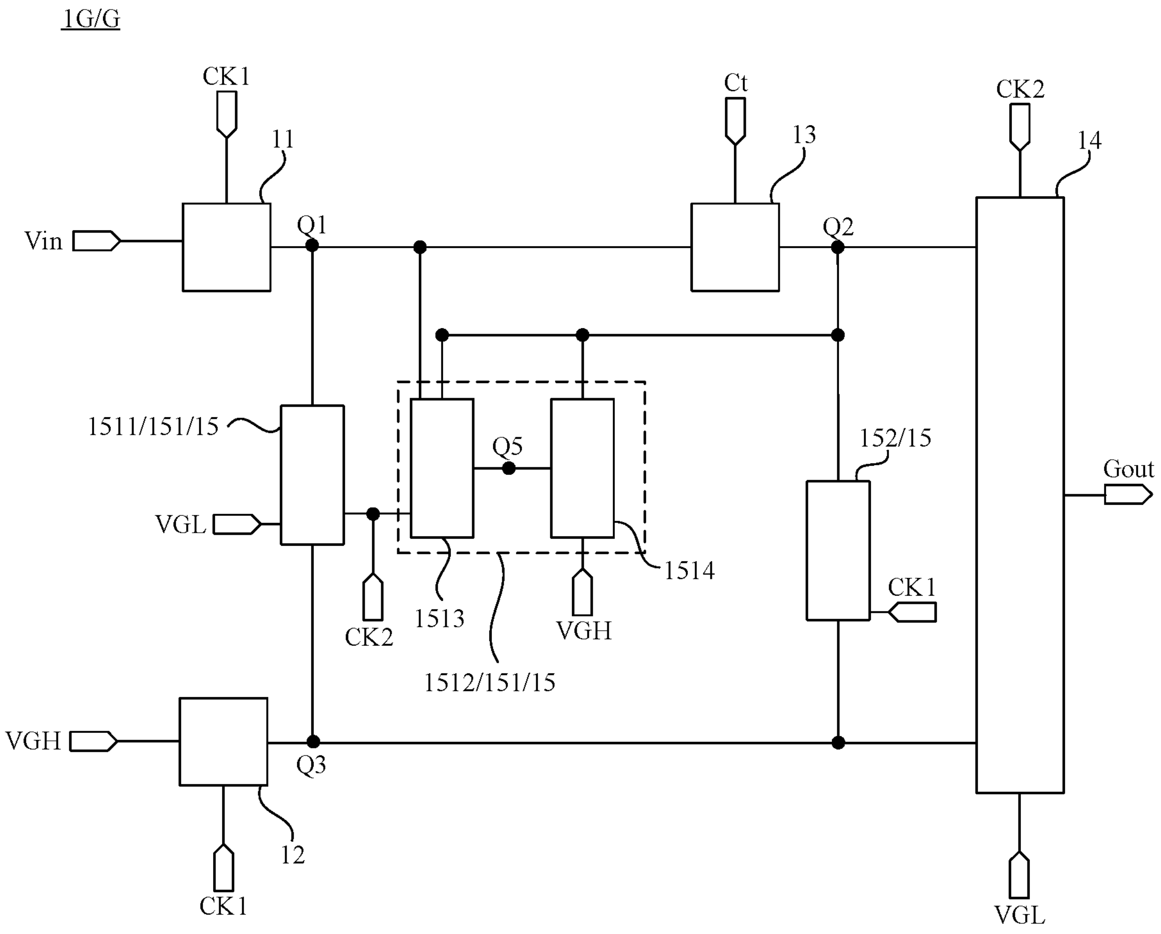
FIG. 26 is a schematic diagram of a circuit structure of a shift register according to an embodiment of the present disclosure.

Optionally, FIG. 25 is a schematic diagram of a circuit structure of another shift register according to an embodiment of the present disclosure, and FIG. 26 is a schematic diagram of a circuit structure of a shift register according to an embodiment of the present disclosure. With reference to FIGS. 25 and 26, the second reset unit 1512 includes a signal transmission sub-unit 1513 and a transmission control sub-unit 1514. In the same shift register G, the transmission control sub-unit 1514 is electrically connected to the second node Q2 and the first level terminal VGH, and the transmission control sub-unit 1514 is further electrically connected to the signal transmission sub-unit 1513 at a fifth node Q5; the signal transmission sub-unit 1513 is electrically connected to the second clock terminal CK2 and the second node Q2, and the signal transmission sub-unit 1513 is further electrically connected to the fourth node Q4 or the first node Q1.

For example, the transmission control sub-unit 1514 may control the signal of the fifth node Q5 according to the signal of the second node Q2 and the first level signal vgh of the first level terminal VGH. For example, when the signal of the second node Q2 is at an effective level, the transmission control sub-unit 1514 may transmit the first level signal vgh to the fifth node Q5.

The signal transmission sub-unit 1513 may control the signal of the second node Q2 according to the second clock signal ck2 of the second clock terminal CK2, the signal of the fifth node Q5 and the signal of the first node or the fourth node Q4 to reset the second node Q2. For example, the signal transmission sub-unit 1513 is electrically connected to the fourth node Q4, the second clock terminal CK2, the fifth node Q5 and the second node Q2, and when the second clock signal ck2 received by the second clock terminal CK2 is at an effective level and the signal of the fifth node Q5 is at an ineffective level, the signal transmission sub-unit 1513 may transmit the signal of the fourth node Q4 to the second node Q2 to reset the second node Q2.

Therefore, by setting the signal transmission sub-unit 1513 in preparation for transmitting the signal of the first node Q1 or the fourth node Q4 to the second node Q2, the signal control sub-unit 1514 controls the timing at which the signal transmission sub-unit 1513 transmits a reset signal to the second node Q2, and further, the reset timing of the second node Q2 may be adjusted according to actual requirements, thereby improving the practicality and flexibility of the second reset unit 1512.

It is to be noted that, on the premise that the signal transmission sub-unit 1513 and the signal control sub-unit 1514 may reset the second node Q2, the specific structures of the signal transmission sub-unit 1513 and the signal control sub-unit 1514 are not limited in the embodiments of the present disclosure. The specific structures of the signal transmission sub-unit 1513 and the signal control sub-unit 1514 are illustrated below using typical examples.

Figure 27:
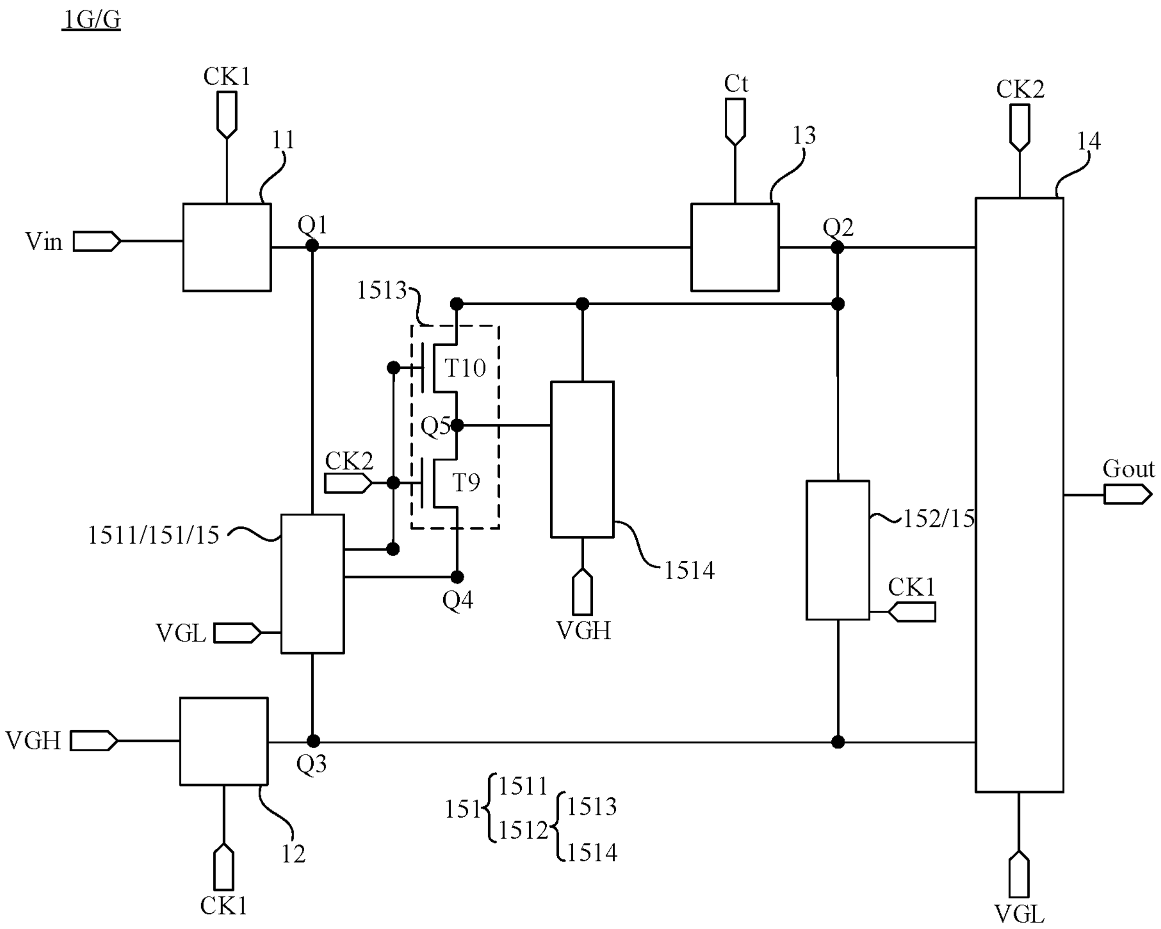
FIG. 27 is a schematic diagram of a circuit structure of another shift register according to an embodiment of the present disclosure.
Figure 28:
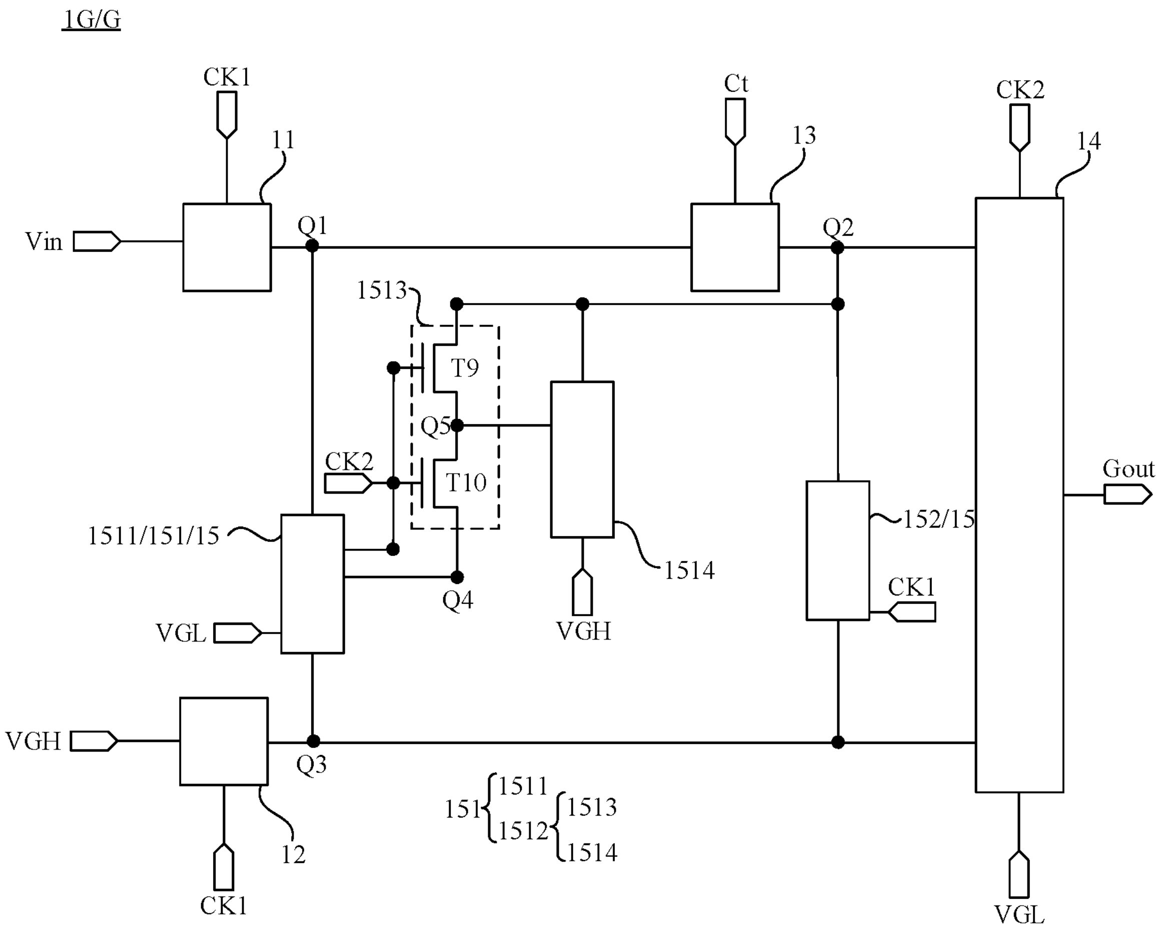
FIG. 28 is a schematic diagram of a circuit structure of another shift register according to an embodiment of the present disclosure.

Optionally, FIG. 27 is a schematic diagram of a circuit structure of another shift register according to an embodiment of the present disclosure, and FIG. 28 is a schematic diagram of a circuit structure of another shift register according to an embodiment of the present disclosure. With reference to FIGS. 27 and 28, the signal transmission sub-unit 1513 includes a third reset transistor T9 and a fourth reset transistor T10. In the same shift register G, the gate of the third reset transistor T9 and the gate of the fourth reset transistor T10 are electrically connected to the second clock terminal CK2, the first electrode of the third reset transistor T9 is electrically connected to the first node Q1 or the fourth node Q4, the second electrode of the third reset transistor T9 is electrically connected to the first electrode of the fourth reset transistor T10 at the fifth node Q5, and the second electrode of the fourth reset transistor T10 is electrically connected to the second node Q2.

For example, when the first electrode of the third reset transistor T9 is electrically connected to the fourth node Q4, the second clock signal supplied by the second clock terminal CK2 is at an effective level, and then the second clock signal may control the third reset transistor T9 and the fourth reset transistor T10 to be in an on state to transmit the reset signal at the fourth node Q4 to the second node Q2 and reset the second node Q2. When the first electrode of the third reset transistor T9 is electrically connected to the first node Q1, the second clock signal supplied by the second clock terminal CK2 is at an effective level, and then the second clock signal may control the third reset transistor T9 and the fourth reset transistor T10 to be in an on state to transmit the reset signal at the first node Q1 to the second node Q2 and reset the second node Q2.

Optionally, the voltage difference between the effective level of the second clock signal ck2 of the second clock terminal CK2 and the effective level of the first level signal ck1 of the first level terminal VGH is ΔV, and the threshold voltage of the fourth reset transistor T10 is Vth, where |ΔV|<Vth.

For example, when the signal of the second node Q2 is at an effective level, the effective level of the second node Q2 may control the transmission control sub-unit 1514 to transmit the first level signal of the first level terminal VGH to the fifth node Q5. By setting the absolute value |ΔV| of the voltage difference between the second clock signal ck2 and the first level signal ck1 to be less than the threshold voltage Vth of the fourth reset transistor T10, during the time period when the second node Q2 is at an effective level, even if the second clock signal ck2 is at an effective level, the conduction condition of the fourth reset transistor T10 cannot be satisfied, and the fourth reset transistor T10 is in an off state. In this manner, the fourth reset transistor T10 does not transmit the corresponding signal to the second node Q2, the second node Q2 is prevented from being reset when the signal of the second node Q2 is at an effective level, and thus, the gate drive signal output by the shift register G is prevented from being affected, thereby improving the accuracy of the gate drive signal output by the shift register G and improving the display performance of the display panel 100.

Figure 29:
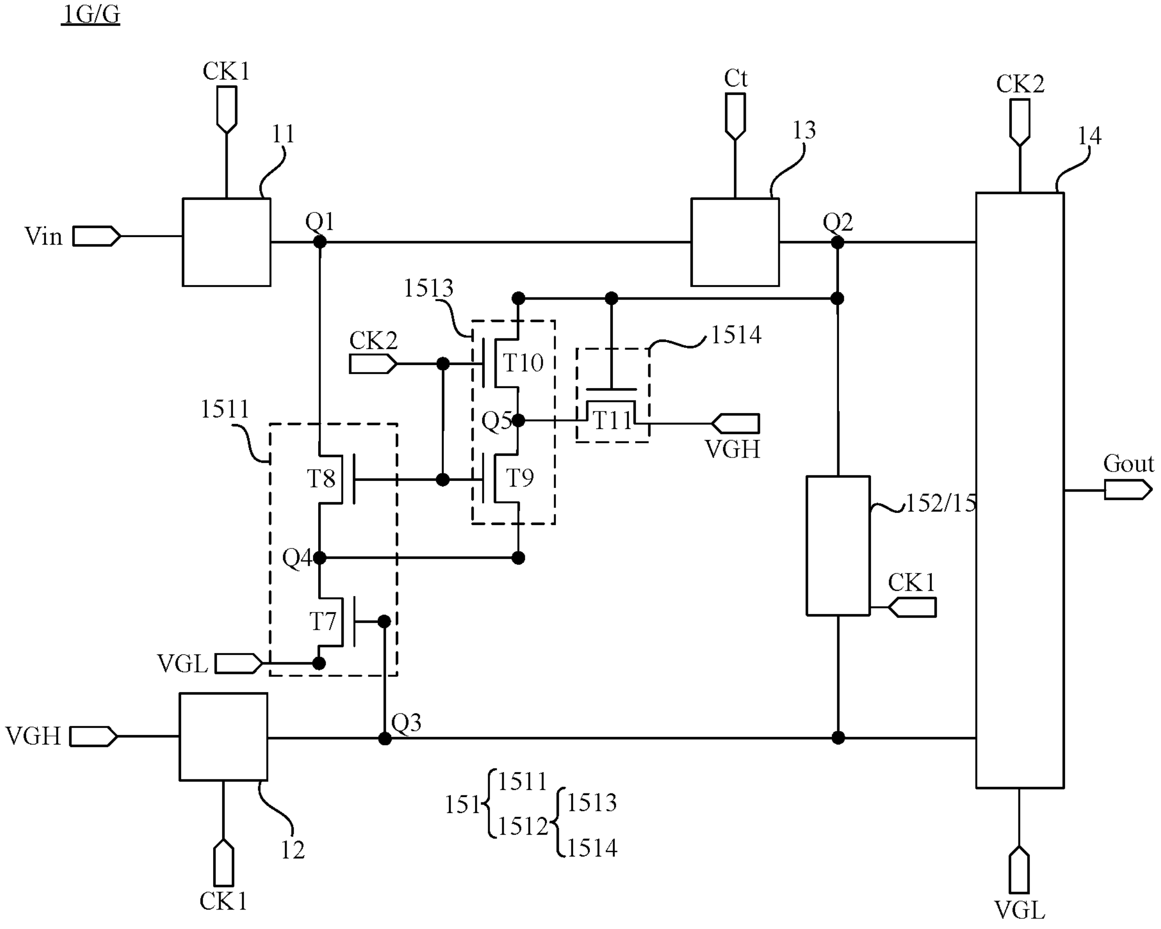
FIG. 29 is a schematic diagram of a circuit structure of another shift register according to an embodiment of the present disclosure.

Optionally, FIG. 29 is a schematic diagram of a circuit structure of another shift register according to an embodiment of the present disclosure. As shown in FIG. 29, the transmission control sub-unit 1514 includes a fifth reset transistor T11. In the same shift register G, the gate of the fifth reset transistor T11 is electrically connected to the second node Q2, the first electrode of the fifth reset transistor T11 is electrically connected to the first level terminal VGH, and the second electrode of the fifth reset transistor T11 is electrically connected to the fifth node Q5.

When the signal of the second node Q2 is at an effective level, the signal at the second node Q2 may control the fifth reset transistor T11 to be turned on, then the first level signal vgh of the first level terminal VGH is transmitted to the fifth node Q5, and the fourth reset transistor T10 is controlled to be turned off and fails to reset the second node Q2. When the signal at the second node Q2 is at an ineffective level, the ineffective level at the second node Q2 may control the fifth reset transistor T11 to be turned off so that the fifth reset transistor T11 cannot transmit the first level signal vgh of the first level terminal VGH to the fifth node Q5. The third reset transistor T9 and the fourth reset transistor T10 may be in an on or off state under the action of the second clock signal ck2 provided by the second clock terminal CK2. When the second clock signal ck2 is at an effective level, the third reset transistor T9 and the fourth reset transistor T10 can be controlled to be turned on, and then the reset signal at the fourth node Q4 or the first node Q1 can be transmitted to the second node Q2 to reset the signal at the second node Q2.

Figure 30:
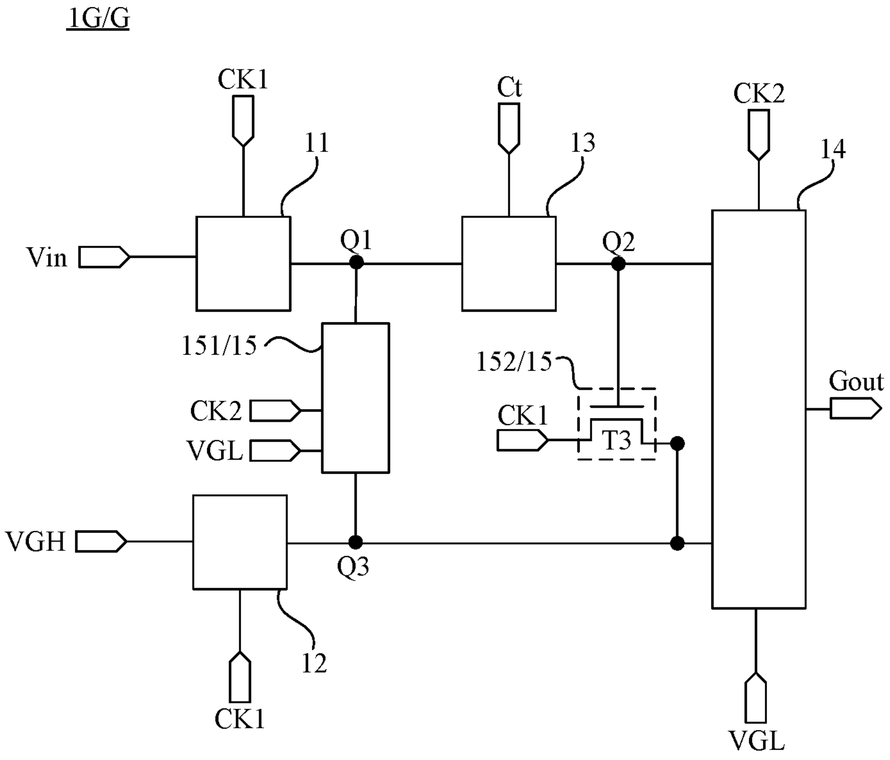
FIG. 30 is a schematic diagram of a circuit structure of a shift register according to an embodiment of the present disclosure.
Figure 31:
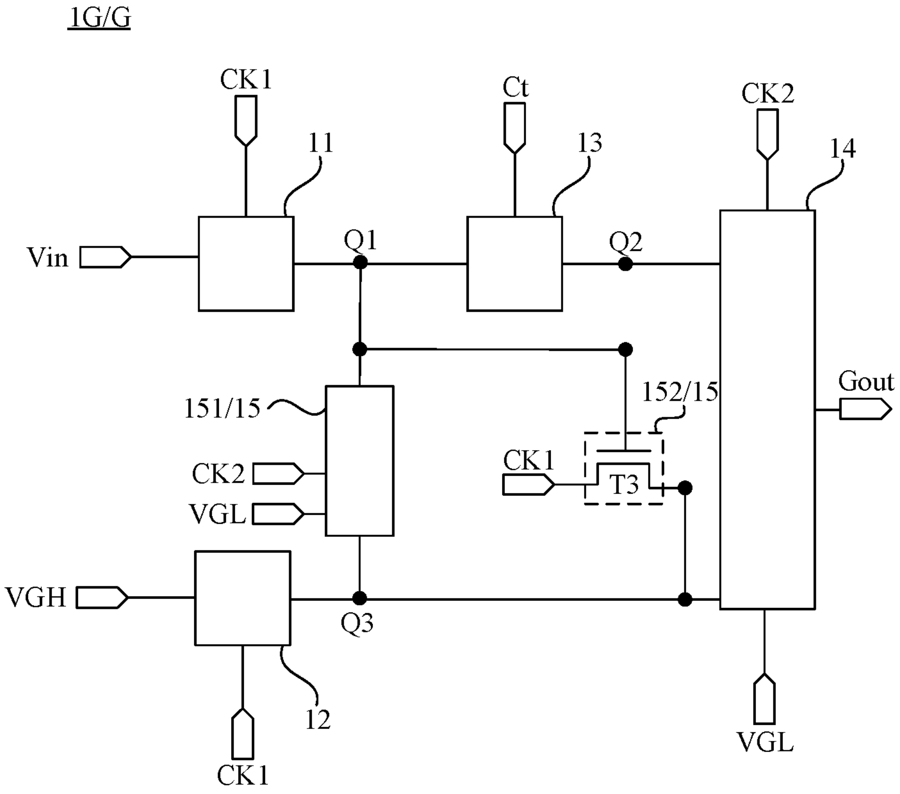
FIG. 31 is a schematic diagram of a circuit structure of another shift register according to an embodiment of the present disclosure.

Optionally, FIG. 30 is a schematic diagram of a circuit structure of a shift register according to an embodiment of the present disclosure, and FIG. 31 is a schematic diagram of a circuit structure of another shift register according to an embodiment of the present disclosure. With reference to FIGS. 30 and 31, the second reset sub-module 152 includes a sixth reset transistor T3. In the same shift register G, the gate of the sixth reset transistor T3 is electrically connected to the first node Q1 or the second node Q2, the first electrode of the sixth reset transistor T3 is electrically connected to the first clock terminal CK1, and the second electrode of the sixth reset transistor T3 is electrically connected to the third node Q3. Therefore, when the signal of the second node Q2 is at an effective level, the signal at the second node Q2 may control the sixth reset transistor T3 to be turned on, and then the first clock signal ck1 of the first clock terminal CK1 is transmitted to the third node Q3 to reset the signal of the third node Q3.

The structures of the isolation control module 13 and the reset module 15 in the shift register G are illustrated above only by way of example. On the basis of the above, the structures of the first control module 11, the second control module 12 and the output module 14 may be set according to actual requirements and are not specifically limited in the embodiments of the present disclosure. The specific structures of the first control module 11, the second control module 12 and the output module 14 in the embodiments of the present disclosure are illustrated using typical examples.

Figure 32:
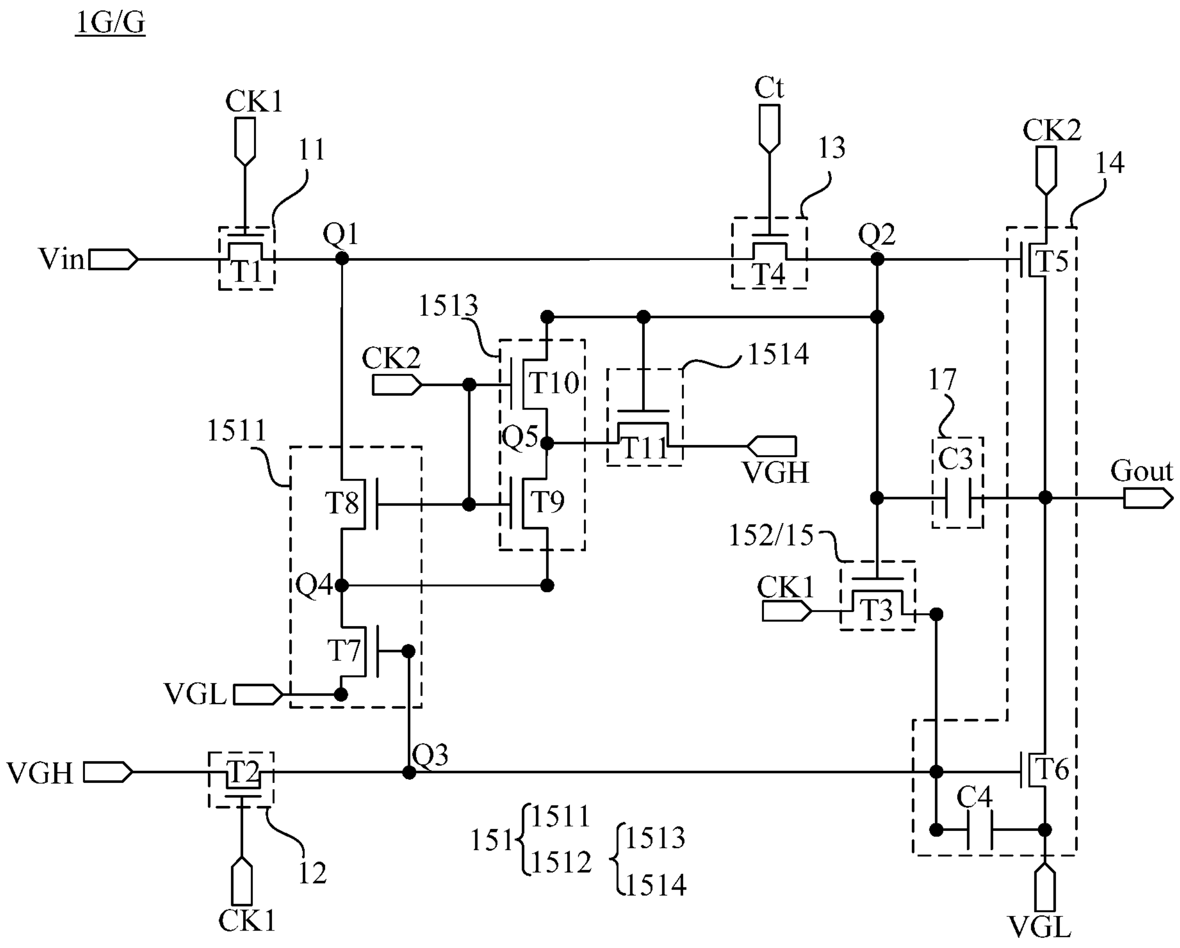
FIG. 32 is a schematic diagram of a circuit structure of another shift register according to an embodiment of the present disclosure.

In an optional embodiment, FIG. 32 is a schematic diagram of a circuit structure of another shift register according to an embodiment of the present disclosure. As shown in FIG. 32, the first control module 11 includes a first control transistor T1. In the same shift register G, the gate of the first control transistor T1 is electrically connected to the first clock terminal CK1, the first electrode of the first control transistor T1 is electrically connected to the signal input terminal Vin, and the second electrode of the first control transistor T1 is electrically connected to the first node Q1. Therefore, the first control transistor T1 may be turned on or off under the control of the first clock signal ck1 of the first clock terminal CK1. When the first clock signal ck1 controls the first control transistor T1 to be turned on, the signal input terminal Vin and the first node Q1 may be controlled to form a conduction path to transmit the signal of the signal input terminal Vin to the first node Q1 so that the signal of the first node Q1 is consistent with the signal of the signal input terminal Vin.

Optionally, with continued reference to FIG. 32, the second control module 12 includes a second control transistor T2. In the same shift register G, the gate of the second control transistor T2 is electrically connected to the first clock terminal CK1, the first electrode of the second control transistor T2 is electrically connected to the first level terminal VGH, and the second electrode of the second control transistor T2 is electrically connected to the third node Q3. Therefore, the second control transistor T2 may be turned on or off under the control of the first clock signal ck1 of the first clock terminal CK1. When the first clock signal ck1 controls the second control transistor T2 to be turned on, the first level terminal VGH and the third node Q3 may be controlled to form a conduction path to transmit the signal of the first level terminal VGH to the third node Q3 so that the signal of the third node Q3 is consistent with the signal of the first level terminal VGH.

Optionally, with continued reference to FIG. 32, the output module 14 includes a first output transistor T5 and a second output transistor T6. In the same shift register G, the gate of the first output transistor T5 is electrically connected to the second node Q2, the first electrode of the first output transistor T5 is electrically connected to the second clock terminal CK2, and the second electrode of the first output transistor T5 is electrically connected to the signal output terminal Gout; the gate of the second output transistor T6 is electrically connected to the third node Q3, the first electrode of the second output transistor T6 is electrically connected to the second level terminal VGL, and the second electrode of the second output transistor T6 is electrically connected to the signal output terminal Gout.

For example, the signal of the second node Q2 may control the first output transistor T5 to be turned on or off. When the signal of the second node Q2 is at an effective level, the first output transistor T5 may be controlled to be turned on to transmit the second clock signal ck2 of the second clock terminal CK2 to the signal output terminal Gout so that the gate drive signal output by the signal output terminal Gout is consistent with the second clock signal ck2. The signal of the third node Q3 may control the second output transistor T6 to be turned on or off. When the signal of the third node Q3 is at an effective level, the second output transistor T6 may be controlled to be turned on to transmit the second level signal vgl of the second level terminal VGL to the signal output terminal Gout so that the gate drive signal output by the signal output terminal Gout is consistent with the second level signal vgl. Therefore, by controlling the signals of the second node Q2 and the third node Q3, the turn-on durations of the first output transistor T5 and the second output transistor T6 may be controlled, thereby controlling the effective pulse duration of the gate drive signal output by the signal output terminal Gout.

Optionally, with continued reference to FIG. 32, the output module 14 may further include a holding capacitor C4. The holding capacitor C4 may be electrically connected between the third node Q3 and the second level terminal VGL to hold the potential of the third node Q3 so that the signal of the third node Q3 can accurately control the output module 14 to output the gate drive signal.

Optionally, with continued reference to FIG. 32, the shift register G further includes a bootstrap module 17. In the same shift register G, the bootstrap module 17 is electrically connected between the signal output terminal Gout and the second node Q2.

The bootstrap module 17 includes devices such as a bootstrap capacitor C3, which may be set according to actual requirements.

For example, when the gate drive signal of the signal output terminal Gout changes, the bootstrap module 17 may couple the change amount of the signal output terminal Gout to the gate of the first output transistor T5 to pull down or raise the voltage of the gate signal of the first output transistor T5. In this manner, the gate signal of the first output transistor T5 may have a higher driving capability and thus accurately transmit the second clock signal ck2 to the signal output terminal Gout, thereby enabling the signal output terminal Gout to accurately output the gate drive signal.

Figure 33:
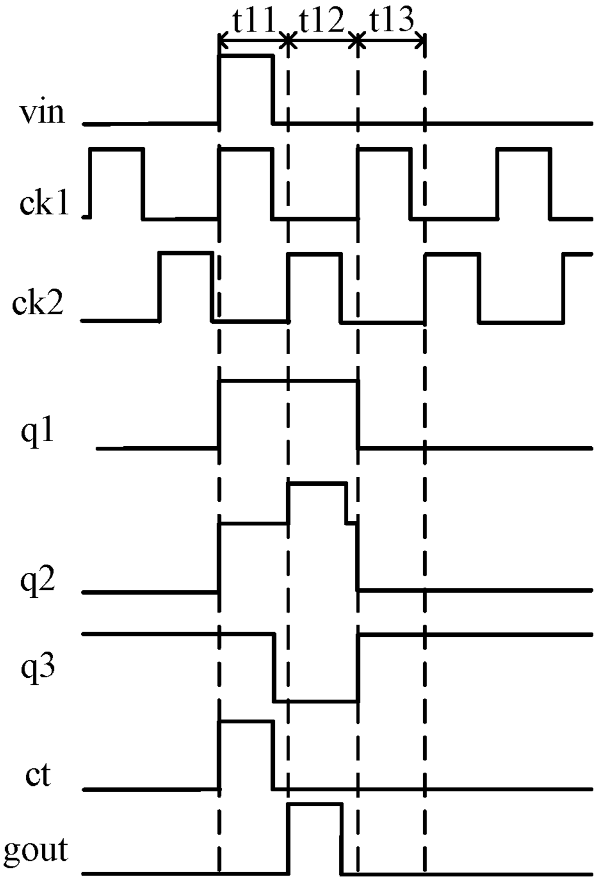
FIG. 33 is a drive timing diagram of the shift register of FIG. 32.

The working process of the first-type shift register 1G is illustrated below with reference to the structure of the shift register shown in FIG. 32. With reference to FIGS. 32 and 33, the drive cycle of the shift register G includes a stage t11, a stage t12 and a stage t13.

Before the stage t11, when the first clock signal ck1 of the first clock terminal CK1 is at an effective level, the second control transistor T2 is turned on so that the first level signal vgh of the first level terminal VGH is transmitted to the third node Q3, and the signal q3 of the third node Q3 is at an effective level to control the second output transistor T6 in the output module 14 to be turned on. The second output transistor T6 transmits the second level signal vgl of the second level terminal VGL to the signal output terminal Gout, and the gate drive signal gout output by the signal output terminal Gout is at an ineffective level. Meanwhile, the signal input terminal Vin of the shift register G receives the input signal vin which is at the ineffective level so that the signal q1 transmitted to the first node Q1 remains at an ineffective level even if the first clock signal ck1 of the first clock terminal CK1 is at an effective level and the first control transistor T1 is in an on state. In addition, since the third node Q3 is at an effective level, the first reset transistor T7 is in a conductive state, and the second level signal vgl of the second level terminal VGL is transmitted to the fourth node Q4 so that the signal of the fourth node Q4 is at an ineffective level. In this manner, when the second clock signal ck2 is at an effective level, the second reset transistor T8, the third reset transistor T9 and the fourth reset transistor T10 may all be in conductive states, and the signal of the fourth node Q4 may be transmitted to the first node Q1 and the second node Q2 so that the signals of the first node Q1 and the second node Q2 are at ineffective levels. Furthermore, since the isolation control signal ct of the isolation control terminal Ct is at an ineffective level in this stage, the isolation control transistor T4 is in an off state, and the second node Q2 is continuously maintained as a signal reset by the third reset transistor T9 and the fourth reset transistor T10, that is, the signal of the second node Q2 is at an ineffective level and the first output transistor T5 is turned off.

In the stage t11, the input signal vin received by the signal input terminal Vin of the shift register G jumps to an effective level, the first clock signal ck1 of the first clock terminal CK1 and the isolation control signal ct of the isolation control terminal Ct are both at effective levels, the second clock signal ck2 of the second clock terminal CK2 is at an ineffective level, and the first control transistor T1, the second control transistor T2 and the isolation transistor T4 are turned on. The effective level of the input signal vin may be transmitted to the first node Q1 through the first control transistor T1, the effective level of the first node Q1 may be transmitted to the second node Q2 through the isolation transistor T4, and the second node Q2 controls the first output transistor T5 to be turned on. The first level signal vgh of the first level terminal VGH may be transmitted to the third node Q3 through the second control transistor T2, and the signal q3 of the third node Q3 controls the second output transistor T6 to be turned on. At this point, since the second clock signal ck2 of the second clock terminal CK2 is at an ineffective level, the second clock signal ck2 transmitted from the first output transistor T5 to the signal input terminal Gout and the signal transmitted from the second output transistor T6 to the signal output terminal Gout are both at ineffective levels, and the gate drive signal gout output by the signal output terminal Gout is at an ineffective level.

In the stage t12, the input signal vin received by the signal input terminal Vin of the shift register G jumps to an ineffective level, the first clock signal ck1 of the first clock terminal CK1 and the isolation control signal ct of the isolation control terminal Ct are both at ineffective levels, the second clock signal ck2 of the second clock terminal CK2 is at an effective level, and the first control transistor T1, the second control transistor T2 and the isolation transistor T4 are turned off. At this point, if a leakage current is generated in the first control transistor T1, the signal q1 of the first node Q1 may be transmitted to the signal input terminal Vin. Since the isolation transistor T4 is in the off state, even if the signal q1 of the first node Q1 leaks, the signal q2 of the second node Q2 is not affected so that the signal q2 of the second node Q2 can be still maintained as at an effective level, thereby ensuring that the effective level of the second node Q2 accurately controls the first output transistor T5 to be turned on. The first output transistor T5 accurately transmits the effective level of the second clock signal ck2 to the signal output terminal Gout so that the gate drive signal gout output by the signal output terminal Gout is at an effective level. Furthermore, when the signal q2 of the second node Q2 is at an effective level, the effective level of the second node Q2 controls the sixth reset transistor T3 to be turned on, the sixth reset transistor T3 transmits the ineffective level of the first clock signal ck1 to the third node Q3, and the ineffective level of the third node Q3 controls the second output transistor T6 to be turned off.

In the stage t13, the input signal vin received by the signal input terminal Vin of the shift register G is continuously maintained at an ineffective level, the second clock signal ck2 of the second clock terminal CK2 and the isolation control signal ct of the isolation control terminal Ct are both at ineffective levels, the first clock signal ck1 of the first clock terminal CK1 is at an effective level, and the first control transistor T1 and the second control transistor T2 are turned on. The second control transistor T2 transmits the first level signal vgh of the first level terminal VGH to the third node Q3, and the effective level of the third node Q3 controls the first reset transistor T7 to be turned on. The first reset transistor T7 transmits the second clock signal vgl of the second clock terminal VGL to the fourth node Q4, and the effective level of the second clock signal vgl controls the second reset transistor T8 to be turned on. The second reset transistor T8 transmits the ineffective level of the fourth node Q4 to the first node Q1 to reset the first node Q1. The effective level of the second clock signal ck2 controls the third reset transistor T9 and the fourth reset transistor T10 to be turned on, and the third reset transistor T9 and the fourth reset transistor T10 transmit the ineffective level of the fourth node Q4 to the second node Q2 to reset the signal q2 of the second node Q2. The ineffective level of the second node Q2 controls the first output transistor T5 to be turned off, and the effective level of the third node Q3 controls the second output transistor T6 to be turned on. The second output transistor T6 transmits the second level signal vgl of the second level terminal VGL to the signal output terminal Gout, and the gate drive signal gout output by the signal output terminal Gout is at an ineffective level.

After the stage t13, the input signal vin of the signal input terminal Vin is continuously maintained at an ineffective level, and the signal q1 transmitted to the first node Q1 is continuously maintained at an ineffective level even if the first clock signal ck1 is at an effective level. Meanwhile, when the first clock signal ck1 is at an effective level, the second control transistor T2 is in an on state, the first level signal vgh is then transmitted to the third node Q3, and the signal q3 of the third node Q3 is at an effective level. The third node Q3 is continuously maintained at an effective level under the premise that no other signal is written. In addition, the effective level of the third node Q3 controls the first reset transistor T7 to be in an on state, the second level signal vgl may be transmitted to the fourth node Q4, and the fourth node Q 4 is at an ineffective level. In this manner, when the second clock signal ck2 of the second clock terminal CK2 is at an effective level, the second reset transistor T8, the third reset transistor T9 and the fourth reset transistor T10 are turned on again to reset the first node Q1 and the second node Q2 so that the signal q1 of the first node Q1 and the signal q2 of the second node Q2 can be maintained at ineffective levels. Therefore, after the stage t13, the second output transistor T6 is continuously in an on state, the first output transistor T5 is continuously in an off state, the second output transistor T6 transmits the second level signal vgl of the second level terminal VGL to the signal output terminal Gout, and the gate drive signal gout output by the signal output terminal Gout is maintained at an ineffective level.

It is to be understood that the working process of the first-type shift register 1G is illustrated above only by way of example; in the embodiments of the present disclosure, the working process of the first-type shift register 1G may be adjusted by adjusting the effective level durations of the signals received by the first-type shift register 1G, and the specific implementation mode may be designed according to actual requirements and is not specifically limited in the embodiments of the present disclosure.

It is to be understood that, with reference to FIG. 6, the isolation control signal ct received by the isolation control terminal Ct may be supplied by a corresponding isolation signal transmission line; at this point, the first-type shift register 1G in each stage may be connected to an isolation signal transmission line to accurately control the turn-on duration of the isolation control module 13 in the first-type shift register 1G in each stage, or each isolation signal transmission line may be electrically connected to multiple stages of first-type shift registers 1G, which is not specifically limited in the embodiments of the present disclosure on the premise that the requirements of the turn-on or turn-off duration of the isolation control module 13 in the shift register G in each stage are met.

Figure 34:
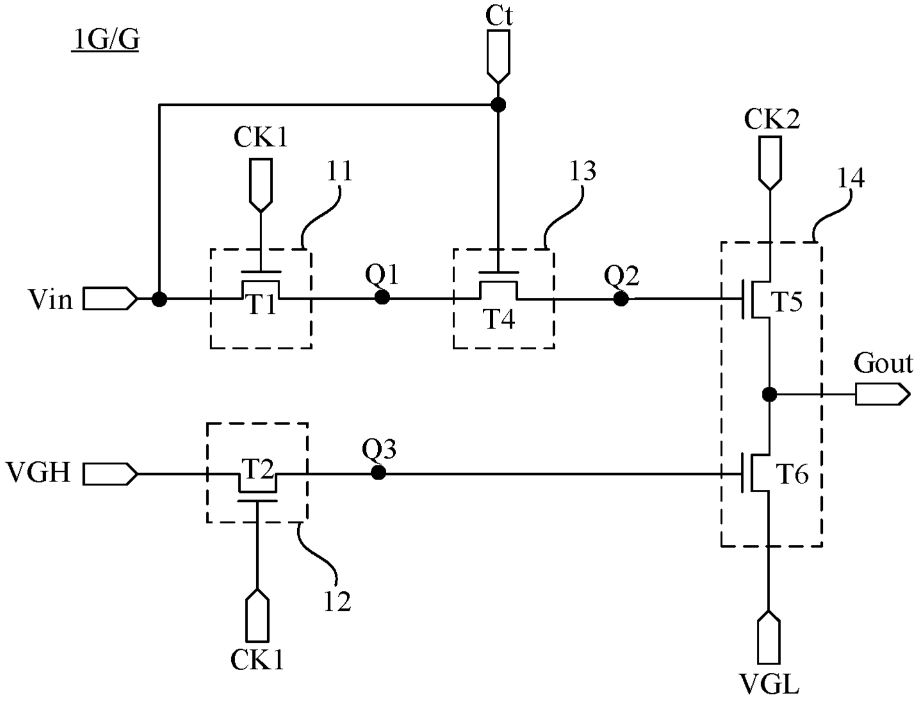
FIG. 34 is a schematic diagram of a circuit structure of another shift register according to an embodiment of the present disclosure.

In an optional embodiment, FIG. 34 is a schematic diagram of a circuit structure of another shift register according to an embodiment of the present disclosure. As shown in FIG. 34, in the same shift register G, the isolation control terminal Ct is electrically connected to the signal input terminal Vin.

For example, when the input signal of the signal input terminal Vin is at an effective level, the isolation control signal of the isolation control terminal Ct is also at an effective level, and the isolation control terminal Ct may control the isolation control module 13 to be in an on state. In this manner, after the input signal of the signal input terminal Vin reaches the first node Q1 through the first control module 11, the input signal may continue to reach the second node Q2 through the isolation control module 13, thereby enabling the signal transmission between the first node Q1 and the second node Q2 during at least part of the duration when the input signal of the signal input terminal Vin is at an effective level. When the input signal of the signal input terminal Vin is at an ineffective level, the isolation control signal of the isolation control terminal Ct is also at an ineffective level, and the isolation control terminal Ct may control the isolation control module 13 to be in an off state. The signal transmission path between the first node Q1 and the second node Q2 is then disconnected, and the effective level at the second node Q2 is prevented from leaking to the first node Q1 or the signal input terminal Vin, thereby avoiding the generation of a leakage current. In this manner, after the input signal of the signal input terminal Vin jumps from an effective level to an ineffective level, the connection path between the first node Q1 and the second node Q2 may be disconnected, thereby improving the accuracy of the signals at the second node Q2 and the signal input terminal Vin and improving the working stability of the shift register G. Meanwhile, by electrically connecting the isolation control terminal Ct to the signal input terminal Vin, the isolation control terminal Ct is electrically connected to the signal line supplying the input signal, and the need to dedicatedly set the signal line for the isolation control terminal Ct is eliminated, thereby simplifying the structure of the driver circuit 10 and reducing the overall size of the driver circuit 10. When the display panel 100 further includes a non-display region NA at least partially surrounding the display region AA, if the driver circuit 10 is provided in the non-display region NA, the driver circuit 10 with a smaller size occupies less space in the non-display region NA, thereby reducing the size of the non-display region NA and facilitating the narrow-bezel design of the display panel 100.

Figure 35:
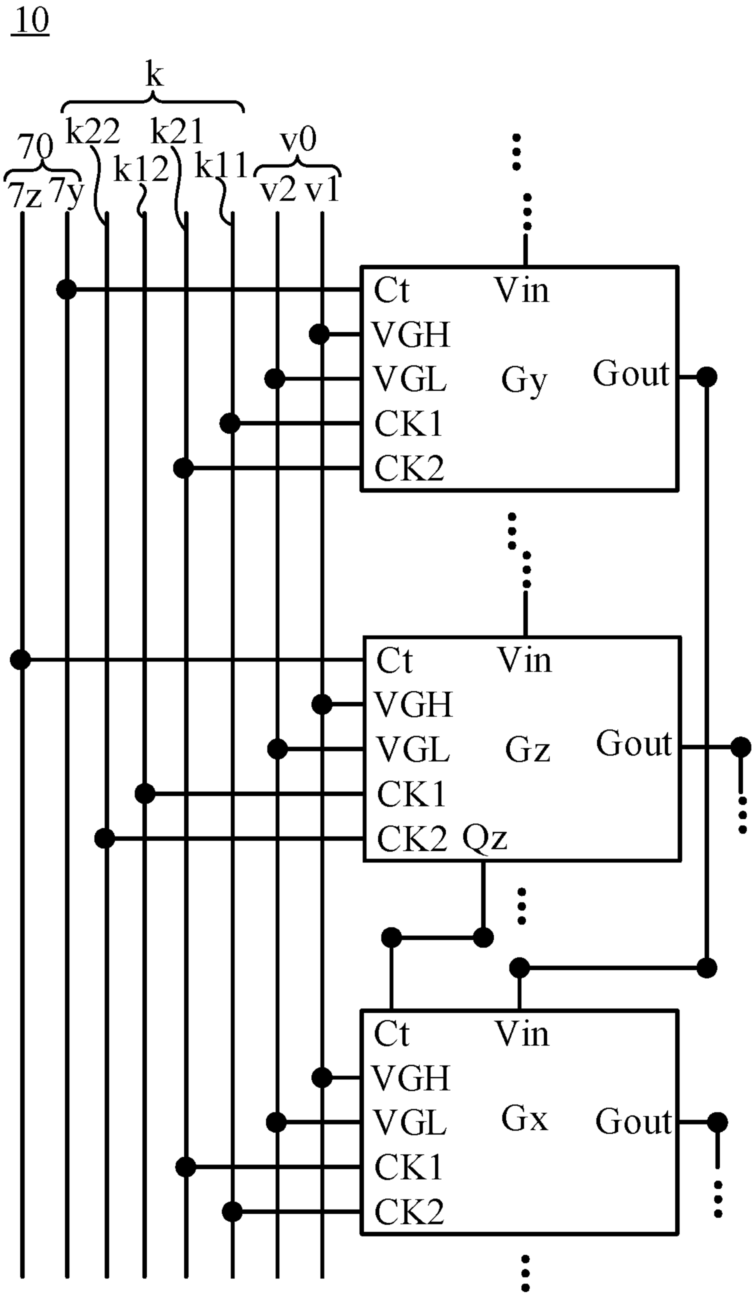
FIG. 35 is a structure diagram of a driver circuit according to an embodiment of the present disclosure.

In another optional embodiment, FIG. 35 is a structure diagram of a driver circuit according to an embodiment of the present disclosure. As shown in FIG. 35, the isolation control terminal Ct(x) of the $x^{th}$-stage shift register Gx is electrically connected to the first node Q1(*z*) or the second node Q2(*z*) of the $z^{th}$-stage shift register Gz, where z is a positive integer and x+z. The effective level duration of the signal of the first node Q1(*z*) or the second node Q2(*z*) of the $z^{th}$-stage shift register Gz is a first duration t01, the effective level duration of the gate drive signal output by the signal output terminal Gout (y) of the $y^{th}$-stage shift register Gy is a second duration t02, and the first duration t01 overlaps with the second duration t02.

It is to be noted that Qz in FIG. 35 represents the first node Q1(*z*) or the second node Q2(*z*) of the $z^{th}$-stage shift register Gz, which may be set according to actual requirements. The driver circuit 10 further includes signal lines, including, as shown in FIG. 35, clock signal lines k supplying clock signals ck, isolation control signal lines 70 supplying isolation control signals ct and fixed level signal lines v0 supplying fixed level signals. The clock signal lines k include a first clock signal line k11, a second clock signal line k21, a third clock signal line k12 and a fourth clock signal line k22, the isolation control signal lines 70 include an $y^{th}$-stage isolation control signal line 7*y* and a $z^{th}$-stage isolation control signal line 7*z*, and the fixed level signal lines v0 may include a first level signal line v1 supplying the first level signal vgh and a second level signal line v2 supplying the second level signal vgl.

On the basis that x≠z, the numerical values of x and z may be set according to actual requirements. In an optional embodiment, x=z+3, x=z+2, x=z+1, or so on, which is not specifically limited here.

For example, since the signal input terminal Vin(x) of the $x^{th}$-stage shift register Gx is electrically connected to the signal output terminal Gout (y) of the $y^{th}$-stage shift register Gy, the input signal vin(x) of the signal input terminal Vin(x) of the $x^{th}$-stage shift register Gx is synchronized with the gate drive signal gout (y) of the $y^{th}$-stage shift register Gy. By setting the effective level duration t01 of the signal of the first node Q1(*z*) or the second node Q2(*z*) of the $z^{th}$-stage shift register Gz to overlap with the effective level duration t02 of the gate drive signal output by the signal output terminal Gout (y) of the $y^{th}$-stage shift register Gy, when the input signal of the signal input terminal Vin(x) of the $x^{th}$-stage shift register Gx is at an effective level, the signal of the first node Q1(*z*) or the second node Q2(*z*) of the $z^{th}$-stage shift register Gz is also at an effective level, and the first node Q1(*z*) or the second node Q2(*z*) may control the isolation control module 13 of the $x^{th}$-stage shift register Gx to be in an on state. The transmission path between the first node Q1(*x*) or the second node Q2(*x*) is then turned on, and the input signal of the signal input terminal Vin(x) may be transmitted to the second node Q2(*x*) through the first node Q1(*x*) so that the shift register Gx may output an accurate gate drive signal, thereby improving the display performance of the display panel 100.

It is to be noted that, on the premise that x≠y and x≠ z, the specific numerical values of x, y and z may be set according to actual requirements. In an optional embodiment, x=y+n, y≥n, and y−n+1≤z≤y+n−1, where n is a positive integer. For example, when x=4 and y=2, n=2, and 1≤z≤3, where z may be 1, 2 or 3.

The effective level duration of the gate drive signal gout(x) of the $x^{th}$-stage shift register Gx is located after the effective level duration of the gate drive signal gout (y) of the $y^{th}$-stage shift register Gy, and the effective level duration of the gate drive signal gout (z) of the $z^{th}$-stage shift register Gz is located between the effective level duration of the gate drive signal gout(x) and the effective level duration of the gate drive signal gout (y). The start moment of the effective level of the input signal vin (z) of the $z^{th}$-stage shift register Gz may be located before or after the start moment of the effective level of the gate drive signal gout (y) of the $y^{th}$-stage shift register Gy, that is, the start moment of the effective level of the signal of the first node Q1(*z*) or the second node Q2(*z*) of the $z^{th}$-stage shift register Gz is located before or after the start moment of the effective level of the gate drive signal gout (y) of the $y^{th}$-stage shift register Gy. Before the end moment of the effective level of the gate drive signal gout (z) of the $z^{th}$-stage shift register Gz, the signal of the first node Q1(*z*) or the second node Q2(*z*) of the $z^{th}$-stage shift register Gz is continuously maintained at an effective level. As can be known, the effective level duration t01 of the signal of the first node Q1(*z*) or the second node Q2(*z*) of the $z^{th}$-stage shift register Gz may overlap with the effective level duration of the gate drive signal gout (y) of the $y^{th}$-stage shift register Gy, that is, the effective level duration t01 of the signal of the first node Q1(*z*) or the second node Q2(*z*) of the $z^{th}$-stage shift register Gz may overlap with the effective level duration of the input signal vin(x) of the $x^{th}$-stage shift register Gx. Therefore, by setting x=y+n, y≥n, and y−n+1<z<y+n−1, during the duration when the input signal vin(x) of the $x^{th}$-stage shift register Gx is at an effective level, the first node Q1(*z*) or the second node Q2(*z*) of the $z^{th}$-stage shift register Gz may control the isolation control module 13 of the $x^{th}$-stage shift register Gx to be in an on state, the transmission path between the first node Q1(*x*) or the second node Q2(*x*) is then turned on, and the input signal vin(x) of the signal input terminal Vin(x) may be transmitted to the second node Q2(*x*) through the first node Q1(*x*) so that the $x^{th}$-stage shift register Gx can output an accurate gate drive signal, thereby improving the display performance of the display panel 100.

Figure 36:
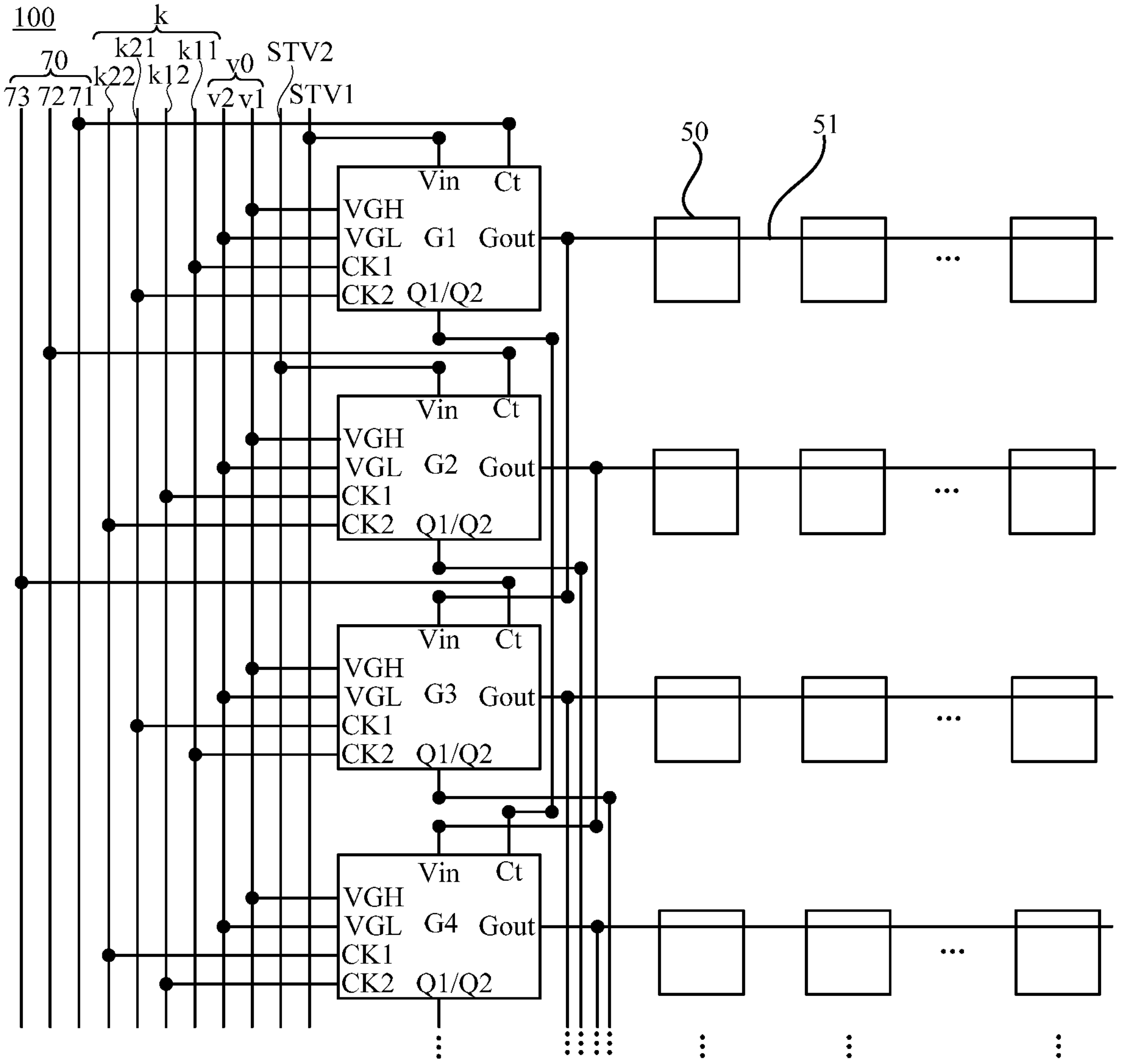
FIG. 36 is a structure diagram of another display panel according to an embodiment of the present disclosure.
Figure 37:
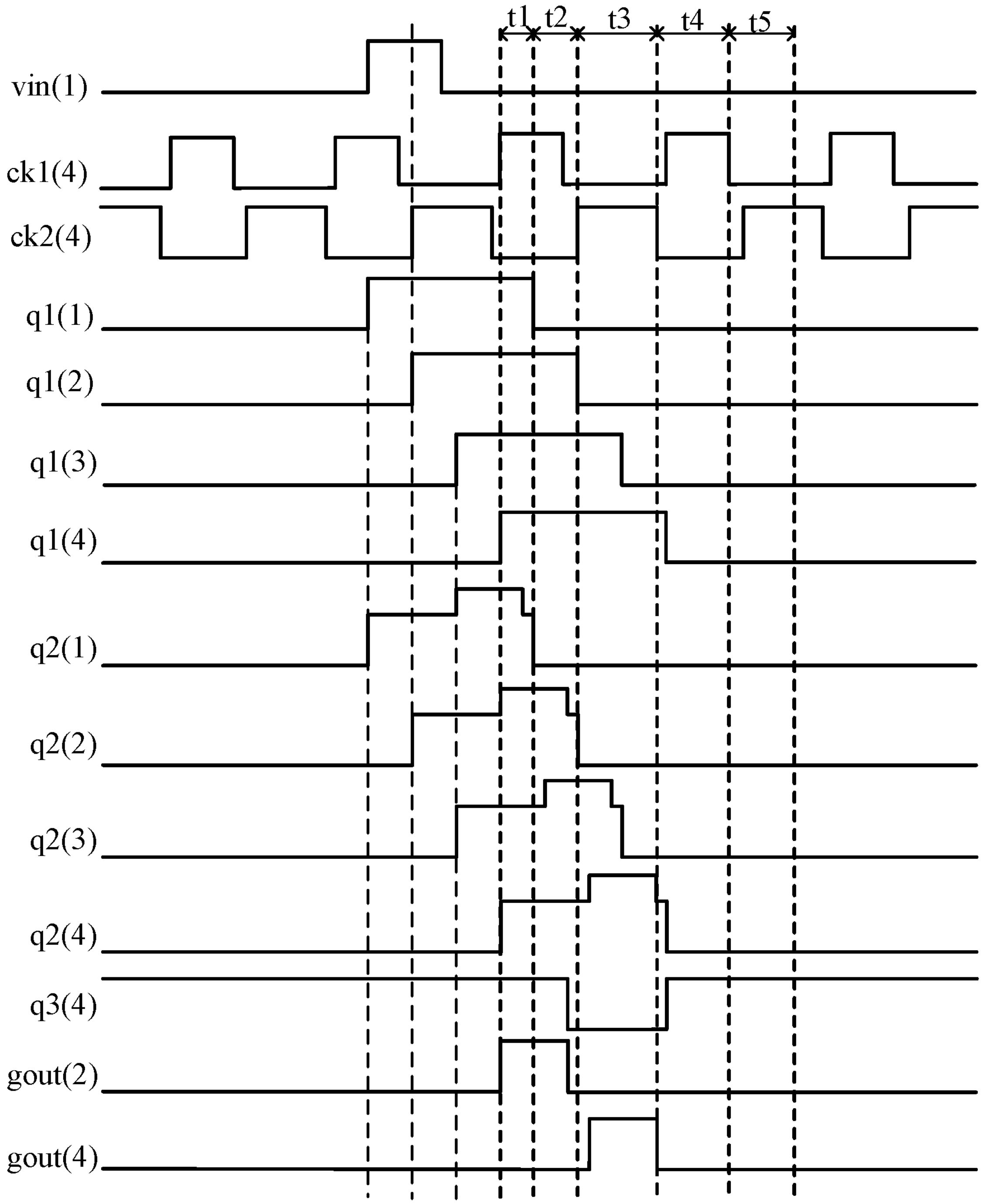
FIG. 37 is a drive timing diagram of the shift register of FIG. 36.

For example, x=4, y=2, and z=1. FIG. 36 is a structure diagram of another display panel according to an embodiment of the present disclosure, and FIG. 37 is a drive timing diagram of the shift register of FIG. 36. With reference to FIGS. 36 and 37, the drive cycle of the fourth-stage shift register G4 includes a stage t1, a stage t2, a stage t3 and a stage t4.

In the stage t1, in the fourth-stage shift register G4, the signal input terminal vin(4) receives the gate drive signal gout(2) at an effective level from the signal output terminal gout(2) of the second-stage shift register G2, that is, the input signal vin(4) is at an effective level, the first clock signal ck1(4) of the first clock terminal CK1 is at an effective level, the first control transistor T1, the second control transistor T2 and the sixth reset transistor T3 are turned on, the effective level of the input signal vin(4) may be transmitted to the first node Q1(4) through the first control transistor T1, the first level signal vgh of the first level terminal VGH may be transmitted to the third node Q3(4) through the second control transistor T2, and the third node Q3(4) controls the second output transistor T6 to be turned on. The isolation control terminal Ct(4) of the fourth-stage shift register G4 receives the signal q1(1) at an effective level from the first node Q1(1) of the first-stage shift register G1 or the signal q2(1) at an effective level from the second node Q2(1) of the first-stage shift register G1, the isolation transistor T4 is turned on, the signal q1(4) at an effective level of the first node Q1(4) may be transmitted to the second node Q2(4) of the fourth-stage shift register G4 through the isolation transistor T4, the signal q1(4) of the first node Q1(4) is then consistent with the signal q2(4) of the second node Q2(4), and the signal q2(4) of the second node Q2(4) may control the first output transistor T5 to be turned on. The second clock signal ck2(4) of the second clock terminal CK2 is at an ineffective level, the first output transistor T5 transmits the second clock signal ck2(4) at an ineffective level to the signal output terminal gout(4), the second output transistor T6 also transmits the second level signal vgl of the second level terminal VGL to the signal output terminal Gout(4), and the gate drive signal gout(4) output by the signal output terminal Gout(4) is at an ineffective level.

In the stage t2, the signal output terminal Gout(2) of the second-stage shift register G2 jumps from an effective level to an ineffective level. In the fourth-stage shift register G4, the first clock signal ck1(4) of the first clock terminal CK1 jumps to an ineffective level, the first control transistor T1 is turned off, and the sixth reset transistor T3 transmits the ineffective level of the first clock signal ck1(4) to the third node Q3(4). The signal q1(1) of the first node Q1(1) or the signal q2(1) of the second node Q2(1) in the first-stage shift register G1 is at an ineffective level, and the ineffective level of the isolation control terminal Ct(4) of the fourth-stage shift register G4 controls the isolation transistor T4 of the fourth-stage shift register G4 to be turned off to block the transmission path from the second node Q2(4) to the first node Q1(4) in the fourth-stage shift register G4. In this manner, even if there is a leakage current leaking from the first node Q1(1) to the signal input terminal Vin(4), a leakage current leaking from the second node Q2(4) to the signal input terminal Vin(4) is eliminated due to the turned-off isolation transistor T4 of the fourth-stage shift register G4, thereby ensuring the signal stability of the second node Q2(4). Meanwhile, in the fourth-stage shift register G4, the fifth reset transistor T11 is turned on under the control of the stable effective level of the second node Q2(4), the first level signal vgh of the first level terminal VGH is transmitted to the fifth node Q5(4), the third reset transistor T9 is turned off, the second node Q2(4) is still maintained at an effective level, the second clock signal ck2(4) of the second clock terminal CK2 is still at an ineffective level, and then the gate drive signal gout(4) output by the signal output terminal Gout(4) is at an ineffective level.

In the stage t3, in the fourth-stage shift register G4, the second clock signal ck2(4) of the second clock terminal CK2 is at an effective level, the second node Q2(4) transmits the effective level of the second clock signal ck2(4) to the signal output terminal Gout(4), and the gate drive signal gout(4) output by the signal output terminal Gout(4) is at an effective level.

In the stage t4, in the fourth-stage shift register G4, the second clock signal ck2(4) of the second clock terminal CK2 jumps to an ineffective level, the second node Q2(4) transmits the ineffective level of the second clock signal ck2(4) to the signal output terminal Gout(4), and the gate drive signal gout(4) output by the signal output terminal Gout(4) is at an ineffective level.

In the stage t5, the signal output terminal Gout(2) of the second-stage shift register G2 is at an ineffective level. In the fourth-stage shift register G4, the first clock signal ck1(4) of the first clock terminal CK1 is at an ineffective level, and the first control transistor T1 and the second control transistor T2 are turned off. The second clock signal ck2(4) of the second clock terminal CK2 is at an effective level, the first reset transistor T7, the second reset transistor T8, the third reset transistor T9 and the fourth reset transistor T10 are turned on, the second level signal vgl of the second level terminal VGL may be transmitted to the first node Q1(4) through the first reset transistor T7 and the second reset transistor T8, and the second level signal vgl of the second level terminal VGL may be transmitted to the second node Q2(4) through the third reset transistor T9 and the fourth reset transistor T10 to reset the first node Q1(4) and the second node Q2(4). At this point, the gate drive signal gout(4) output by the signal output terminal Gout(4) of the fourth-stage shift register G4 is at an ineffective level.

Therefore, by setting $x=y+n$, $y\geq n$, and $y-n+1\leq z\leq y+n-1$, where n is a positive integer, when the signal input terminal Gout(x) of the $x^{th}$-stage shift register Gx detects that the signal output terminal Gout (y) of the $y^{th}$-stage shift register Gy is at an effective level, the isolation control terminal Ct(x) of the $x^{th}$-stage shift register Gx may control the isolation control module 13 to be turned on under the action of the effective levels supplied by the first node Q1(*z*) and the second node Q2(*z*) of the $z^{th}$-stage shift register Gz, and the effective level of the signal input terminal Gout(x) may then be transmitted to the second node Q2(*x*), so that the $x^{th}$-stage shift register Gx can output an accurate gate drive signal, thereby improving the display performance of the display panel 100. When the signal input terminal Gout(x) of the $x^{th}$-stage shift register Gx detects that the signal output terminal Gout (y) of the $y^{th}$-stage shift register Gy is at an ineffective level, the isolation control terminal Ct(x) of the $x^{th}$-stage shift register Gx may control the isolation control module 13 to be turned off under the action of the effective levels supplied by the first node Q1(*z*) and the second node Q2(*z*) of the $z^{th}$-stage shift register Gz to prevent the effective level of the second node Q2(*x*) from being transmitted to the signal input terminal Vin(4) through the isolation control module 13 and the first control module 11 and avoid the generation of a leakage current, thereby improving the accuracy of the signal of the second node Q2(*x*) and improving the display performance of the display panel 100. Furthermore, the isolation control terminal Ct is electrically connected to the first node Q1(*z*) or the second node Q2(*z*) of the $z^{th}$-stage shift register Gz, and the need to dedicatedly set the signal line for the isolation control terminal Ct is eliminated, thereby simplifying the structure of the driver circuit 10 and reducing the overall size of the driver circuit 10. When the display panel 100 further includes a non-display region NA at least partially surrounding the display region AA, if the driver circuit 10 is provided in the non-display region NA, the driver circuit 10 with a smaller size occupies less space in the non-display region NA, thereby reducing the size of the non-display region NA and facilitating the narrow-bezel design of the display panel 100.

In addition, the first (n+1) stages of shift registers G in this embodiment may be second-type shift registers 2G, and the isolation control terminal Ct of each second-type shift register 2G receives the signal transmitted from the signal line. For example, the isolation control terminal Ct of the second-type shift register 2G may receive the first level signal vgh to ensure that the isolation transistors in the first (n+1) stages of shift registers G are continuously in on states.

It is to be noted that the isolation control signals ct received by various stages of shift registers G are illustrated above only by way of example. On the premise that the core inventive points in the embodiments of the present disclosure are achieved, the isolation control signals ct received by the isolation control terminals Ct are not specifically limited in the embodiments of the present disclosure.

Figure 38:
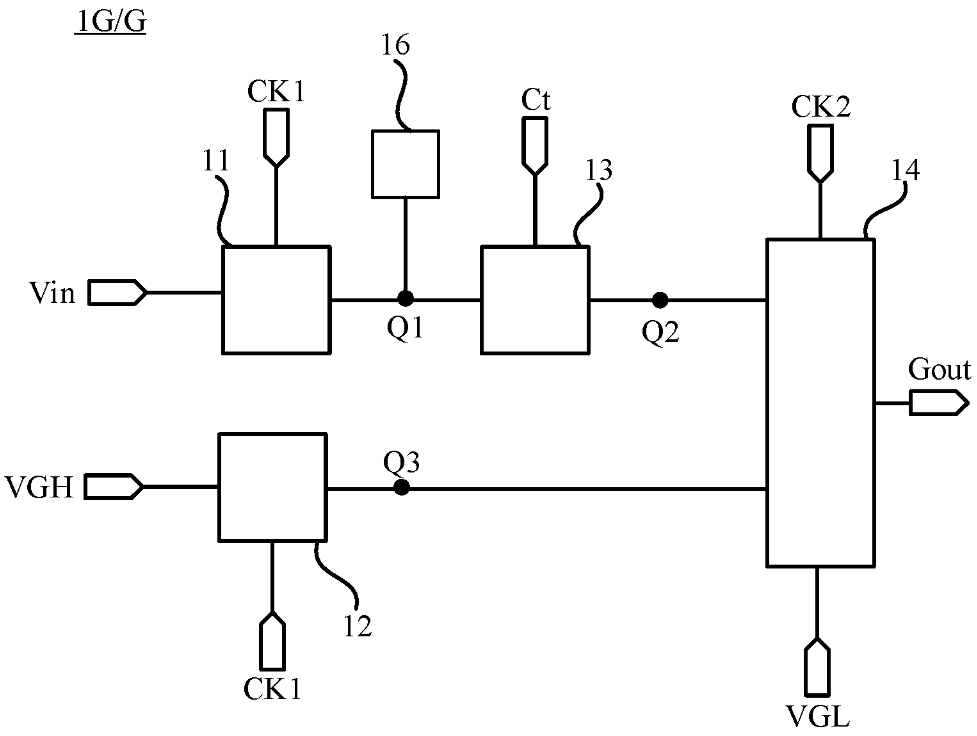
FIG. 38 is a schematic diagram of a circuit structure of another shift register according to an embodiment of the present disclosure.
Figure 39:
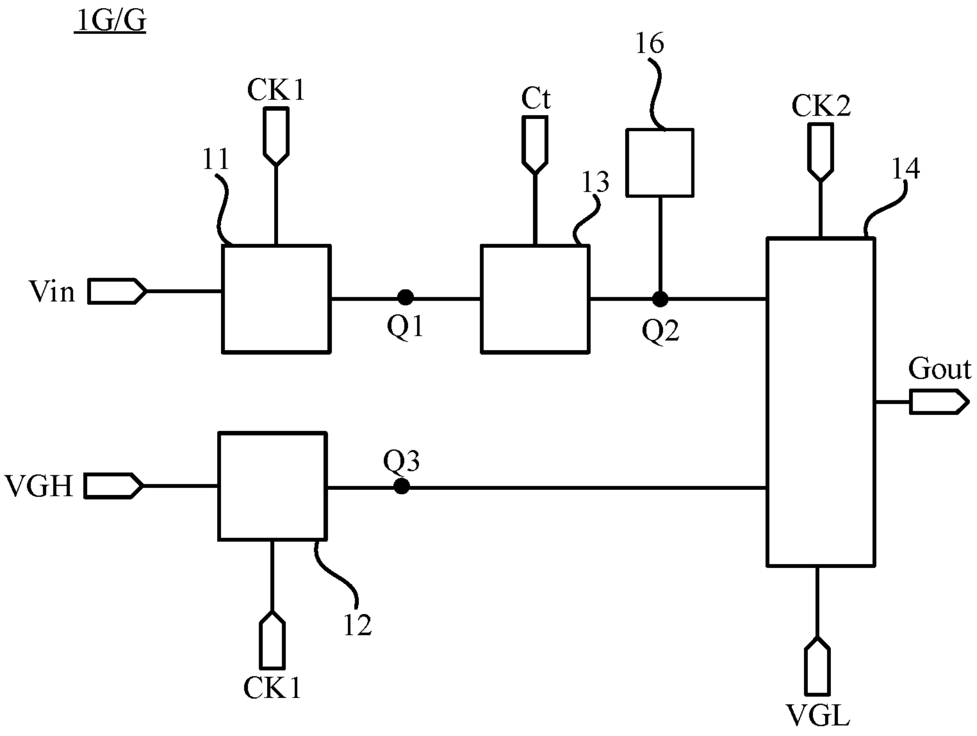
FIG. 39 is a schematic diagram of a circuit structure of another shift register according to an embodiment of the present disclosure.
Figure 40:
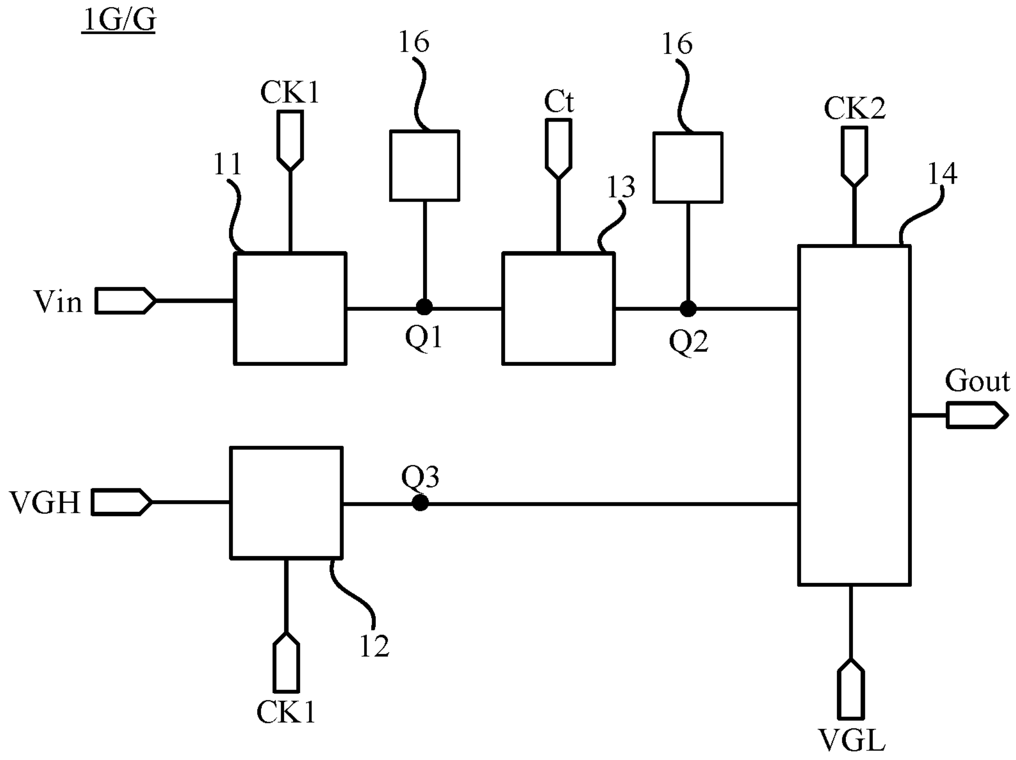
FIG. 40 is a schematic diagram of a circuit structure of another shift register according to an embodiment of the present disclosure.

On the basis of the preceding embodiments, optionally, FIG. 38 is a schematic diagram of a circuit structure of another shift register according to an embodiment of the present disclosure, FIG. 39 is a schematic diagram of a circuit structure of another shift register according to an embodiment of the present disclosure, and FIG. 40 is a schematic diagram of a circuit structure of another shift register according to an embodiment of the present disclosure. With reference to FIGS. 38 to 40, the shift register G further includes a voltage regulation module 16. In the same shift register G, the voltage regulation module 16 is electrically connected to the first node Q1 and/or the second node Q2.

The voltage regulation module 16 includes devices such as transistors, which may be set according to actual requirements and is not specifically limited here.

For example, by setting the voltage regulation module 16 electrically connected to the first node Q1 and/or the second node Q2, the electrical signals at the first node Q1 and/or the second node Q2 are stabilized, the fluctuation of the electrical signals at the first node Q1 and/or the second node Q2 is reduced, thereby improving the stability of the electrical signals at the first node Q1 and/or the second node Q2.

Figure 41:
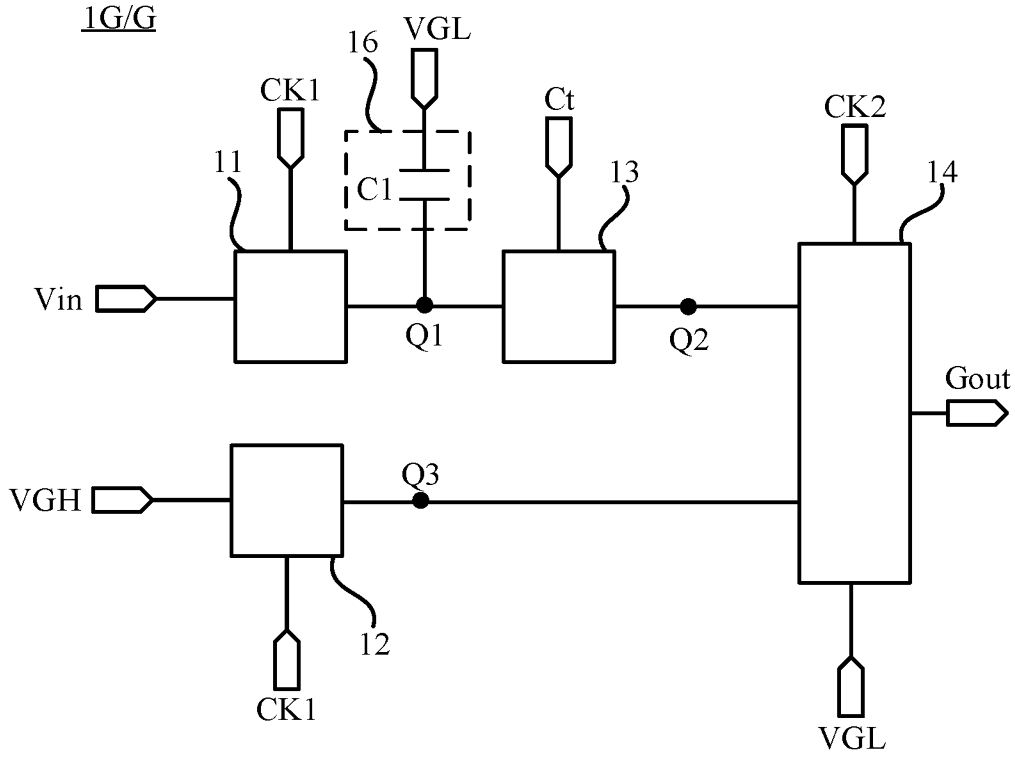
FIG. 41 is a schematic diagram of a circuit structure of a shift register according to an embodiment of the present disclosure.
Figure 42:
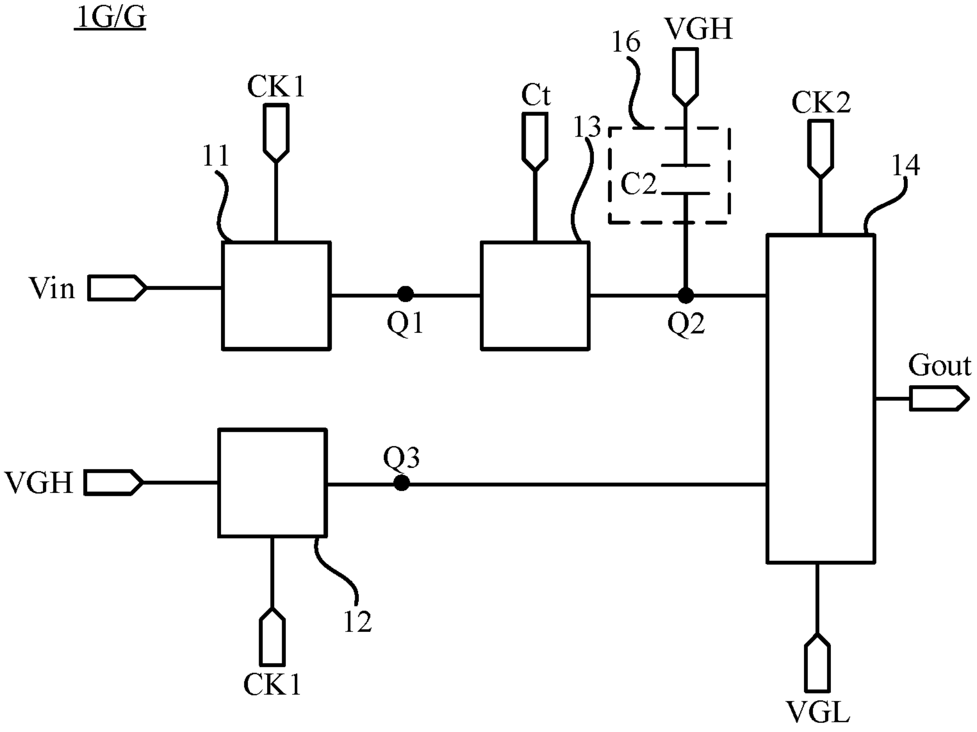
FIG. 42 is a schematic diagram of a circuit structure of another shift register according to an embodiment of the present disclosure.
Figure 43:
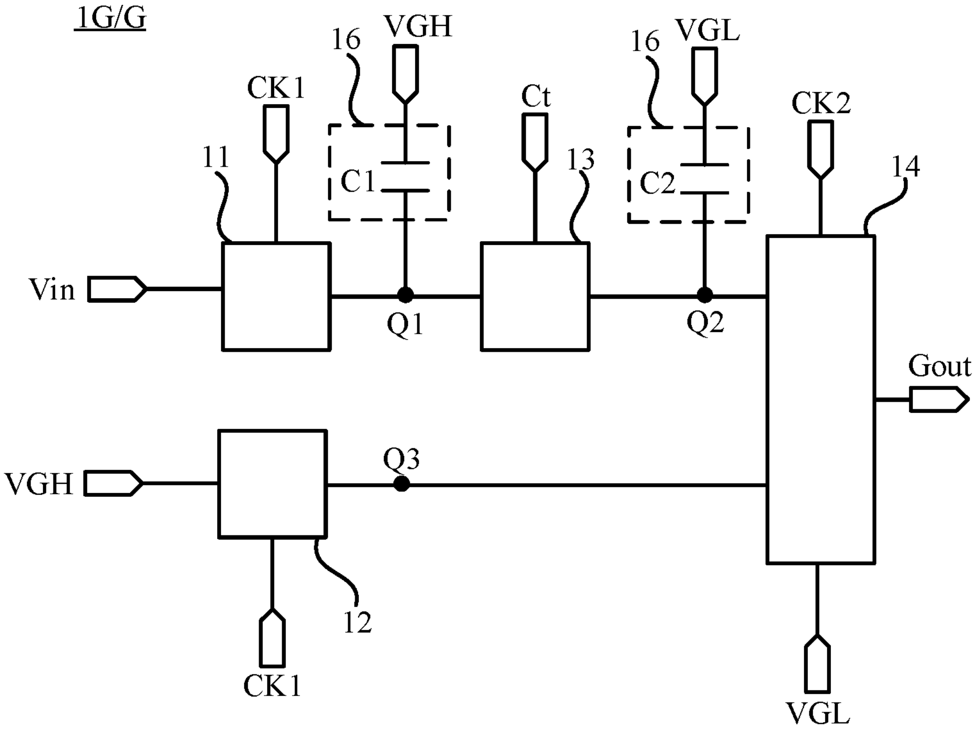
FIG. 43 is a schematic diagram of a circuit structure of another shift register according to an embodiment of the present disclosure.

In an optional embodiment, FIG. 41 is a schematic diagram of a circuit structure of a shift register according to an embodiment of the present disclosure, FIG. 42 is a schematic diagram of a circuit structure of another shift register according to an embodiment of the present disclosure, and FIG. 43 is a schematic diagram of a circuit structure of another shift register according to an embodiment of the present disclosure. With reference to FIGS. 41 to 43, the voltage regulation module 16 includes a first voltage regulation capacitor C1 and/or a second voltage regulation capacitor C2. In the same shift register G, the first plate of the first voltage regulation capacitor C1 is electrically connected to the first node Q1, and the second plate of the first voltage regulation capacitor C1 is electrically connected to the first level terminal VGH or the second level terminal VGL; the first plate of the second voltage regulation capacitor C2 is electrically connected to the second node Q2, and the second plate of the second voltage regulation capacitor C2 is electrically connected to the first level terminal VGH or the second level terminal VGL.

For example, the second plate of the first voltage regulation capacitor C1 receives the first level signal of the first level terminal VGH or the second level signal of the second level terminal VGL, and the first plate of the first voltage regulation capacitor C1 is electrically connected to the first node Q1 so that the first voltage regulation capacitor C1 can store the signal of the first node Q1 to ensure the stability of the signal of the first node Q1. The second plate of the second voltage regulation capacitor C2 receives the first level signal of the first level terminal VGH or the second level signal of the second level terminal VGL, and the first plate of the second voltage regulation capacitor C2 is electrically connected to the second node Q2 so that the second voltage regulation capacitor C2 can store the signal of the second node Q2 to ensure the stability of the signal of the second node Q2.

On the basis of the preceding embodiments, optionally, with reference to FIG. 5, the display panel 100 further includes multiple clock signal lines k. The first clock terminal CK1 of the $x^{th}$-stage shift register Gx and the second clock terminal CK2 of the $y^{th}$-stage shift register Gy are electrically connected to the same clock signal line k12; and/or the second clock terminal CK2 of the $x^{th}$-stage shift register Gx and the first clock terminal CK1 of the $y^{th}$-stage shift register Gy are electrically connected to the same clock signal line k22. The clock signal lines k are used for supplying clock signals.

For example, by setting the first clock terminal CK1 of the $x^{th}$-stage shift register Gx and the second clock terminal CK2 of the $y^{th}$-stage shift register Gy to be electrically connected to the same clock signal line k12, the cascaded $x^{th}$-stage shift register Gx and $y^{th}$-stage shift register Gy receive opposite clock signals, and thus, the effective pulses of the gate drive signal supplied by the $x^{th}$-stage shift register Gx and the gate drive signal supplied by the $y^{th}$-stage shift register Gy are enabled to be sequentially shifted. Furthermore, by setting the first clock terminal CK1 of the $x^{th}$-stage shift register Gx and the second clock terminal CK2 of the $y^{th}$-stage shift register Gy to be electrically connected to the same clock signal line k12 and the second clock terminal CK2 of the $x^{th}$-stage shift register Gx and the first clock terminal CK1 of the $y^{th}$-stage shift register Gy to be electrically connected to the same clock signal line k22, part of the shift registers G share the same clock signal line k, thereby reducing the number of clock signal lines k to be set and improving the utilization rate of the wiring harness in the display panel 100.

It is to be noted that the number of clock signal lines k may be set according to actual requirements. As shown in FIG. 5, the clock signal lines k include a first clock signal sub-line kl and a second clock signal sub-line k2, and the number of the clock signal lines k to be set may be other values. The display panel 100 includes other signal lines in addition to the clock signal lines k. Optionally, the signal lines further include a start signal line STV supplying the start control signal stv. The start signal line STV is electrically connected to the signal input terminal Vin of the first-stage shift register G1. The signal lines further include isolation control signal lines 70 supplying isolation control signals ct, for example, including a first isolation control signal line 71, a second isolation control signal line 72, a $y^{th}$-stage isolation control signal line 7*y*, an $x^{th}$-stage isolation control signal line 7*x*, . . . , an $(N-1)^{th}$-stage isolation control signal line 7N−1, and an Nth-stage isolation control signal line 7N. Each isolation control signal line 70 may be electrically connected to the isolation control terminal Ct of a respective one of the shift registers G. For example, the $y^{th}$-stage isolation control signal line 7*y* is electrically connected to the isolation control terminal Ct of the $y^{th}$-stage shift register Gy. The display panel 100 further includes level signal lines v0 supplying fixed level signals, for example, including a first level signal line v1 supplying the first level signal vgh and a second level signal line v2 supplying the second level signal vgl. The first level signal line v1 may be electrically connected to the first level terminals VGH of various stages of shift registers G, and the second level signal line v2 may be electrically connected to the second level terminals VGL of various stages of shift registers G.

As shown in FIG. 5, the clock signal lines k include the first clock signal sub-line kl and the second clock signal sub-line k2, and the number of the clock signal lines k to be set may be other values. As shown in FIG. 6, the clock signal lines k include a first clock signal line k11, a second clock signal line k21, a third clock signal line k12 and a fourth clock signal line k22; the start signal lines STV include a first start signal line STV1 and a second start signal line STV2. The first start signal line STV1 is electrically connected to the signal input terminal Vin of the first-stage shift register G1, and the second start signal line STV2 is electrically connected to the signal input terminal Vin of the second-stage shift register G2.

Figure 44:
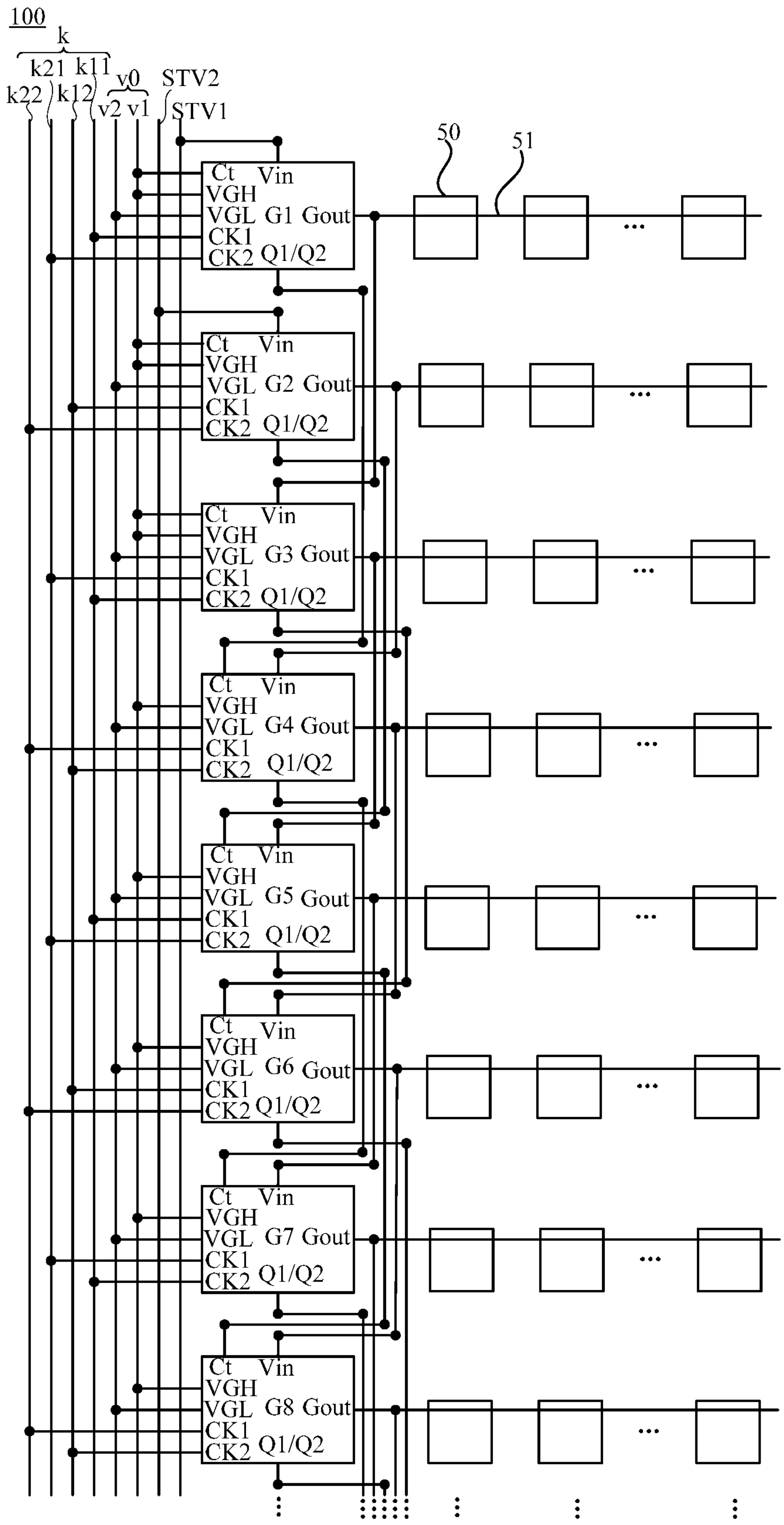
FIG. 44 is a structure diagram of another display panel according to an embodiment of the present disclosure.

Optionally, FIG. 44 is a structure diagram of another display panel according to an embodiment of the present disclosure. As shown in FIG. 44, the display panel 100 further includes multiple clock signal lines k. When x=y+n, the first clock terminal CK1 of the $i^{th}$-stage shift register Gi and the first clock terminal CK1 of the $(i+2n)^{th}$-stage shift register Gi+2n are electrically connected to the same clock signal line k; and/or the second clock terminal CK2 of the $i^{th}$-stage shift register Gi and the second clock terminal CK2 of the $(i+2n)^{th}$-stage shift register Gi+2n are electrically connected to the same clock signal line k; where i and n are both positive integers.

For example, by setting the first clock terminal CK1 of the $i^{th}$-stage shift register Gi and the first clock terminal CK1 of the $(i+2n)^{th}$-stage shift register Gi+2 to be electrically connected to the same clock signal line k, part of the shift registers G share the same clock signal line k, thereby reducing the number of clock signal lines k to be set for supplying first clock signals and improving the utilization rate of the wiring harness in the display panel 100. Correspondingly, by setting the second clock terminal CK2 of the $i^{th}$-stage shift register Gi and the second clock terminal CK2 of the $(i+2n)^{th}$-stage shift register Gi+2n to be electrically connected to the same clock signal line k, part of the shift registers G share the same clock signal line k, thereby reducing the number of clock signal lines k to be set for supplying second clock signals and improving the utilization rate of the wiring harness in the display panel 100.

Based on the same inventive concept, embodiments of the present disclosure further provide a display device. The display device includes the display panel provided by any embodiment of the present disclosure. Therefore, the display device has the technical features of the display panel provided by the embodiments of the present disclosure and thus can achieve the beneficial effects of the display panel provided by the embodiments of the present disclosure. For similarities, reference may be made to the above description of the display panel provided by the embodiments of the present disclosure, and the details are not repeated here.

Figure 45:
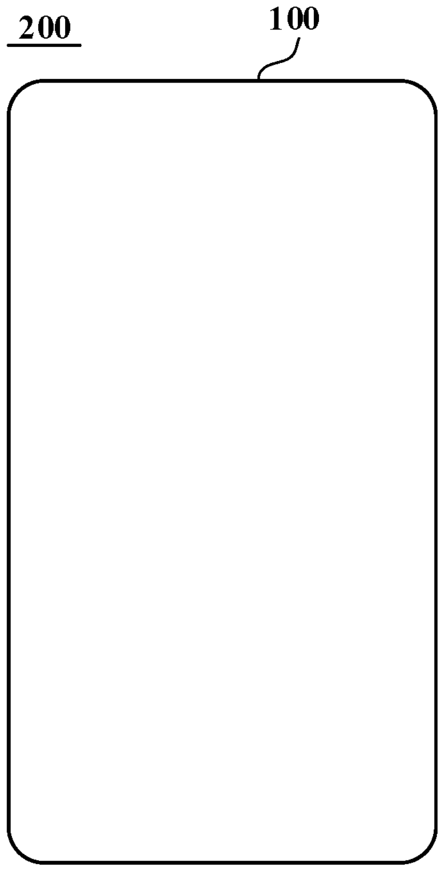
FIG. 45 is a structure diagram of a display device according to an embodiment of the present disclosure.

For example, FIG. 45 is a structure diagram of a display device according to an embodiment of the present disclosure. As shown in FIG. 45, the display device 200 includes the display panel 100 provided by the embodiments of the present disclosure. The display device 200 provided by the embodiments of the present disclosure may be any electronic product having a display function. The electronic product includes, but is not limited to, a mobile phone, a television, a laptop, a desktop display, a tablet, a digital camera, a smart bracelet, smart glasses, an in-vehicle display, a medical device, an industrial control device or an interactive touch terminal, which is not specially limited in the embodiments of the present disclosure.

It is to be noted that the preceding are preferred embodiments of the present disclosure and technical principles used therein. It is to be understood by those skilled in the art that the present disclosure is not limited to the embodiments described herein. Those skilled in the art can make various apparent modifications, adaptations, and substitutions without departing from the scope of the present disclosure. Therefore, although the present disclosure has been described in detail through the preceding embodiments, the present disclosure is not limited to the preceding embodiments and may include other equivalent embodiments without departing from the concept of the present disclosure. The scope of the present disclosure is determined by the scope of the appended claims.

What is claimed is:

1. A display panel, comprising a driver circuit; wherein the driver circuit comprises a plurality of stages of shift registers;

a shift register among the plurality of stages of shift registers comprises a first control module, a second control module, an isolation control module, an output module, a signal input terminal, a first clock terminal, a second clock terminal, a first level terminal, a second level terminal, an isolation control terminal and a signal output terminal; the first control module is electrically connected to the signal input terminal, the first clock terminal and a first node; the isolation control module is electrically connected to the isolation control terminal, the first node and a second node; the second control module is electrically connected to the first clock terminal, the first level terminal and a third node; the output module is electrically connected to the second node, the third node, the second clock terminal, the second level terminal and the signal output terminal;

the signal input terminal of an $x^{th}$-stage shift register is electrically connected to the signal output terminal of a $y^{th}$-stage shift register, wherein x and y are both positive integers, and x≠y;

at least part of shift registers among the plurality of stages of shift registers are first-type shift registers;

in a same first-type shift register among the first-type shift registers, during at least part of a duration when an input signal of the signal input terminal is at an effective level, an isolation control signal of the isolation control terminal controls the isolation control module to turn on a signal transmission path between the first node and the second node; at least after the input signal jumps from an effective level to an ineffective level, the isolation control signal controls the isolation control module to disconnect the signal transmission path between the first node and the second node;

wherein the shift register further comprises a reset module, the reset module comprises a first reset sub-module, the first reset sub-module comprises a first reset unit and a second reset unit, in a same shift register among the plurality of stages of shift registers, the first reset unit is electrically connected to the second clock terminal, the second level terminal, the third node and the first node;

the second reset unit is electrically connected to the second clock terminal, the first level terminal and the second node; and the second reset unit is further electrically connected to the first reset unit at a fourth node, or the second reset unit is further electrically connected to the first node.

2. The display panel according to claim 1, wherein in the same shift register among the plurality of stages of shift registers, the isolation control terminal is electrically connected to the signal input terminal.

3. The display panel according to claim 1, wherein an isolation control terminal of an $x^{th}$-stage shift register is electrically connected to a first node of a $z^{th}$-stage shift register or a second node of a $z^{th}$-stage shift register, wherein z is a positive integer and x≠z;

an effective level duration of a signal of the first node of the $z^{th}$-stage shift register or an effective level duration of a signal of the second node of the $z^{th}$-stage shift register is a first duration, an effective level duration of a gate drive signal output by the signal output terminal of the $y^{th}$-stage shift register is a second duration, and the first duration overlaps with the second duration.

4. The display panel according to claim 3, wherein $x=y+n$, $y\geq n$, and $y-n+1\leq z\leq y+n-1$, wherein n is a positive integer.

5. The display panel according to claim 3, wherein the plurality of stages of shift registers further comprise a second-type shift register; and the isolation control terminal in the second-type shift register is electrically connected to the first level terminal.

6. The display panel according to claim 5, wherein first m stages of shift registers are second-type shift registers, where $m\geq n$.

7. The display panel according to claim 5, further comprising a plurality of pixel circuits arranged in an array and a plurality of gate signal lines; wherein at least part of pixel circuits located in a same row among the plurality of pixel circuits are electrically connected to a same gate signal line among the plurality of gate signal lines;

a first-type shift register among the first-type shift registers is electrically connected to a corresponding row of pixel circuits among the plurality of pixel circuits through a corresponding gate signal line of the plurality of gate signal lines; and the second-type shift register is not electrically connected to the plurality of pixel circuits.

8. The display panel according to claim 1, wherein the reset module further comprises a second reset sub-module; and in the same shift register, the second reset sub-module is electrically connected to the first clock terminal and the third node, and the second reset sub-module is further electrically connected to the first node or the second node.

9. The display panel according to claim 8, wherein the second reset sub-module comprises a sixth reset transistor; and in the same shift register, a gate of the sixth reset transistor is electrically connected to the first node or the second node, a first electrode of the sixth reset transistor is electrically connected to the first clock terminal, and a second electrode of the sixth reset transistor is electrically connected to the third node.

10. The display panel according to claim 1, wherein the first reset unit comprises a first reset transistor and a second reset transistor; and in the same shift register, a gate of the first reset transistor is electrically connected to the third node, a first electrode of the first reset transistor is electrically connected to the second level terminal, and a second electrode of the first reset transistor is electrically connected to a first electrode of the second reset transistor at the fourth node; and a gate of the second reset transistor is electrically connected to the second clock terminal, and a second electrode of the second reset transistor is electrically connected to the first node.

11. The display panel according to claim 1, wherein the second reset unit comprises a signal transmission sub-unit and a transmission control sub-unit; and in the same shift register, the transmission control sub-unit is electrically connected to the second node and the first level terminal, and the transmission control sub-unit is further electrically connected to the signal transmission sub-unit at a fifth node; and the signal transmission sub-unit is electrically connected to the second clock terminal and the second node, and the signal transmission sub-unit is further electrically connected to the fourth node or the first node.

12. The display panel according to claim 11, wherein the signal transmission sub-unit comprises a third reset transistor and a fourth reset transistor; and in the same shift register, a gate of the third reset transistor and a gate of the fourth reset transistor are electrically connected to the second clock terminal, a first electrode of the third reset transistor is electrically connected to the first node or the fourth node, a second electrode of the third reset transistor is electrically connected to a first electrode of the fourth reset transistor at the fifth node, and a second electrode of the fourth reset transistor is electrically connected to the second node.

13. The display panel according to claim 12, wherein a voltage difference between an effective level of a second clock signal of the second clock terminal and an effective level of a first level signal of the first level terminal is $\Delta V$, and a threshold voltage of the fourth reset transistor is Vth; wherein $|\Delta V|<Vth$.

14. The display panel according to claim 11, wherein the transmission control sub-unit comprises a fifth reset transistor; and in the same shift register, a gate of the fifth reset transistor is electrically connected to the second node, a first electrode of the fifth reset transistor is electrically connected to the first level terminal, and a second electrode of the fifth reset transistor is electrically connected to the fifth node.

15. The display panel according to claim 1, wherein the shift register further comprises a voltage regulation module; and in the same shift register, the voltage regulation module is electrically connected to at least one of the first node or the second node.

16. The display panel according to claim 15, wherein the voltage regulation module comprises at least one of a first voltage regulation capacitor or a second voltage regulation capacitor; and in the same shift register, a first plate of the first voltage regulation capacitor is electrically connected to the first node, and a second plate of the first voltage regulation capacitor is electrically connected to the first level terminal or the second level terminal; and a first plate of the second voltage regulation capacitor is electrically connected to the second node, and a second plate of the second voltage regulation capacitor is electrically connected to the first level terminal or the second level terminal.

17. The display panel according to claim 1, wherein the isolation control module comprises an isolation transistor;

in the same shift register, a gate of the isolation transistor is electrically connected to the isolation control terminal, a first electrode of the isolation transistor is electrically connected to the first node, and a second electrode of the isolation transistor is electrically connected to the second node.

18. A display device, comprising a display panel, wherein the display panel comprises a driver circuit; wherein the driver circuit comprises a plurality of stages of shift registers;

a shift register among the plurality of stages of shift registers comprises a first control module, a second control module, an isolation control module, an output module, a signal input terminal, a first clock terminal, a second clock terminal, a first level terminal, a second level terminal, an isolation control terminal and a signal output terminal; the first control module is electrically connected to the signal input terminal, the first clock terminal and a first node; the isolation control module is electrically connected to the isolation control terminal, the first node and a second node; the second control module is electrically connected to the first clock terminal, the first level terminal and a third node; the output module is electrically connected to the second node, the third node, the second clock terminal, the second level terminal and the signal output terminal;

the signal input terminal of an $x^{th}$-stage shift register is electrically connected to the signal output terminal of a $y^{th}$-stage shift register, wherein x and y are both positive integers, and $x \neq y$;

at least part of shift registers among the plurality of stages of shift registers are first-type shift registers;

in a same first-type shift register among the first-type shift registers, during at least part of a duration when an input signal of the signal input terminal is at an effective level, an isolation control signal of the isolation control terminal controls the isolation control module to turn on a signal transmission path between the first node and the second node; at least after the input signal jumps from an effective level to an ineffective level, the isolation control signal controls the isolation control module to disconnect the signal transmission path between the first node and the second node;

wherein the shift register further comprises a reset module, the reset module comprises a first reset sub-module, the first reset sub-module comprises a first reset unit and a second reset unit, in a same shift register among the plurality of stages of shift registers, the first reset unit is electrically connected to the second clock terminal, the second level terminal, the third node and the first node;

the second reset unit is electrically connected to the second clock terminal, the first level terminal and the second node; and the second reset unit is further electrically connected to the first reset unit at a fourth node, or the second reset unit is further electrically connected to the first node.

* * * * *